United States Patent
Bando et al.

(10) Patent No.: US 11,333,802 B2
(45) Date of Patent: May 17, 2022

(54) LENS SHEET, LENS SHEET UNIT, IMAGING MODULE, IMAGING DEVICE

(71) Applicant: DAI NIPPON PRINTING CO., LTD., Tokyo (JP)

(72) Inventors: Kazuki Bando, Tokyo (JP); Tianyi Sun, Tokyo (JP); Fumihiro Arakawa, Tokyo (JP); Shuji Kawaguchi, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 456 days.

(21) Appl. No.: 15/764,367

(22) PCT Filed: Sep. 5, 2016

(86) PCT No.: PCT/JP2016/076027
§ 371 (c)(1),
(2) Date: Jul. 13, 2018

(87) PCT Pub. No.: WO2017/056865
PCT Pub. Date: Apr. 6, 2017

(65) Prior Publication Data
US 2018/0313982 A1    Nov. 1, 2018

(30) Foreign Application Priority Data

Sep. 29, 2015 (JP) .............................. JP2015-191588

(51) Int. Cl.
*G02B 3/00* (2006.01)
*G02B 5/00* (2006.01)
(Continued)

(52) U.S. Cl.
CPC ........... *G02B 3/005* (2013.01); *G02B 3/0062* (2013.01); *G02B 5/003* (2013.01); *G02B 5/208* (2013.01);
(Continued)

(58) Field of Classification Search
CPC ...... G02B 3/005; G02B 3/0062; G02B 5/003; G02B 5/208; G02B 27/0075; G03B 17/02;
(Continued)

(56) References Cited

U.S. PATENT DOCUMENTS 4,460,260 A * 7/1984 Utagawa ................ G02B 7/346
250/201.7
6,061,179 A * 5/2000 Inoguchi .............. H04N 13/307
359/464
(Continued)

FOREIGN PATENT DOCUMENTS

JP    H04-274201 A    9/1992
JP    H08-338901 A    12/1996
(Continued)

OTHER PUBLICATIONS

Nov. 1, 2016 International Search Report issued in International Patent Application No. PCT/JP2016/076027.
(Continued)

*Primary Examiner* — George G. King
(74) *Attorney, Agent, or Firm* — Oliff PLC

(57) ABSTRACT

A lens sheet and lens sheet unit include an imaging module and an imaging device which can be made thinner. A first lens sheet has light transmission parts having a unit lens shape, and light absorption parts disposed alternatively with the light transmission parts. A lens sheet unit, on the image sensor side of the first lens sheet, includes a second lens sheet. The second lens sheet has light transmission parts having a unit lens shape, and light absorption parts disposed alternatively with the light transmission parts. When viewed from the optical axis direction, the direction in which the light transmission parts are arranged and the direction in which the light transmission parts are arranged intersect at
(Continued)

an angle. An imaging module and a camera are included with the above lens sheet and lens sheet unit.

14 Claims, 25 Drawing Sheets

(51) Int. Cl.
    *G02B 5/20*     (2006.01)
    *G03B 17/02*     (2021.01)
    *G03B 35/10*     (2021.01)
    *H01L 27/146*     (2006.01)
    *H04N 5/225*     (2006.01)
    *G02B 27/00*     (2006.01)

(52) U.S. Cl.
    CPC .............. *G03B 17/02* (2013.01); *G03B 35/10* (2013.01); *H01L 27/14623* (2013.01); *H01L 27/14627* (2013.01); *H01L 27/14685* (2013.01); *H04N 5/2254* (2013.01); *G02B 27/0075* (2013.01)

(58) Field of Classification Search
    CPC .............. G03B 35/10; H01L 27/14623; H01L 27/14627; H01L 27/14685; H04N 5/2254; H04N 5/369
    USPC .................................................. 359/619–624
    See application file for complete search history.

(56) References Cited

U.S. PATENT DOCUMENTS

| | | | |
|---|---|---|---|
| 2003/0081312 A1* | 5/2003 | Nemoto | G02B 3/0075 359/454 |
| 2004/0160675 A1 | 8/2004 | Nemoto et al. | |
| 2008/0112057 A1* | 5/2008 | Ono | G02B 3/0062 359/623 |
| 2009/0141361 A1 | 6/2009 | Yamagata et al. | |
| 2012/0113302 A1 | 5/2012 | Tajiri | |
| 2012/0147474 A1 | 6/2012 | Seo | |
| 2012/0229688 A1 | 9/2012 | Tajiri | |
| 2013/0001724 A1 | 1/2013 | Masuda | |
| 2014/0146201 A1 | 5/2014 | Knight et al. | |
| 2015/0168611 A1 | 6/2015 | Osawa et al. | |
| 2016/0293650 A1 | 10/2016 | Kimura et al. | |

FOREIGN PATENT DOCUMENTS

| | | |
|---|---|---|
| JP | H09-307697 A | 11/1997 |
| JP | 2003-37257 A | 2/2003 |
| JP | 2003-139918 A | 5/2003 |
| JP | 2004-200360 A | 7/2004 |
| JP | 2006-030723 A | 2/2006 |
| JP | 2006-229110 A | 8/2006 |
| JP | 2007-079325 A | 3/2007 |
| JP | 2008-250285 A | 10/2008 |
| JP | 2010-10909 A | 1/2010 |
| JP | 2010-067624 A | 3/2010 |
| JP | 2011-075836 A | 4/2011 |
| JP | 2012-100204 A | 5/2012 |
| JP | 2012-128423 A | 7/2012 |
| JP | 2012-189708 A | 10/2012 |
| JP | 2014-056063 A | 3/2014 |
| JP | 2014-057231 A | 3/2014 |
| JP | 2015-099345 A | 5/2015 |
| JP | 2015-128127 A | 7/2015 |
| JP | 2015-520992 A | 7/2015 |
| WO | 2005/107243 A1 | 11/2005 |
| WO | 2014/021232 A1 | 2/2014 |

OTHER PUBLICATIONS

Oct. 29, 2019 Office Action issued in Japanese Patent Application No. 2015-191588.
Oct. 29, 2019 Office Action issued in Japanese Patent Application No. 2015-191602.
Nov. 5, 2019 Office Action issued in Japanese Patent Application No. 2015-214122.
Aug. 1, 2019 Search Report issued in European Patent Application No. 16851041.0.
Aug. 6, 2019 Office Action issued in Japanese Patent Application No. 2015-191588.
Aug. 6, 2019 Office Action issued in Japanese Patent Application No. 2015-191602.
Aug. 20, 2019 Office Action issued in Japanese Patent Application No. 2015-214122.
Aug. 20, 2019 Office Action issued in Japanese Patent Application No. 2016-008132.
Dec. 14, 2021 Partial European Search Report issued in European Patent Application No. 21189555.2.
Mar. 22, 2022 Extended Search Report issued in European Patent Application No. 21189555.2.

\* cited by examiner

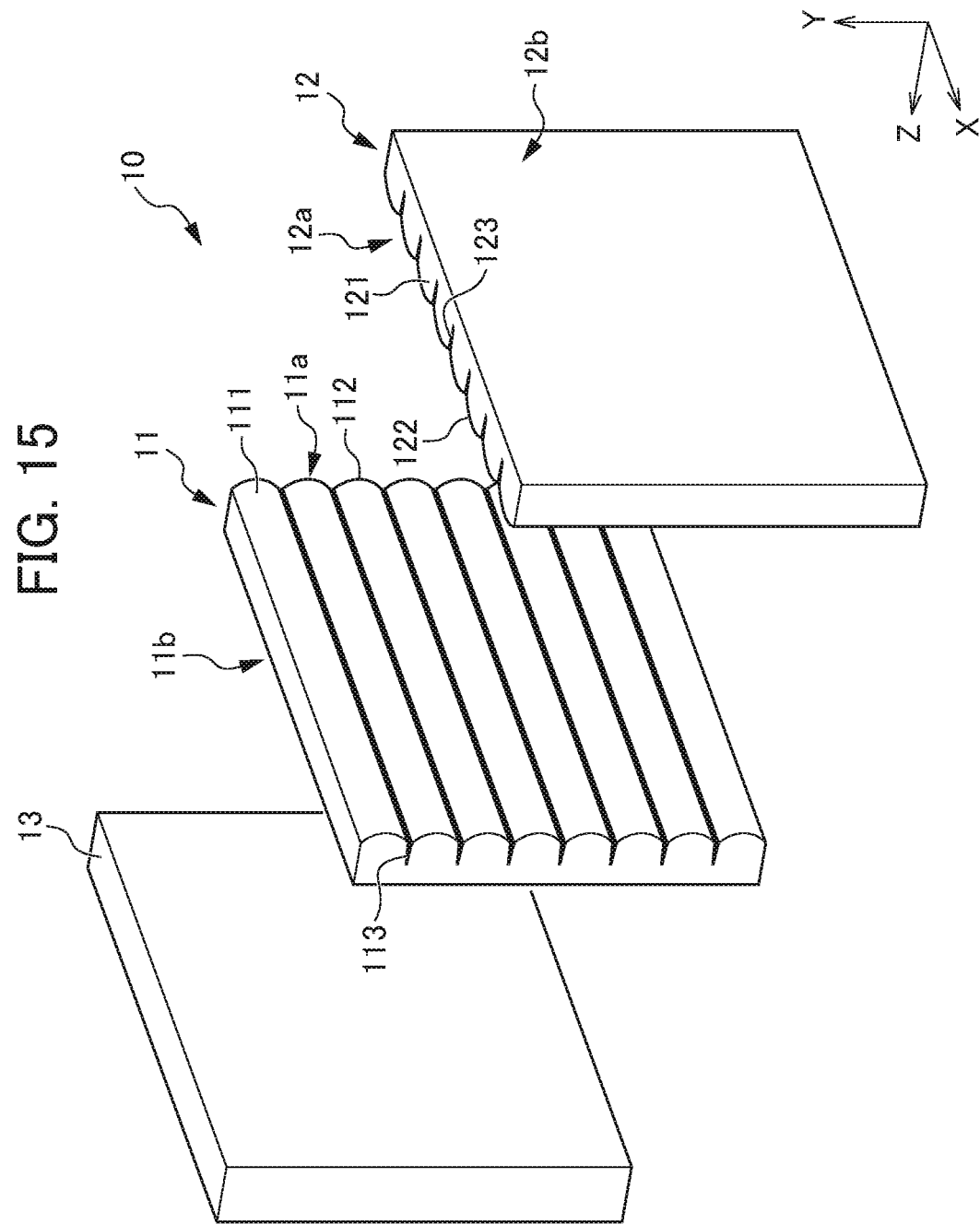

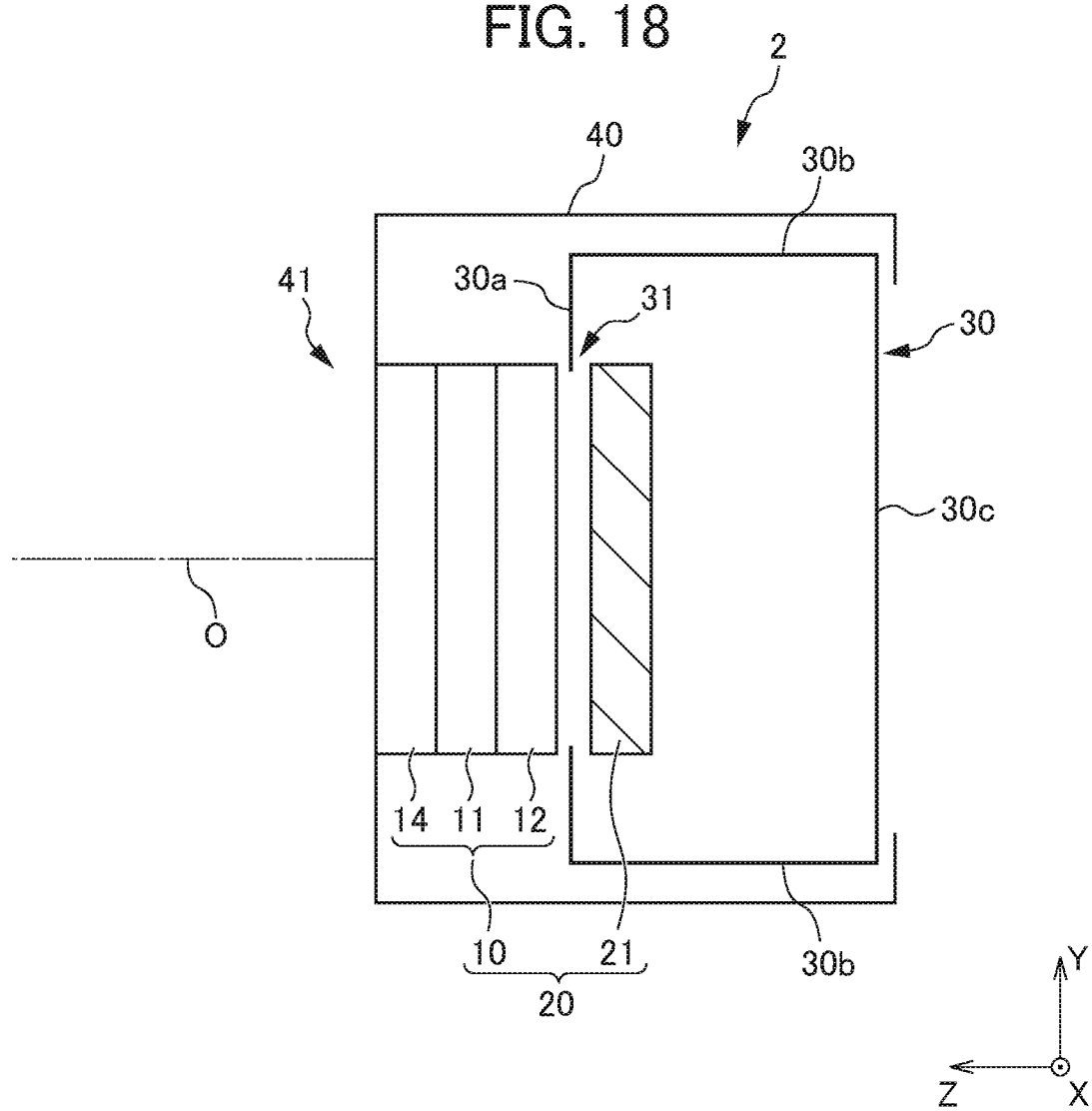

LENS SHEET, LENS SHEET UNIT, IMAGING MODULE, IMAGING DEVICE

TECHNICAL FIELD

The present invention relates to a lens sheet, a lens sheet unit, an imaging module, and an imaging device.

BACKGROUND ART

Recently, in a camera provided in portable terminals such as a smart phone and a tablet, various developments have been made for an improvement in an image quality and the like (for example, refer to Patent Document 1). Particularly, in the portable terminals such as the smart phone, a reduction in thickness has progressed, and even in the camera (referred to as "camera for portable terminals") provided in the portable terminal, a reduction in thickness has also been attempted.

In addition, a camera called a light field camera capable of changing a focal length and a depth of field after photographing has been developed, and has been spreading in recent years (for example, refer to Patent Document 2). The light field camera photographs light beams in a plurality of directions by dividing incident light beams with a microlens array that is disposed on an image sensor, and performs predetermined image processing on the basis of an incident direction and intensity of the light beams after photographing to change the focal length and the depth of field in predetermined values.

Patent Document 1: Japanese Unexamined Patent Application, Publication No. 2015-99345

Patent Document 2: Japanese Unexamined Patent Application (Translation of PCT Application), Publication No. 2015-520992

DISCLOSURE OF THE INVENTION

Problems to be Solved by the Invention

In the camera for portable terminals, lens aberration correction and the like are necessary to capture an image with high image quality. Accordingly, in the camera for portable terminals, an imaging lens including a plurality of sheets of lenses is used. However, the imaging lens, which includes the plurality of sheets of lenses, occupies approximately 80% (approximately 4 mm) in a total thickness (approximately 5 to 7 mm) of the camera. Accordingly, in the camera for portable terminals, compatibility between capturing of an image with high image quality and a reduction in thickness becomes an important problem. In addition, an image quality, an improvement of a photographing function, and the like are always required for the camera for portable terminals.

On the other hand, in the light field camera, the above-described imaging lens, a partition wall sheet including partition wall corresponding to respective lenses, and the like are necessary so that light beams (images) from the respective lenses of the microlens array disposed on the image sensor do not overlap each other on a light-receiving surface. As described above, the imaging lens, which includes the plurality of sheets of lenses, has a large size. As a result, a reduction in size and thickness of the light field camera has been difficult. In addition, in a case of disposing the partition wall sheet, there is a problem that alignment between the partition walls and the microlens array is difficult.

In addition, in an imaging device such as the camera for portable terminals and the light field camera, noise occurs in an image to deteriorate an image quality when the image sensor receives infrared rays. To prevent this problem, in the above-described imaging device, an infrared ray cut filter that shields infrared rays is disposed on a further light incident side in comparison to the image sensor. However, when using the infrared ray cut filter, a reduction in size of the imaging device, simplification of assembly working, and the like are obstructed.

In addition, in the light field camera, the microlens array is disposed to be close to the image sensor. Accordingly, in a case where the microlens array is made of a resin, there is a problem that bending or deflection occurs in the microlens array due to heat generation in the light-receiving surface when the image sensor operates. When the microlens array is prepared by using a resin in which a coefficient of thermal expansion is small to solve the problem, there is a problem that manufacturing becomes difficult, or the production cost increases. In addition, the cameras are required to more clearly photograph a subject image.

An object of the invention is to provide an imaging module and an imaging device which are made thinner. In addition, another object of the invention is to provide a lens sheet capable of realizing a reduction in thickness of an image module and an imaging device and capable of providing a satisfactory image, and an imaging module and an imaging device which include the lens sheet. In addition, still another object of the invention is to provide a lens sheet unit capable of realizing a reduction in thickness of an image module and an imaging device and capable of providing a satisfactory image, and an imaging module and an imaging device which include the lens sheet unit. In addition, still another object of the invention is to provide a lens sheet unit capable of realizing a reduction in thickness of an image module and an imaging device and capable of suppressing deformation and the like due to heat generation when an image sensor operates, and an imaging module and an imaging device which include the lens sheet unit. In addition, still another object of the invention is to provide an imaging module and imaging device of which the thickness can be reduced and which is capable of clearly photographing a subject image.

Means for Solving the Problems

The invention accomplishes the above-described objects by the following solving means. Furthermore, description will be made by applying a reference numeral corresponding to an embodiment of the invention for easy understanding, but there is no limitation thereto. According to a first aspect, there is provided an imaging module (20) including: an imaging element unit (21) in which a plurality of pixels, which convert incident light into an electric signal, are two-dimensionally arranged; and a lens sheet unit (10) that is provided on a light incident side of the imaging element unit. The lens sheet unit includes a first lens sheet (11) in which first light transmission parts (111), each of which has a columnar shape and includes a first unit lens shape (112) having a convex shape on one surface, are arranged, and a second lens sheet (12) which is disposed on a further imaging element unit side in comparison to the first lens sheet and in which second light transmission parts (121), each of which has a columnar shape and includes a second unit lens shape (122) having a convex shape on one surface, are arranged. When viewed in an optical axis (O) direction, an arrangement direction (R11) of the first light transmission parts and an arrangement direction (R12) of the second light transmission parts intersect each other at an angle α. The first lens sheet includes first light absorption parts (113) which are disposed alternately with the first light transmission parts in the arrangement direction of the first light transmission parts, and extend in a longitudinal direction of the first light transmission parts. The first light absorption parts extend from a first unit lens shape side to an opposite surface side along a thickness direction of the first lens sheet. The second lens sheet includes second light absorption parts (123) which are disposed alternately with the second light transmission parts in the arrangement direction of the second light transmission parts, and extend in a longitudinal direction of the second light transmission parts. The second light absorption parts extend from a second unit lens shape side to an opposite surface (12b) side along a thickness direction of the second lens sheet. According to a second aspect, in the imaging module (20) according to the first aspect, the angle α may satisfy a relationship of 80°≤α≤100°. According to a third aspect, in the imaging module (20) according to the first aspect, each unit lens shape (112, 122) may have a cross-section of a partial circle, the cross-section being parallel to the arrangement direction of the light transmission parts (111, 121) and, being parallel to a thickness direction of each lens sheet (11, 12). According to a fourth aspect, in the imaging module (20) according to the first aspect, a refractive index N1 of each light transmission part (111, 121) and a refractive index N2 of each light absorption part (113, 123) may satisfy a relationship of N1≤N2. According to a fifth aspect, in the imaging module (20) according to the first aspect, an angle θ, which is made by an interface between each of the light absorption parts (113, 123) and each of the light transmission parts (111, 121), and the thickness direction of the lens sheet, may satisfy a relationship of 0°≤θ≤10°. According to a sixth aspect, in the imaging module (20) according to the first aspect, the second lens sheet (12) may be integrally joined to the imaging element unit (21). According to a seventh aspect, in the imaging module (20) according to the first aspect, the first unit lens shape (112) may be formed on a surface of the first lens sheet (11) on an imaging element unit (21) side, and the second unit lens shape (122) may be formed on a surface of the second lens sheet (12) on a subject side. According to an eighth aspect, there is provided an imaging device (1) including the imaging module (20) according to the first aspect.

According to a ninth aspect, there is provided a lens sheet (11) that is disposed on a further light incident side in comparison to an imaging element unit (21) in an imaging module. The lens sheet includes: light transmission parts (111) which have a columnar shape and are arranged in one direction along a sheet surface, and each of which includes a unit lens shape (112) having a convex shape on one surface side; light absorption parts (113) which are arranged alternately with the light transmission parts, extend in a longitudinal direction of the light transmission parts, and extend from a unit lens shape side to a rear surface (11b) side of the lens sheet which is opposite to the unit lens shape side along a thickness direction of the lens sheet; and an infrared ray shielding layer (115) that is provided on a further rear surface side in comparison to the light transmission parts in the thickness direction of the lens sheet, and shields light in a wavelength region of 700 to 1100 nm. According to a tenth aspect, there is provided an imaging module (20) including: an imaging element unit (21) in which a plurality of pixels, which convert incident light into an electric signal, are two-dimensionally arranged; and a lens sheet unit (10) that is disposed on a further light incident side in comparison to the imaging element unit, and includes the lens sheet (11) according to the ninth aspect. The lens sheet unit includes a second lens sheet (12) on a subject side of the lens sheet or an imaging element unit side along an optical axis direction. The second lens sheet includes second light transmission parts (121) which have a columnar shape and are arranged in one direction along a sheet surface, and each of which includes a second unit lens shape (122) having a convex shape on one surface side, and second light absorption parts (123) which are disposed alternately with the second light transmission parts in an arrangement direction of the second light transmission parts, extend in a longitudinal direction of the second light transmission parts, and extend from a second unit lens shape side to a rear surface (12b) side of the second lens sheet which is opposite to the second unit lens shape side along a thickness direction of the second lens sheet. When viewed in the optical axis direction, an arrangement direction of the light transmission parts and an arrangement direction of the second light transmission parts intersect each other at an angle α. According to an eleventh aspect, there is provided an imaging device (1) including the imaging module (20) according to the tenth aspect.

According to a twelfth aspect, there is provided an imaging module (20) including: an imaging element unit (21) in which a plurality of pixels, which convert incident light into an electric signal, are two-dimensionally arranged; a lens sheet (11) that is disposed on a further light incident side in comparison to the imaging element unit; and a cover sheet (32) that is disposed on a further light incident side in comparison to the lens sheet. The lens sheet includes light transmission parts (111) which are arranged along a sheet surface and each of which includes a unit lens shape (112) having a convex shape on one surface side, and light absorption parts (113) which are arranged alternately with the light transmission parts and extend along a thickness direction of the lens sheet. The cover sheet is provided with a reflection suppressing layer (33), which suppresses reflection of incident light, on a surface on a lens sheet side.

According to a thirteenth aspect, there is provided a lens sheet unit (10) that is used in an imaging module, and is disposed on a further light incident side in comparison to an imaging element unit. The lens sheet unit includes: a first lens sheet (11) that includes a first optical shape surface (11a), on one side of which an optical shape is formed; a second lens sheet (12) that is disposed on a further light emission side in comparison to the first lens sheet and includes a second optical shape surface (12a), on one side of which an optical shape is formed; and an infrared ray shielding sheet (13) that is disposed on a further light incident side in comparison to the second lens sheet and shields light in a wavelength region of 700 to 1100 nm. The first lens sheet includes first light transmission parts (111) which have a columnar shape and are arranged in one direction along a sheet surface, and each of which includes a first unit lens shape (112) having a convex shape on a first optical shape surface side, and first light absorption parts (113) which are arranged alternately with the first light transmission parts, extend in a longitudinal direction of the first light transmission parts, and extend from a first unit lens shape side to a rear surface (11b) side of the first lens sheet which is opposite to the first unit lens shape side along a thickness direction of the first lens sheet. The second lens sheet includes second light transmission parts (121) which have a columnar shape and are arranged in one direction along a sheet surface, and each of which includes a second unit lens shape (122) having a convex shape on a second optical shape surface side, and second light absorption parts (123) which are arranged alternately with the second light transmission parts, extend in a longitudinal direction of the second light transmission parts, and extend from a second unit lens shape side to a rear surface (12b) side of the second lens sheet which is opposite to the second unit lens shape side along a thickness direction of the second lens sheet. When viewed in a normal direction of the sheet surface, an arrangement direction (R11) of the first light transmission parts and an arrangement direction (R12) of the second light transmission parts intersect each other at an angle α, and the first lens sheet, the second lens sheet, and the infrared ray shielding sheet are laminated. According to a fourteenth aspect, in the lens sheet unit (10) according to the thirteenth aspect, the infrared ray shielding sheet (13) may be disposed on a further light incident side in comparison to the first lens sheet (11). According to a fifteenth aspect, there is provided an imaging module (20) including: an imaging element unit (21) in which a plurality of pixels, which convert incident light into an electric signal, are two-dimensionally arranged; and the lens sheet unit (10) according to the thirteenth aspect which is disposed on a further subject side in comparison to the imaging element unit. According to a sixteenth aspect, there is provided an imaging device including the imaging module (20) according to the fifteenth aspect.

According to a seventeenth aspect, there is provided a lens sheet unit (10) that is used in an imaging module, and is disposed on a further light incident side in comparison to an imaging element unit. The lens sheet unit includes: a first lens sheet that includes a first optical shape surface (11a), on one side of which an optical shape is formed; a second lens sheet that is disposed on a further light emission side in comparison to the first lens sheet and includes a second optical shape surface (12a), on one side of which an optical shape is formed; and a protective sheet (14) that is disposed on a further light incident side in comparison to the first lens sheet, and protects the first lens sheet and the second lens sheet. The first lens sheet includes first light transmission parts (111) which have a columnar shape and are arranged in one direction along a sheet surface, and each of which includes a first unit lens shape (112) having a convex shape on a first optical shape surface side, and first light absorption parts (113) which are arranged alternately with the first light transmission parts, extend in a longitudinal direction of the first light transmission parts, and extend from a first unit lens shape side to a rear surface (11b) side of the first lens sheet which is opposite to the first unit lens shape side along a thickness direction of the first lens sheet. The second lens sheet includes second light transmission parts (121) which have a columnar shape and are arranged in one direction along a sheet surface, and each of which includes a second unit lens shape (122) having a convex shape on a second optical shape surface side, and second light absorption parts (123) which are arranged alternately with the second light transmission parts, extend in a longitudinal direction of the second light transmission parts, and extend from a second unit lens shape side to a rear surface (12b) side of the second lens sheet which is opposite to the second unit lens shape side along a thickness direction of the second lens sheet. When viewed in a normal direction of the sheet surface, an arrangement direction (R11) of the first light transmission parts and an arrangement direction (R12) of the second light transmission parts intersect each other at an angle α, and the first lens sheet, the second lens sheet, and the protective sheet are integrally laminated. According to an eighteenth aspect, in the lens sheet unit (10) according to the seventeenth aspect, the lens sheet unit may include a layer that shields light in a wavelength region of 700 to 1100 nm. According to a nineteenth aspect, there is provided an imaging module (20) including: an imaging element unit (21) in which a plurality of pixels, which convert incident light into an electric signal, are two-dimensionally arranged; and the lens sheet unit (10) according to the seventeenth aspect which is disposed on a further subject side in comparison to the imaging element unit. According to a twentieth aspect, there is provided an imaging device (1) including the imaging module (20) according to the nineteenth aspect.

Effects of the Invention

According to the invention, it is possible to provide an imaging module and an imaging device which are made thinner. In addition, according to the invention, it is possible to provide a lens sheet capable of realizing a reduction in thickness of an image module and an imaging device and capable of providing a satisfactory image, and an imaging module and an imaging device which include the lens sheet. In addition, according to the invention, it is possible to provide a lens sheet unit capable of realizing a reduction in thickness of an image module and an imaging device and capable of providing a satisfactory image, and an imaging module and an imaging device which include the lens sheet unit. In addition, according to the invention, it is possible to provide a lens sheet unit capable of realizing a reduction in thickness of an image module and an imaging device and capable of suppressing deformation and the like due to heat generation when an image sensor operates, and an imaging module and an imaging device which include the lens sheet unit. In addition, according to the invention, it is possible to reduce the thickness of the imaging module and the imaging device, and it is possible to clearly photograph a subject image.

BRIEF DESCRIPTION OF THE DRAWINGS

FIG. 15 is a view illustrating a lens sheet unit 10 of a third embodiment.

FIG. 18 is a view illustrating a camera 2 of a fifth embodiment.

PREFERRED MODE FOR CARRYING OUT THE INVENTION

Figure 1:
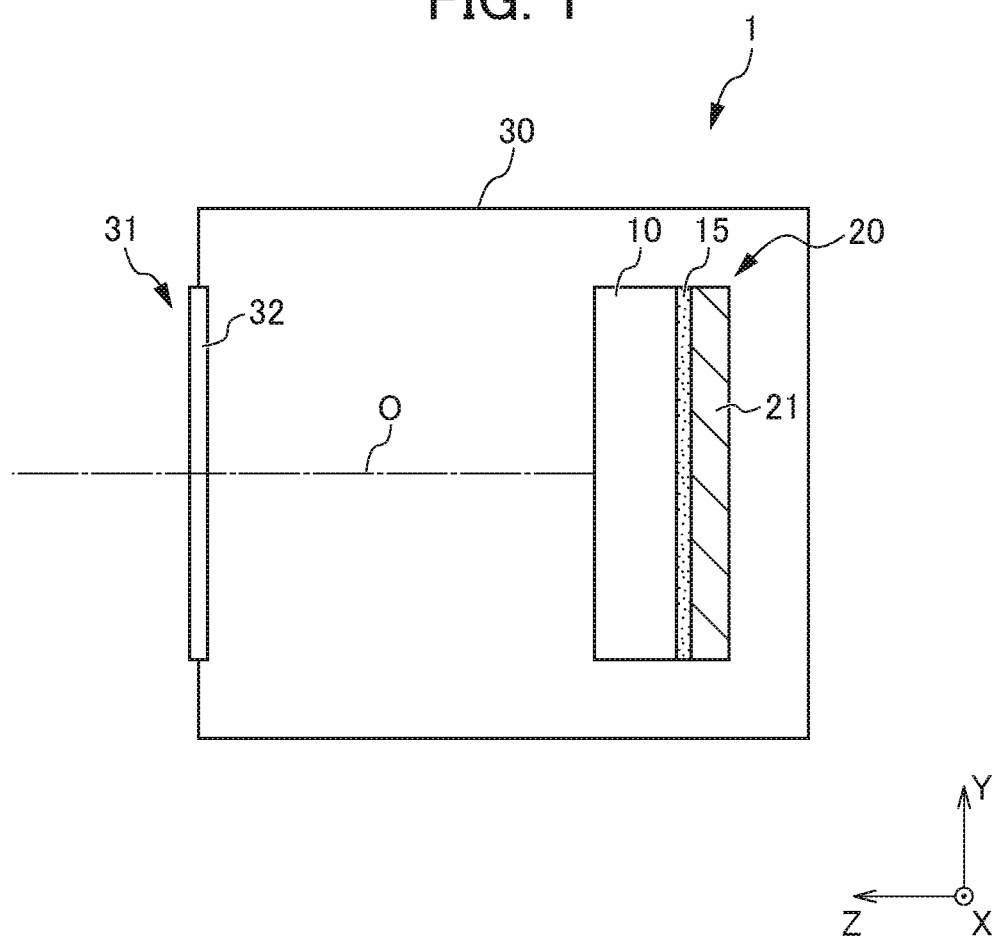
FIG. 1 is a view illustrating a camera 1 of a first embodiment.

Hereinafter, embodiments of the invention will be described with reference to the accompanying drawings, and the like. Furthermore, the following drawings including FIG. 1 are schematic views, and sizes and shapes of respective parts are appropriately exaggerated for easy understanding. Numerical values such as dimensions, material names, and the like of respective members in this specification are illustrative only as embodiments, and may be appropriately selected and used without limitation thereto. In this specification, it is assumed that terms, which specify shapes or geometrical conditions, for example, terms such as "parallel" and "perpendicular", include states having an error to a certain extent having an optical function and capable of being regarded as "parallel" or "perpendicular" in addition to strict meaning. In this specification, it is assumed that a sheet surface represents a surface in a plan direction of a sheet in the entirety of the sheet in respective sheet-shaped members.

First Embodiment

Figure 2A:
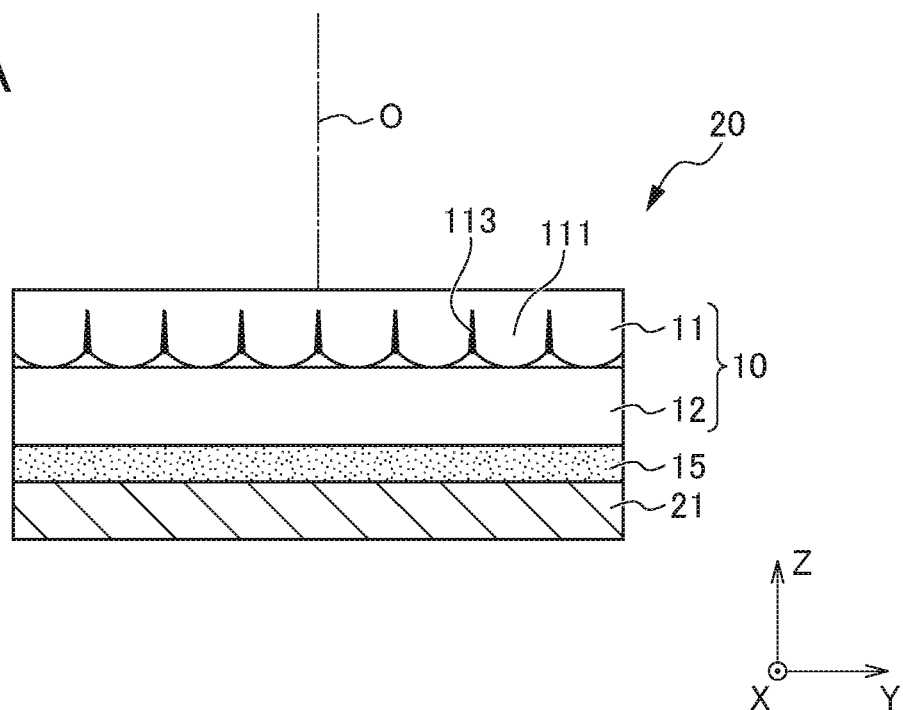
FIGS. 2A and 2B are each a view illustrating an imaging module 20 of the first embodiment.
Figure 2B:
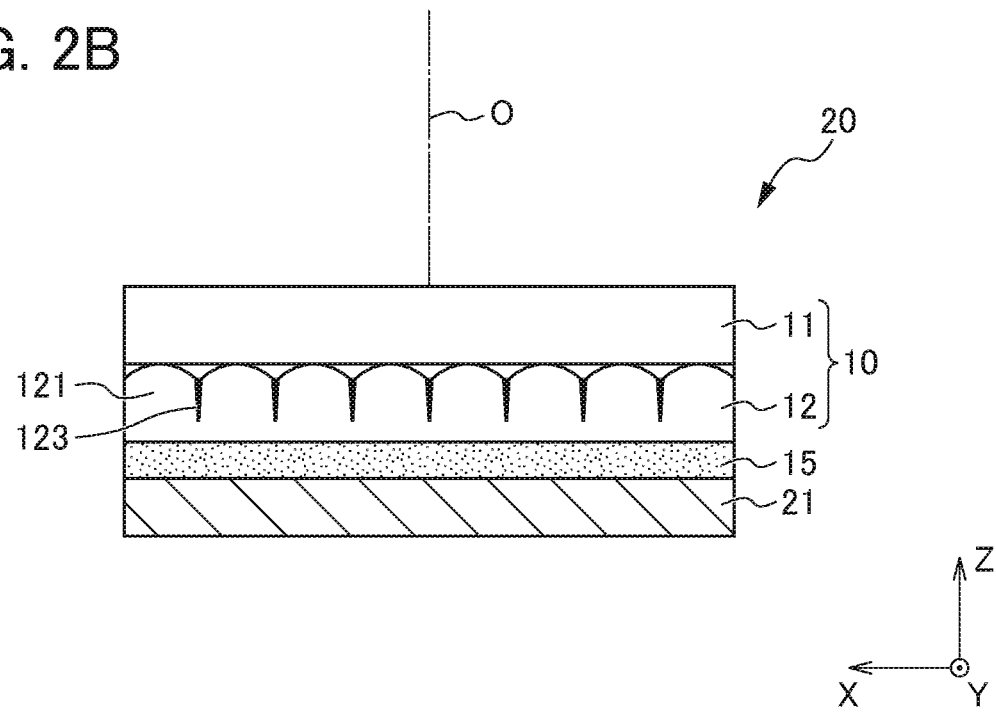

FIG. 1 is a view illustrating a camera 1 of a first embodiment. FIGS. 2A and 2B are each a view illustrating an imaging module 20 of the first embodiment. In the following drawings including FIG. 1, an XYZ orthogonal coordinate system is appropriately provided for easy understanding. In the coordinate system, when a photographer photographs an image in a state in which an optical axis O is set to be horizontal, a horizontal direction (right and left direction) is set as an X direction, a vertical direction (upper and lower direction) is set as a Y direction, a direction facing a left side when viewed from a photographer side (a right side when viewed from a subject side) is set as +X direction, a direction facing a vertically upward side is set as +Y direction, a direction of the optical axis O is set as a Z direction, and a direction facing a subject side is set as a +Z direction.

As illustrated in FIG. 1, the camera 1 of this embodiment is an imaging device that includes the imaging module 20 in a casing 30 that has an opening 31. The camera 1 is an imaging device that is used in portable telephones such as a smart phone and portable terminals such as a tablet terminal, and the casing 30 corresponds to a casing of a main body of the portable terminals. The camera 1 further includes a control unit, a storage unit, and the like (not illustrated in the drawings). In addition, the camera 1 may be set as a typical imaging device that includes the casing 30 as a casing of a camera main body. In this case, the camera 1 includes a shutter unit, a shutter drive unit, and the like (not illustrated in the drawings) in addition to the control unit, the storage unit, and the like. The opening 31 is an opening through which light from a subject side is taken into the imaging module 20 of the camera 1. In the opening 31, cover glass (cover sheet) 32 is disposed to cover the opening 31 from the viewpoint of preventing intrusion of foreign matters such as dust and waste into the imaging module 20, and the like.

The imaging module 20 of this embodiment includes a lens sheet unit 10, an image sensor 21, and the like in this order from a light incident side (subject side, +Z side) along the optical axis O (Z direction). The imaging module 20 captures an image in response to an output signal from the above-described control unit. The lens sheet unit 10 and the image sensor 21 are rectangular flat plate-shaped members, and the optical axis O is perpendicular to the geometrical center thereof.

Figure 3A:
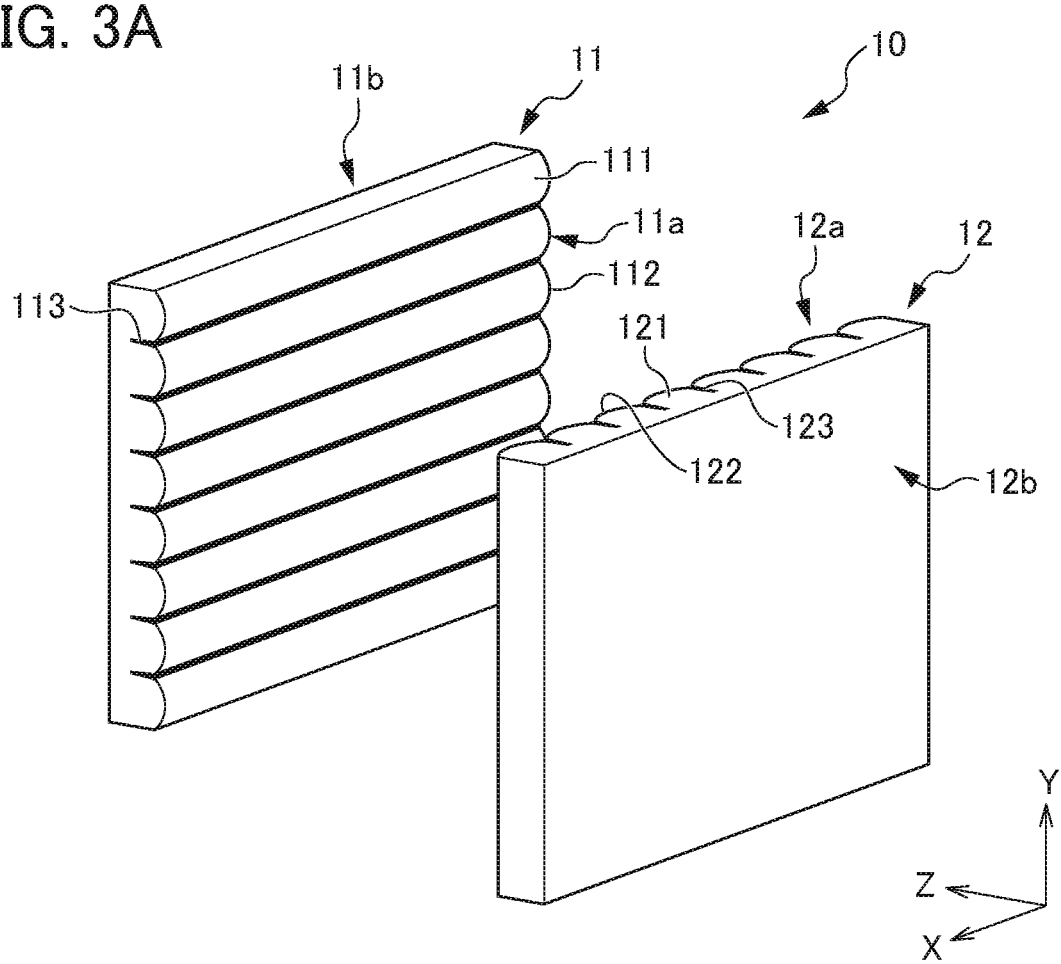
FIGS. 3A and 3B are each a view illustrating a lens sheet unit 10 of the first embodiment.
Figure 3B:
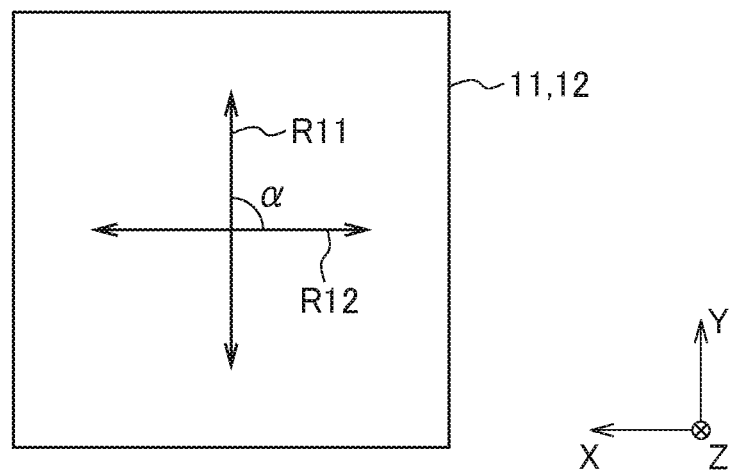
Figure 4A:
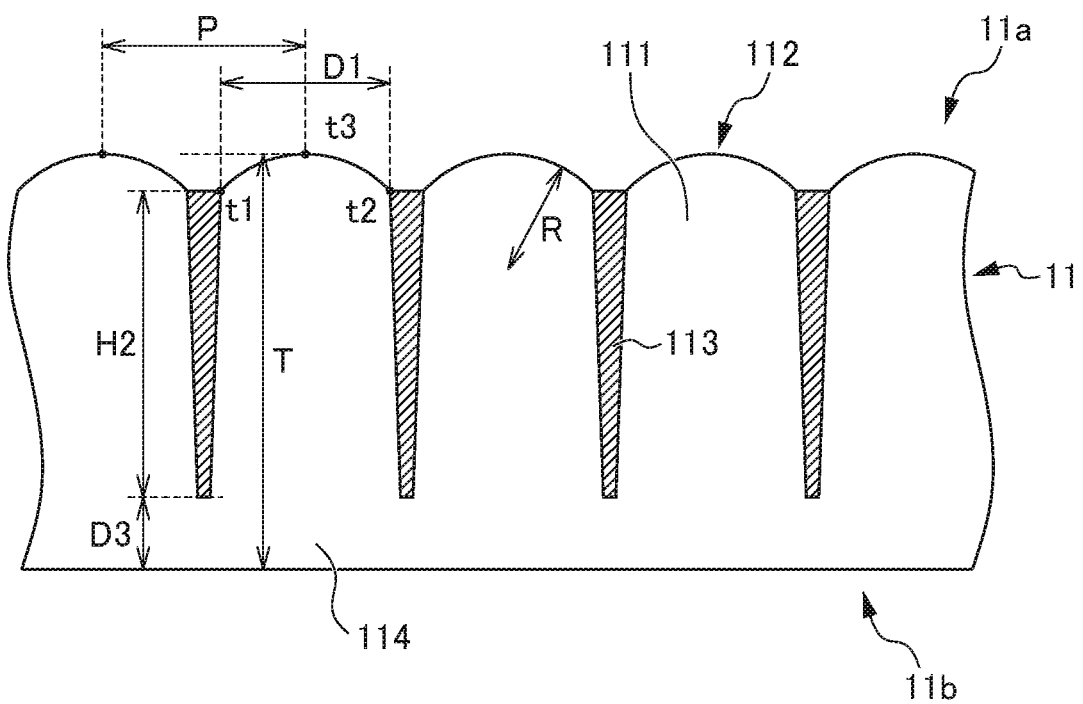
FIGS. 4A and 4B are each a view illustrating a first lens sheet 11 of the first embodiment.
Figure 4B:
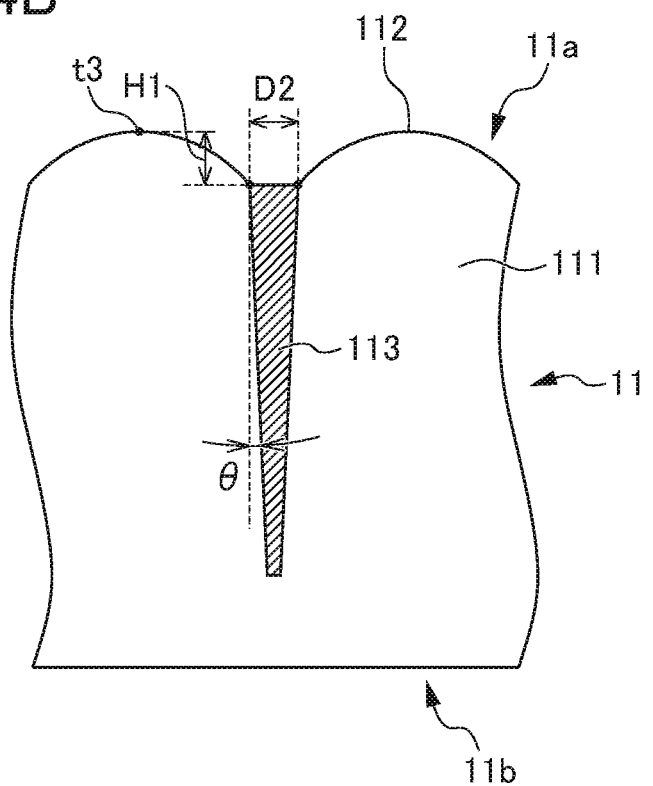
Figure 5A:
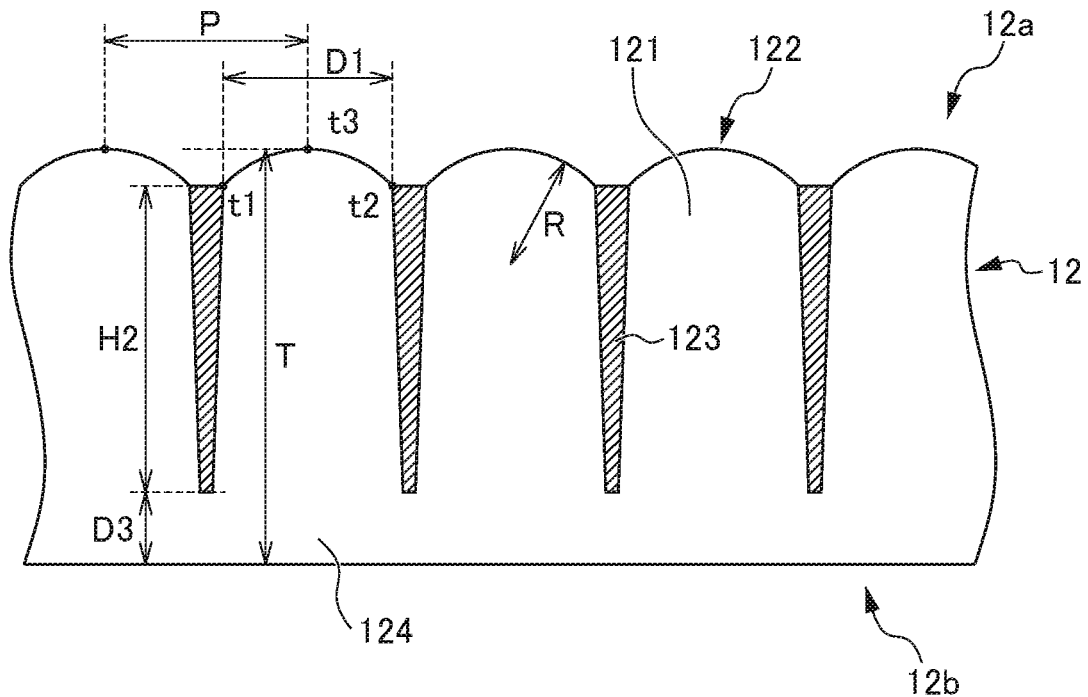
FIGS. 5A and 5B are each a view illustrating a second lens sheet 12 of the first embodiment.
Figure 5B:
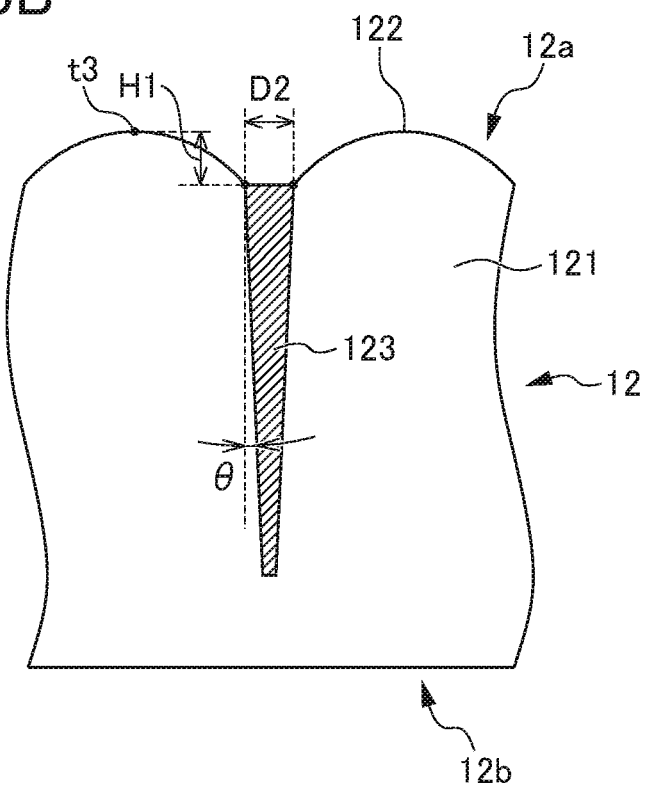

FIGS. 3A and 3B are each a view illustrating the lens sheet unit 10 of the first embodiment. FIG. 3A is a perspective view of the lens sheet unit 10, and FIG. 3B illustrates an arrangement direction of light transmission parts 111 of a first lens sheet 11 and light transmission parts 121 of a second lens sheet 12, the first lens sheet 11 and the second lens sheet 12 constituting the lens sheet unit 10. FIGS. 4A and 4B are each a view illustrating the first lens sheet 11. FIGS. 5A and 5B are each a view illustrating the second lens sheet 12. FIGS. 4A and 4B each illustrate a part of a cross-section that is parallel to the arrangement direction of the light transmission parts 111 of the first lens sheet 11 and a thickness direction of the first lens sheet 11 in an enlarged manner. FIG. 4B also illustrates a part of the cross-section illustrated in FIG. 4A in an enlarged manner. FIG. 5A illustrates a part of a cross-section that is parallel to the arrangement direction of the light transmission parts 121 of the second lens sheet 12 and a thickness direction of the second lens sheet 12 in an enlarged manner. FIG. 5B also illustrates a part of the cross-section illustrated in FIG. 5A in an enlarged manner. The lens sheet unit 10 is located on a subject side (+Z) side of the image sensor 21. The lens sheet unit 10 includes the first lens sheet 11 and the second lens sheet 12 in this order from the subject side (+Z side) along the optical axis O direction (Z direction). In the lens sheet unit 10, the first lens sheet 11 and the second lens sheet 12 are supported by a support member (not illustrated in the drawings), and positions thereof with respect to the image sensor 21 are determined.

The first lens sheet 11 is an optical sheet that includes a plurality of the light transmission parts 111 which have a columnar shape extending in one direction along a sheet surface, and are arranged in a direction that intersects the extension direction, and a plurality of light absorption parts 113 which are disposed alternately with the light transmission parts 111 along the arrangement direction of the light transmission parts 111. In the first lens sheet 11 of this embodiment, the light transmission parts 111 are disposed in the upper and lower direction (Y direction), and a longitudinal direction (ridge direction) thereof is parallel to the right and left direction (X direction). Each of the light transmission parts 111 is a portion through which light is transmitted, and includes a unit lens shape 112 having a convex shape on an image sensor 21 side (−Z side). A surface of the first lens sheet 11 on the image sensor 21 side is set as a lens shape surface 11a in which a plurality of unit lens shapes 112 are arranged.

The unit lens shapes 112 of the first lens sheet 11 are convex toward the image sensor 21 side (−Z side). And a cross-sectional shape of each unit lens shape 112, which is parallel to the arrangement direction (Y direction) of the light transmission parts 111 and the thickness direction (Z direction) of the first lens sheet 11, is set as a partially circular shape. In the unit lens shapes 112, the cross-sectional shape extends in a longitudinal direction of the light transmission parts 111. A rear surface 11b side (side opposite to the lens shape surface 11a, +Z side) of the light transmission parts 111 is configured as a land part 114 in which the light transmission parts 111 are continuous in a direction parallel to the sheet surface. The land part 114 may include a base material layer that becomes a base material when forming the light transmission parts 111. It may be preferable that the thickness of the land part 114 is as small as possible. A configuration in which the thickness of the land part 114 is zero (that is, a configuration in which the land part 114 does not exist) may be ideal from the viewpoints of preventing stray light and providing an image with high image quality. In addition, a surface of the rear surface 11b of the first lens sheet 11 of this embodiment is coated with a layer (not illustrated in the drawings) having a reflection preventing function. In this embodiment, the rear surface 11b of the first lens sheet 11 is a light incident surface of the lens sheet unit 10, and thus reflection from the rear surface 11b, which is an interface between the first lens sheet 11 and air, is suppressed to realize an increase in the amount of incident light. The layer having a reflection preventing function is formed, for example, by coating a material in a predetermined film thickness (for example, magnesium fluoride ($MgF_2$), silicon dioxide ($SiO_2$), a fluorine-based optical coating agent, and the like).

The light transmission parts 111 are formed from a resin having optical transparency, and a refractive index N1 thereof is approximately 1.43 to 1.60. The light transmission parts 111 of this embodiment are formed by an ultraviolet molding method, using an ultraviolet-curable resin such as urethane acrylate, polyester acrylate, and epoxy acrylate. Furthermore, there is no limitation thereto, and the light transmission parts 111 may be formed from another ionizing radiation curable resin such as an electron beam curable resin. In addition, the light transmission parts 111 may be formed by a hot melt extrusion molding method, using a thermoplastic resin such as a polyethylene terephthalate (PET) resin, or may alternatively be formed from glass. In addition, a surface of each of the unit lens shapes 112 is coated with a layer having a reflection preventing function (not illustrated in the drawing).

Each light absorption part 113 is a wall-shaped portion which is configured for light absorption, and extends from the lens shape surface 11a side in which the unit lens shapes 112 are formed to an opposite surface (rear surface) 11b side along the thickness direction of the first lens sheet 11. In addition, the light absorption parts 113 extend along the longitudinal direction of the light transmission parts 111. A cross-sectional shape of each light absorption part 113 in a cross-section parallel to the arrangement direction of the light absorption parts 113 and the thickness direction of the first lens sheet 11 is a wedge shape. The wedge shape stated here represents a shape in which a width of one end tapers toward the other end, and includes a triangular shape, a trapezoidal shape, and the like.

Each of the light absorption parts 113 of this embodiment is set to have a trapezoidal shape in which a dimension on the lens shape surface 11a side is greater than a dimension on the rear surface 11b side. There is no limitation thereto, and the cross-sectional shape of each light absorption part 113 may be set to a triangular shape in which the rear surface 11b side is set as an apex. Each light absorption part 113 has a function of absorbing stray light among light that travels into one light transmission part 111, such that the stray light traveling into adjacent light transmission parts 111 is absorbed . . . .

The light absorption parts 113 are formed from a light-absorbent material (hereinafter, referred to as a light-absorbing material) such as carbon black, or a resin that contains a light-absorbing material, and the like. As the light-absorbing material that is used in the light absorption parts 113, a member that has a particle shape and the like, and has a function of absorbing light in a visible light region may be suitable. Examples of the member include carbon black, graphite, a metal salt such as black iron oxide, a pigment or a dye, resin particles colored with the pigment or the dye, and the like.

In a case of using the resin particles colored with the pigment or the dye, as the resin particles, particles formed by an acrylic resin, a polycarbonate (PC) resin, a polyethylene (PE) resin, a polystyrene (PS) resin, a methyl methacrylate-butadiene-styrene (MBS) resin, a methyl methacrylate-styrene (MS) resin, and the like may be used. The light-absorbing material may be used in combination with the resin particles colored with carbon black and the like. Examples of the resin that contains the light-absorbing material include an ultraviolet-curable resin such as urethane acrylate and epoxy acrylate, an ionizing radiation curable resin such as an electron beam curable resin, and the like. The light absorption parts 113 of this embodiment are formed from an acrylic resin that contains carbon black.

A refractive index N2 of the light absorption parts 113 is approximately 1.45 to 1.60. In addition, it may be preferable that the refractive index N2 of the light absorption parts 113 satisfies a relationship of N2≤N1 with respect to the refractive index N1 of the light transmission parts 111. The reason for this is to prevent unnecessary light from reaching the image sensor 21 through total reflection of light at an interface between each of the light absorption parts 113 and each of the light transmission parts 111.

An example of a method of manufacturing the first lens sheet 11 is as follows. First, the light transmission parts 111 are formed by an ultraviolet molding method, using a molding mold that has a concave shape for molding the light transmission parts 111 and a convex shape for molding portions which becomes the light absorption parts 113 in a groove shape. Next, grooves between the light transmission parts 111 are filled with a material that forms the light absorption parts 113 by wiping (squeezing) the material, and the material is cured. Then, the first lens sheet 11 is trimmed into a predetermined size, and the like. Furthermore, the method of manufacturing the first lens sheet 11 is not limited to the above-described example, and may be appropriately selected depending on a material that is used, and the like. For example, the light absorption parts 113 may be formed by filling grooves between the light transmission parts 111 with a material that forms the light absorption parts 113 through vacuum filling and the like, and by curing the material. In addition, the light absorption parts 113 may be formed by filling the groove between the light transmission parts 111 with the material that forms the light absorption parts 113 by using a capillary phenomenon, and by curing the material.

In addition, dimensions of respective parts of the first lens sheet 11 are as follows. An arrangement pitch P of the light transmission parts 111 (unit lens shapes 112) may be preferably set to approximately 20 to 230 µm. It may be preferable that a radius of curvature R of each unit lens shape 112 is set to approximately 10 to 180 µm. A lens opening width D1 of each of the unit lens shapes 112 is a dimension on the lens shape surface 11a side of each of the light transmission parts 111 in the arrangement direction of the light transmission parts 111 (dimension between a point t1 and a point t2 which become boundaries between each of the light transmission parts 111, and an end of each of the light absorption parts 113 on the most lens shape surface 11a side), and it may be preferable that lens opening width D1 is set to approximately 20 to 200 µm. A lens height H1 of a unit lens shape 112 is a dimension from a surface of a light absorption part 113 on a lens shape surface 11a side to the most convex point t3 of a unit lens shape 112 in the thickness direction (Z direction) of the first lens sheet 11, and it may be preferable that the height H1 is set to approximately 2 to 40 µm.

The total thickness T of the first lens sheet 11 is a dimension from a surface of the rear surface 11b to the point t3 in the thickness direction (Z direction) of the first lens sheet 11, and it may be preferable that the total thickness T is set to approximately 30 to 480 µm. A width D2 of the light absorption part 113 is a dimension of the light absorption part 113 on the most lens shape surface 11a side in the arrangement direction of the light transmission parts 111, and it may be preferable that the width D2 is set to approximately to 1 to 30 µm. A height H2 of the light absorption part 113 is a dimension of the light absorption part 113 in the thickness direction (Z direction) of the first lens sheet 11, and it may be preferable that the height H2 is set to approximately 20 to 470 µm. A land thickness D3 is the thickness of the land part 114, and is a dimension from a tip end of the light absorption part 113 on the rear surface 11b side to the rear surface 11b of the first lens sheet 11 in the thickness direction of the first lens sheet 11. It may be preferable that the land thickness D3 is set to approximately 1 to 50 µm from the viewpoint of suppressing stray light or light incident on a light transmission part 111 (unit lens shape 112) from traveling into adjacent light transmission parts 111 (unit lens shapes 112). In a case where the first lens sheet 11 includes a base material layer, it is preferable that the land thickness D3 is set to approximately 1 to 180 µm from the above-described viewpoint. It may be preferable that an angle θ made by an interface between the light absorption part 113 and the light transmission part 111, and a normal direction of a sheet surface is set to approximately 0° to 10°. When the first lens sheet 11 is formed in the above-described dimension ranges, a focal length thereof becomes approximately 24 to 300 µm (converted value in the air).

The second lens sheet 12 is an optical sheet that is located on the image sensor 21 side (−Z side) of the first lens sheet 11. The second lens sheet 12 is joined to a subject side (+Z side) of the image sensor 21 by a joining layer 15 to be described later. The second lens sheet 12 has the same shape as that of the above-described first lens sheet 11, and includes light transmission parts 121 including unit lens shapes 122, light absorption parts 123, and the like. However, the second lens sheet 12 is different from the first lens sheet 11 in a position of a lens shape surface 12a and an arrangement direction of the light transmission parts 121 and the light absorption parts 123.

In the second lens sheet 12, the lens shape surface 12a in which the unit lens shapes 122 each having a convex shape are formed is located on a subject side (+Z side) that becomes a light incident side, and a rear surface 12b is located on the image sensor 21 side (−Z side). In addition, as illustrated in FIG. 3B, in the second lens sheet 12, an arrangement direction R12 of the light transmission parts 121 and the light absorption parts 123 intersects an arrangement direction R11 of the light transmission parts 111 and the light absorption parts 113 of the first lens sheet 11 at an angle α, when viewed in the optical axis O direction (Z direction). In this embodiment, the angle α is 90°. In the light transmission parts 121 (unit lens shapes 122) of the second lens sheet 12, an arrangement direction is a right and left direction (X direction), and a longitudinal direction is an upper and lower direction (Y direction). The second lens sheet 12 is formed by using the same material as in the first lens sheet 11.

The lens sheet unit 10 (second lens sheet 12) and the image sensor 21 are integrally joined by the joining layer 15. The joining layer 15 is formed from a gluing agent or an adhesive, and has optical transparency. It may be preferable that a refractive index N3 of the joining layer 15 is the same as the refractive index N1 of the light transmission parts 121 of the second lens sheet 12. In addition, the image sensor 21 generates heat during operation, and a surface temperature rises to approximately 40° C. Accordingly, it may be preferable that the joining layer 15 has heat resistance from the viewpoint of suppressing deformation of the lens sheet unit 10 such as bending due to heat generation in the image sensor 21. As the joining layer 15, a gluing agent and an adhesive which are formed from an epoxy resin or a urethane resin may be suitable. Furthermore, it may be also possible to employ a joining layer 15 having the refractive index N3 smaller than the refractive index N1 of the light transmission parts 121. Examples of the joining layer 15 include a silicone-based gluing agent and the like.

Light transmitted through the lens sheet unit 10 is condensed by the unit lens shapes 112 and 122 in such a manner that a focus is formed on a light-receiving surface of the image sensor 21 to be described later. That is, a radius of curvature R of the unit lens shapes 112 and 122 and the refractive index N1 are set so that the focus is formed on the light-receiving surface of the image sensor 21. In addition, the first lens sheet 11 and the second lens sheet 12 are disposed in a state in which the unit lens shapes 112 and 122 are in contact with each other at the apex (point t3) or are close to each other, and air exists between the first lens sheet 11 and the second lens sheet 12.

The first lens sheet 11 and the second lens sheet 12 are disposed in such a manner that the arrangement direction of the light transmission parts 111 (the unit lens shapes 112) and the arrangement direction of the light transmission parts 121 (the unit lens shapes 122) are set to make an angle α of 90° when viewed in the optical axis O direction (Z direction). In addition, the first lens sheet 11 includes the light absorption parts 113 between the light transmission parts 111, and the second lens sheet 12 includes the light absorption parts 123 between the light transmission parts 121, respectively. Accordingly, optically, the lens sheet unit 10 is approximately the same as a state in which microlenses are arranged in a two-dimensional direction (X direction and Y direction) and a light-shielding wall is formed between adjacent elements in each microlens.

The image sensor 21 is a portion that converts light received on the light-receiving surface into an electric signal, and outputs the electric signal. The image sensor 21, in which a plurality of pixels are arranged in a two-dimensional direction, can detect intensity of light that is incident on each pixel. The plurality of pixels which constitute the image sensor 21 are two-dimensionally arranged on a subject-side surface that is a light-receiving surface of the image sensor 21. In this embodiment, it is assumed that a plurality of the pixels of the image sensor 21 are arranged in the right and left direction and the upper and lower direction (the X direction and the Y direction). As the image sensor 21, for example, a charge coupled device (CCD), a complementary metal oxide semiconductor (CMOS), and the like may be preferably used. In this embodiment, as the image sensor 21, the CMOS is used.

Light, which travels through the opening 31 into the imaging module 20, enters the lens sheet unit 10, and penetrates the first lens sheet 11 and the second lens sheet 12. At this time, light penetrating the lens sheet unit 10 is condensed by the unit lens shapes 112 of the first lens sheet 11 in the Y direction (upper and lower direction) that is the arrangement direction thereof, and is condensed by the unit lens shapes 122 of the second lens sheet 12 in the X direction (right and left direction) that is the arrangement direction thereof. In addition, in the first lens sheet 11 and the second lens sheet 12, a part of light, which travels in the light transmission parts 111 and 121 in a direction having a large angle with respect to the optical axis O direction, enters the light absorption parts 113 and 123 and is absorbed therein. Subsequently, light penetrating the lens sheet unit 10 is focused on the light-receiving surface of the image sensor 21.

At this time, as described above, the first lens sheet 11 and the second lens sheet 12 are disposed in such a manner that longitudinal directions of the unit lens shapes 112 and 122 are perpendicular to each other, and thus the lens sheet unit 10 is optically similar to a configuration in which a plurality of microlenses are arranged in the X direction and the Y direction. In addition, images which are obtained by pseudo-microlenses are formed on the light-receiving surface of the image sensor 21 in a state in which the images do not overlap each other.

In this embodiment, a plurality of pixels of the image sensor 21 are arranged to correspond to each of the pseudo-microlenses. In addition, during photographing, light beams divided by the corresponding pseudo-microlenses enter each of the pixels, and light intensity is detected by each of the pixels. In addition, an incident direction of light incident on the pixels can be detected based on which of the unit lens shapes 112 and 122 on an XY plane the light penetrates (from a relationship between each of the pixels and positions of pseudo-microlenses on the XY plane). During photographing, information of the intensity of incident light detected by the respective pixels and information of the incident direction, which are obtained by the imaging module 20, are stored in a storage unit, and are subjected to various operations by a control unit to be generated as image data in which a focal length, a depth of field, and the like are changed (for which refocus processing is performed).

Figure 6A:
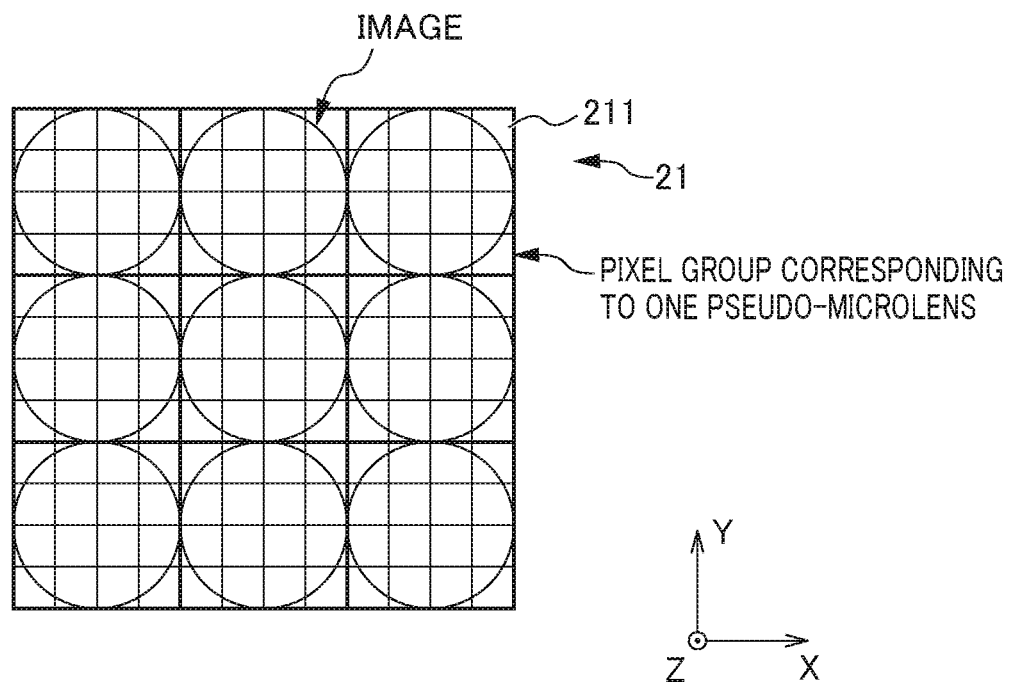
FIGS. 6A and 6B are each a view illustrating an imaging state on a light-receiving surface of an image sensor 21 of the imaging module 20 of the first embodiment.
Figure 6B:
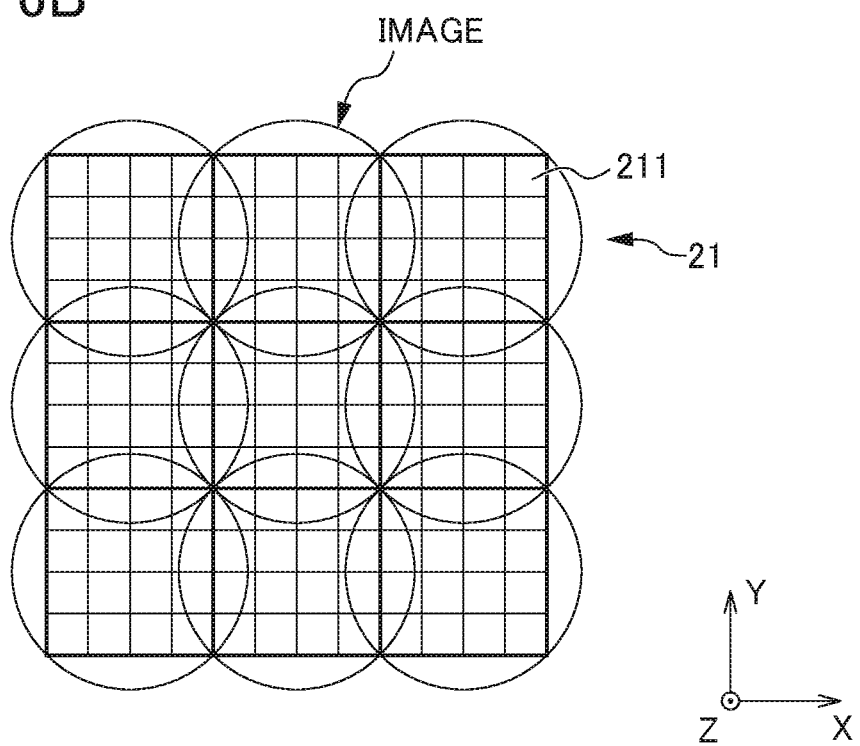

FIGS. 6A and 6B are each a view illustrating an imaging state on the light-receiving surface of the image sensor 21 of the imaging module 20 of the first embodiment. Typically, in the light field camera, a plurality of pixels located in a predetermined region correspond to one microlens of a microlens array. In addition, it is important that an image obtained by each microlens is projected to a plurality of pixels in a corresponding region. At this time, for example, as illustrated in FIG. 6B, in a case where an image of each microlens is projected to an adjacent region and images overlap each other, a phenomenon called cross-talk in which light beams having different positions and different angles on a subject surface are incident on the same pixel 211 occurs, and thus it is difficult to decompose an incident direction and intensity of light. To solve the problem, in a conventional light field camera, it is necessary to use an imaging lens diaphragm that is provided on a further subject side in comparison to the microlens array, or it is necessary to additionally provide a partition wall sheet having a partition wall corresponding to a unit lens of a microlens array on an image sensor side of a microlens array sheet, and the like.

However, according to this embodiment, the light absorption parts 113 or the light absorption parts 123 are formed between the light transmission parts 111 or the light transmission parts 121, and extends in the thickness direction of each of the lens sheets. Accordingly, even though the imaging lens, the partition wall sheet, and the like are not used, as illustrated in FIG. 6A, cross-talk does not occur, and thus it is possible to allow light condensed by the unit lens shapes 112 and the unit lens shapes 122 to be incident on a plurality of pixels 211 of the image sensor 21 in a corresponding region. Accordingly, the pixels 211 can output information of the intensity of the incident light and information of the incident direction with high accuracy.

As described above, according to this embodiment, an imaging lens including a plurality of sheets of optical lenses is not necessary. Accordingly, it is possible to suppress the thickness of the lens sheet unit 10 to approximately several tens of micrometers to several hundreds of micrometers, and it is possible to realize a reduction in thickness and weight of the imaging module 20 and the camera 1. In addition, since the imaging lens is not necessary, it is possible to reduce the production cost of the imaging module 20 and the camera 1. In addition, it is possible to contribute to an improvement of aesthetic design without obstructing a reduction in thickness of the portable terminal main body.

In addition, according to this embodiment, the light absorption parts 113 or the light absorption parts 123 are integrally formed in correspondence with the light transmission parts 111 or the light transmission parts 121 (the unit lens shapes 112 or the unit lens shapes 122) in the lens sheet 11 or 12, and thus alignment between the partition wall sheet and the microlens array with high accuracy is not necessary. Accordingly, it is possible to suppress deterioration of a yield ratio due to a deviation of the alignment accuracy between the microlens array and the partition wall sheet. In addition, since the alignment is not necessary, handling becomes easy, manufacturing can be easily performed, and the production cost can be reduced.

In addition, according to this embodiment, it is easy to increase the unit lens shapes 112 and the unit lens shapes 122 which are arranged in the X direction and the Y direction by reducing the lens opening width D1 of the light transmission parts 111 and 121. Since the light absorption parts 113 or the light absorption parts 123 are integrally formed, it is possible to form the pseudo-microlenses by the lens sheet unit 10 in a denser manner, and to improve spatial resolution of an image.

According to this embodiment, it is possible to apply the function as the light field camera capable of changing a focal length or a depth of field after photographing to cameras for portable terminals, and it is possible to realize a high performance. In addition, the imaging module 20 and the camera 1 of this embodiment can form an image captured at a pan-focus. Accordingly, images captured at various focal lengths and depths of field can be formed, and it is possible to improve a camera function. In addition, conventional light field cameras require imaging lenses, a partition wall sheet for light beam division which is provided in addition to the microlens array, and the like. However, according to this embodiment, the above-described members are not necessary, and thus it is possible to realize a reduction in thickness and weight, a reduction in the production cost, and the like in an area of light field cameras.

(Another Aspect of Lens Sheet Unit 10 of First Embodiment)

Figure 7A:
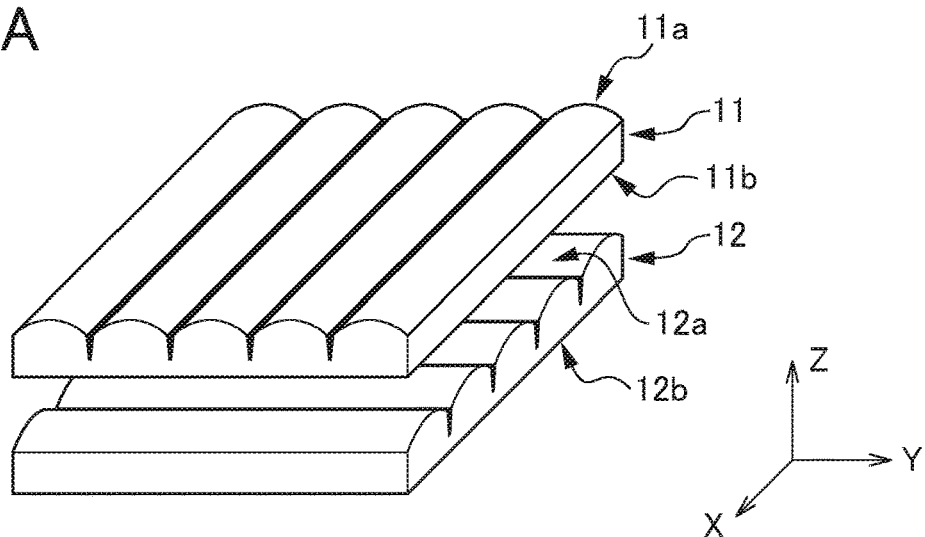
FIGS. 7A to 7C are each a view illustrating another aspect of the lens sheet unit 10 of the first embodiment.
Figure 7B:
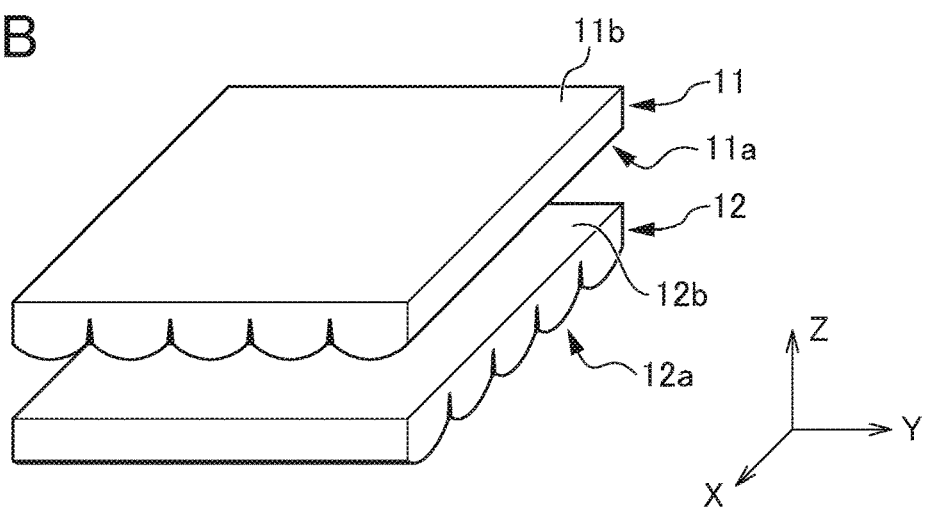
Figure 7C:
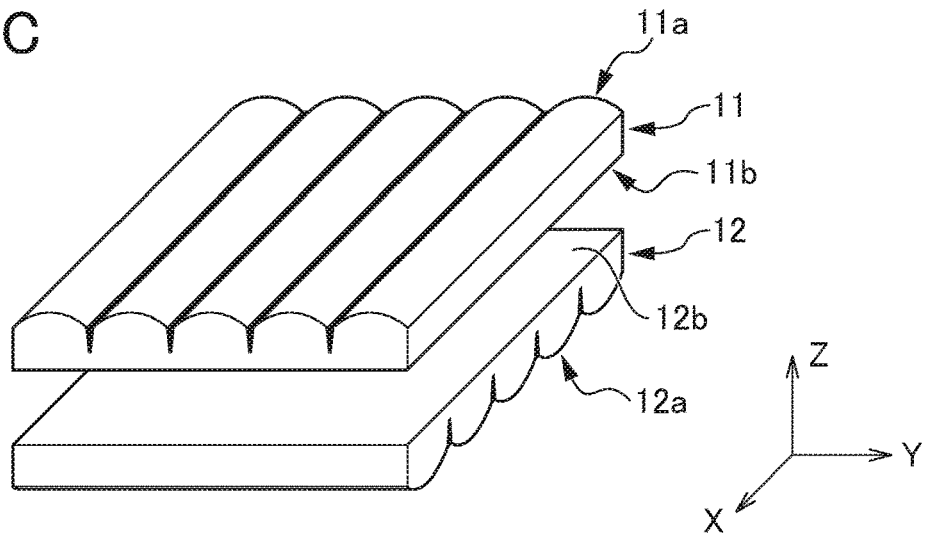

FIGS. 7A to 7C are each a view illustrating another aspect of the lens sheet unit 10 of the first embodiment. As illustrated in FIG. 7A, in the first lens sheet 11 and the second lens sheet 12 which constitute the lens sheet unit 10 may be disposed in such a manner that both the lens shape surfaces 11a and 12a are on the subject side (+Z side). In addition, as illustrated in FIG. 7B, in the first lens sheet 11 and the second lens sheet 12 which constitute the lens sheet unit 10 may be disposed in such a manner that both the lens shape surfaces 11a and 12a are on the image sensor side (−Z side). In addition, as illustrated in FIG. 7C, the first lens sheet 11 may be disposed in such a manner that the lens shape surface 11a is on the subject side (+Z side), and the second lens sheet 12 may be disposed in such a manner that the lens shape surface 12a is on the image sensor side (−Z side).

As illustrated in FIGS. 7B and 7C, in a case where the lens shape surface 12a of the second lens sheet 12 is located on the image sensor 21 side (−Z side), it may be preferable that the refractive index N3 of the joining layer 15 is smaller than the refractive index N1 of the light transmission parts 121 of the second lens sheet 12. As the joining layer 15, a silicone-based gluing agent and the like may be suitable.

Furthermore, as illustrated in FIG. 7C, in a case where a surface of the first lens sheet 11 on a second lens sheet 12 side (−Z side) is the rear surface 11b in which the unit lens shapes 112 are not formed, and a surface of the second lens sheet 12 on a first lens sheet 11 side is also the rear surface 12b, a spacer (not illustrated in the drawing) may be disposed between the first lens sheet 11 and the second lens sheet 12 from the viewpoint of suppressing occurrence of stray light due to optical close contact. In addition, the both rear surfaces 11b and 12b may be formed of a matt surface on which minute concavo-convex shapes are formed from the viewpoint of enhancing the effect of suppressing occurrence of stray light due to optical close contact.

In addition, in a case of the configuration illustrated in FIG. 7C, a joining layer (not illustrated in the drawing) may be provided between the first lens sheet 11 and the second lens sheet 12 to integrally join the first lens sheet 11 and the second lens sheet 12. In a case of this configuration, it may be preferable that the refractive index of the joining layer is the same as the refractive index of the light transmission parts 111 and 121 from the viewpoint of preventing light from being reflected from an interface between the joining layer and the rear surfaces 11b and 12b of the lens sheets 11 and 12. In a case of using the lens sheet unit 10 in this configuration, it is also possible to capture an image with a satisfactory image quality.

In addition, the arrangement direction R11 of the light transmission parts 111 of the first lens sheet 11 may be set to the right and left direction (X direction), and the arrangement direction R12 of the light transmission parts 121 of the second lens sheet 12 may be set to the upper and lower direction (Y direction). In addition, when the angle α made by the arrangement direction R11 of the light transmission parts 111 (unit lens shapes 112) of the first lens sheet 11, and the arrangement direction R12 of the light transmission parts 121 (unit lens shapes 122) of the second lens sheet 12 is within a range of 90°±10°, that is, a range of 80° to 100°, the desired optical function of the lens sheet unit 10 is maintained. Accordingly, the angle α may be set within a range of 80° to 100° without limiting to 90°.

Accordingly, when the first lens sheet 11 and the second lens sheet 12 are assembled as the lens sheet unit 10 in the imaging module 20, the angle α made by the arrangement direction R11 of the light transmission parts 111 of the first lens sheet 11 and the arrangement direction R12 of the light transmission parts 121 of the second lens sheet 12 may not be strictly set to 90°, and thus it is possible to realize easiness of assembling of the lens sheet unit 10 and the imaging module 20, an improvement of working efficiency, and an improvement of a yield ratio. Furthermore, other configurations of the lens sheet unit 10 relating to the direction of the lens shape surfaces 11a and 12a, and the arrangement directions R11 and R12 of the light transmission parts 111 and 121 may be appropriately applied to a second embodiment to a sixth embodiment to be described later.

(Another Aspect of Imaging Module 20 of First Embodiment)

The imaging module 20 may be set to a configuration in which the joining layer 15 that joins the lens sheet unit 10 and the image sensor 21 is not provided. And the second lens sheet 12 may be disposed in contact with the light-receiving surface of the image sensor 21, and the first lens sheet 11 and the second lens sheet 12 of the lens sheet unit 10, and the image sensor 21 may be supported by a support member (not illustrated in the drawing) and is fixed at a predetermined position. In addition, in a case where the joining layer 15 is not provided, a spacer may be disposed between the second lens sheet 12 and the image sensor 21 to prevent optical close contact between the image sensor 21 and the second lens sheet 12, scratch of the light-receiving surface of the image sensor 21, and the like.

Second Embodiment

Figure 8A:
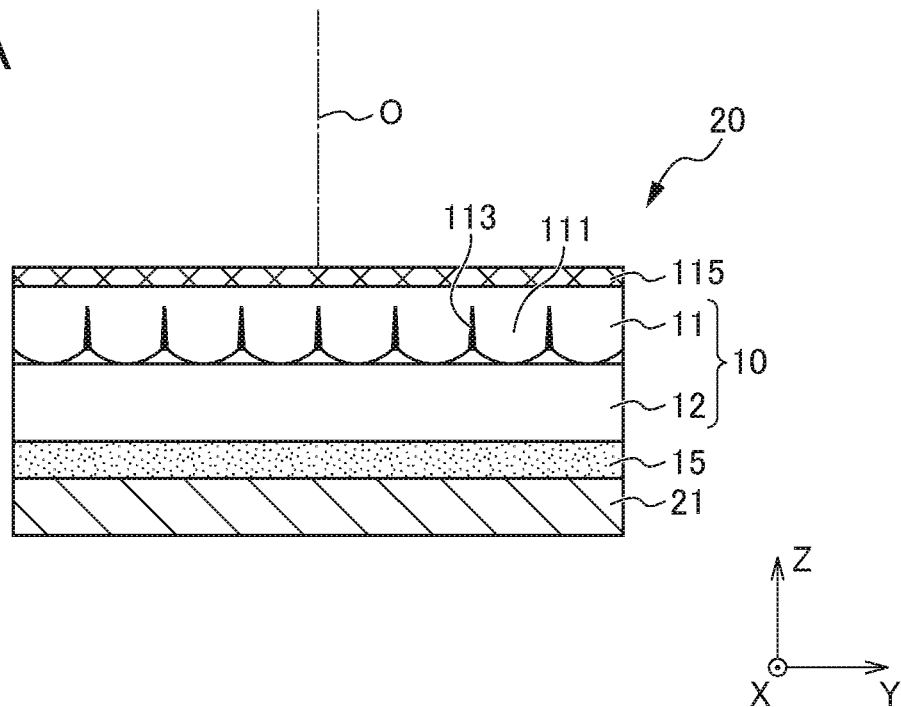
FIGS. 8A and 8B are each a view illustrating an imaging module 20 of a second embodiment.
Figure 8B:
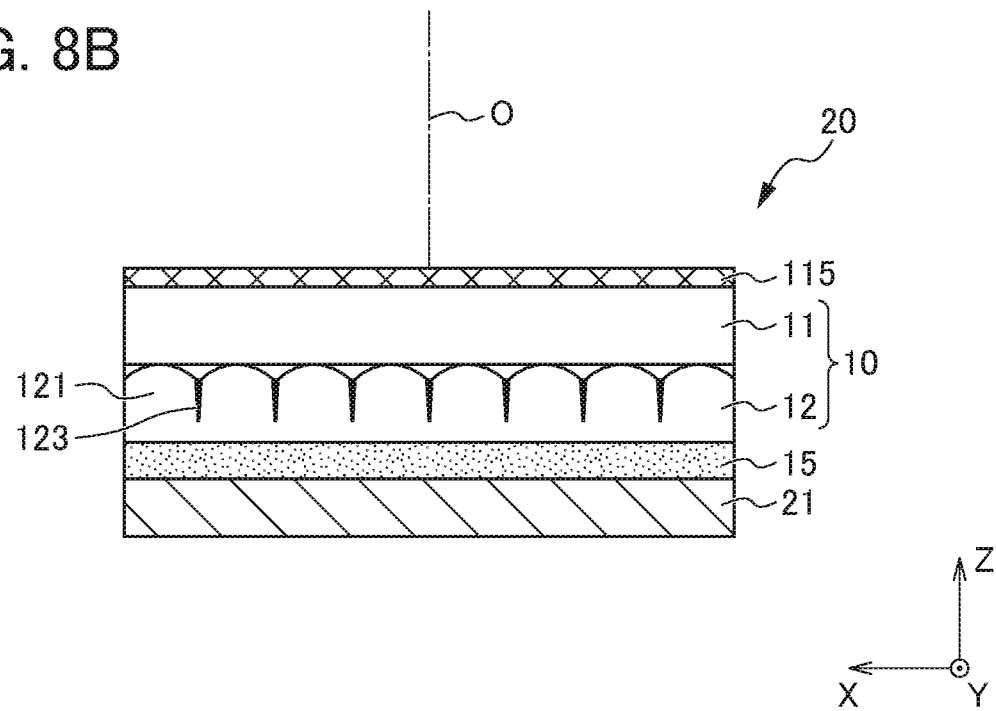

FIGS. 8A and 8B are each a view illustrating an imaging module 20 of a second embodiment. A lens sheet unit 10 and the imaging module 20 of the second embodiment have the same configurations as those of the lens sheet unit 10 and the imaging module 20 of the above-described first embodiment except that a first lens sheet 11 includes an infrared ray shielding layer 115. Accordingly, in the following description, parts having the same functions as in the first embodiment are denoted by the same reference numerals or the same reference numerals at the end, and redundant description thereof will be appropriately omitted. Furthermore, with regard to a third embodiment to a sixth embodiment to be described later, description of parts redundant to the first embodiment will be appropriately omitted. The imaging module 20 of the second embodiment includes the lens sheet unit 10, an image sensor 21, and the like in this order from a light incident side (subject side, +Z side) along an optical axis O (Z direction). As in the first embodiment, the imaging module 20 is disposed in a casing 30 of a camera 1, and captures an image in response to an output signal from a control unit.

Figure 9A:
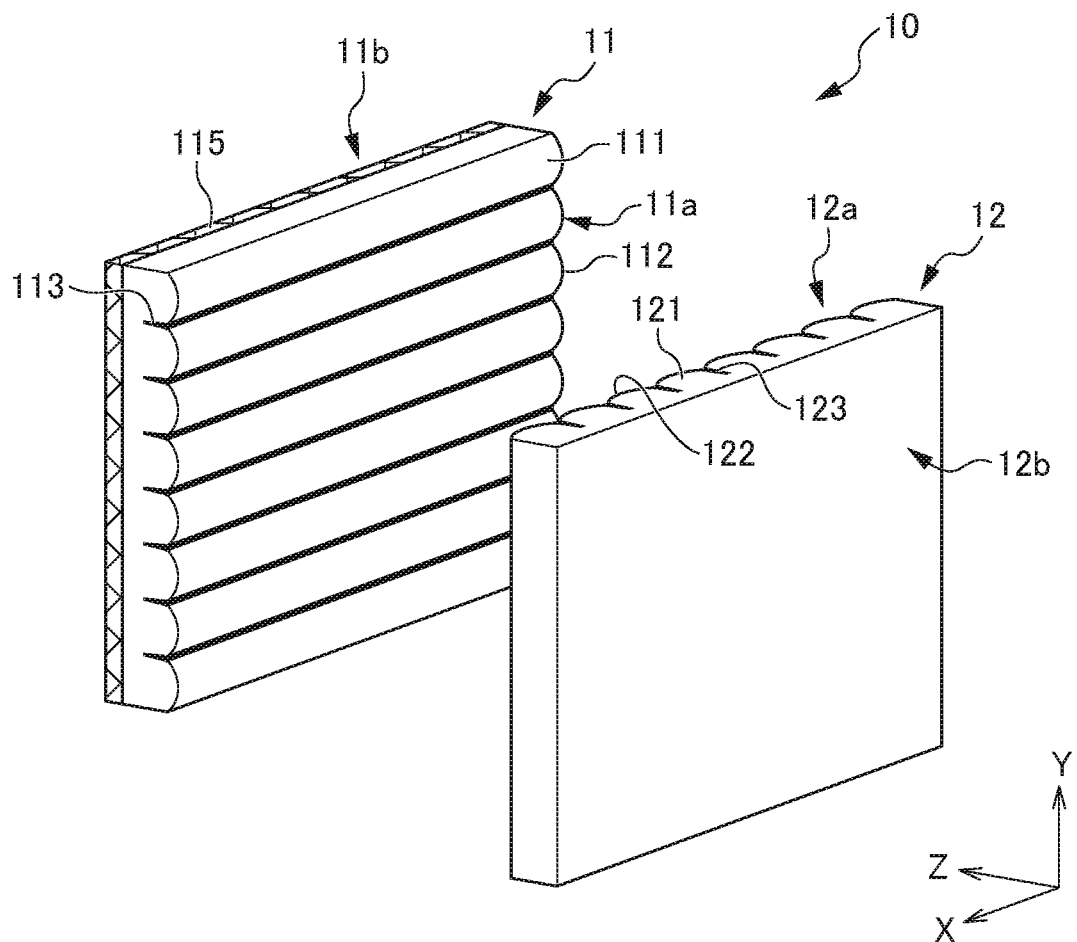
FIGS. 9A and 9B are each a view illustrating a lens sheet unit 10 of the second embodiment.
Figure 9B:
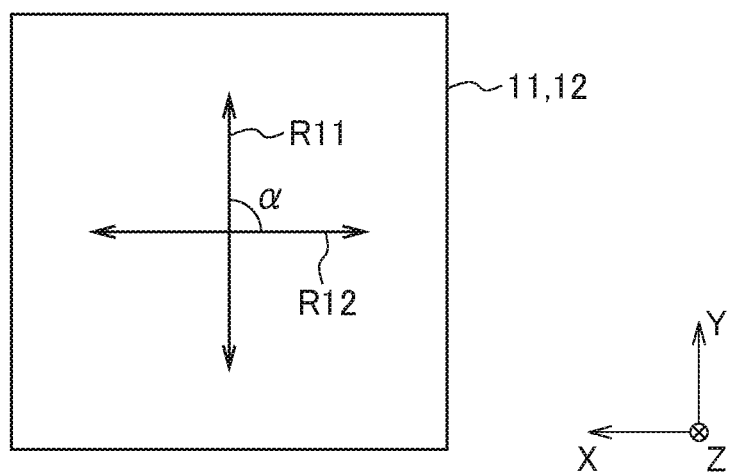
Figure 10A:
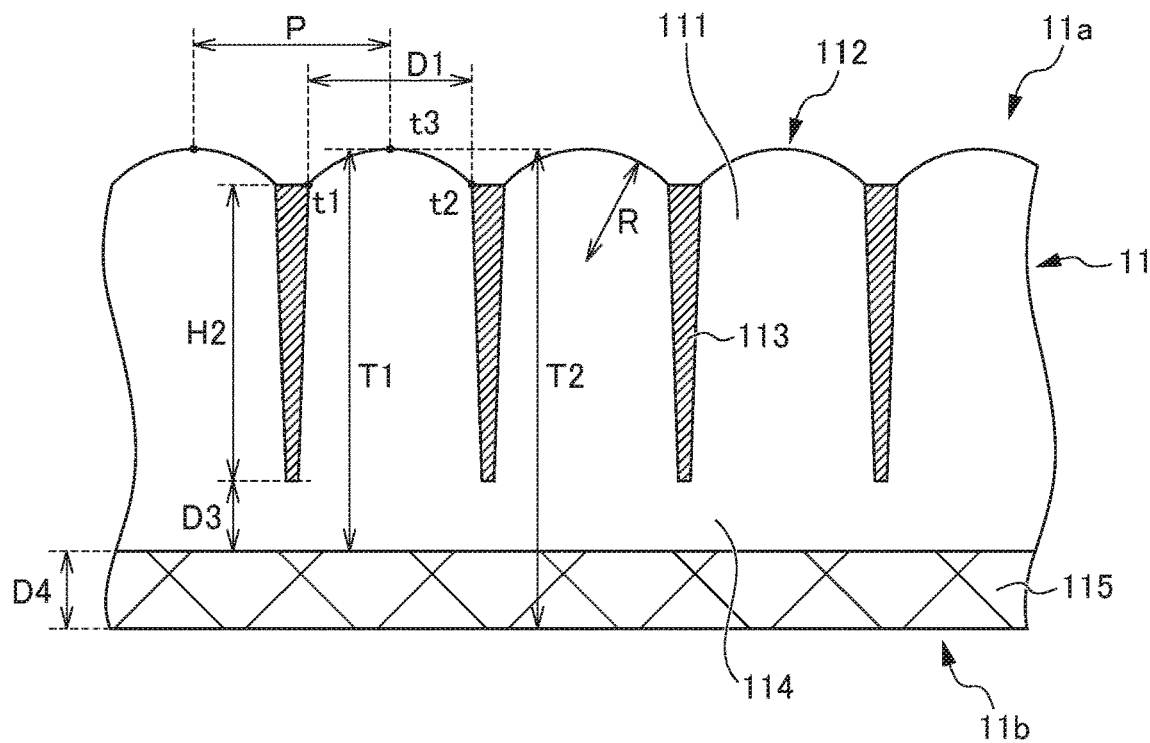
FIGS. 10A and 10B are each a view illustrating a first lens sheet 11 of the second embodiment.
Figure 10B:
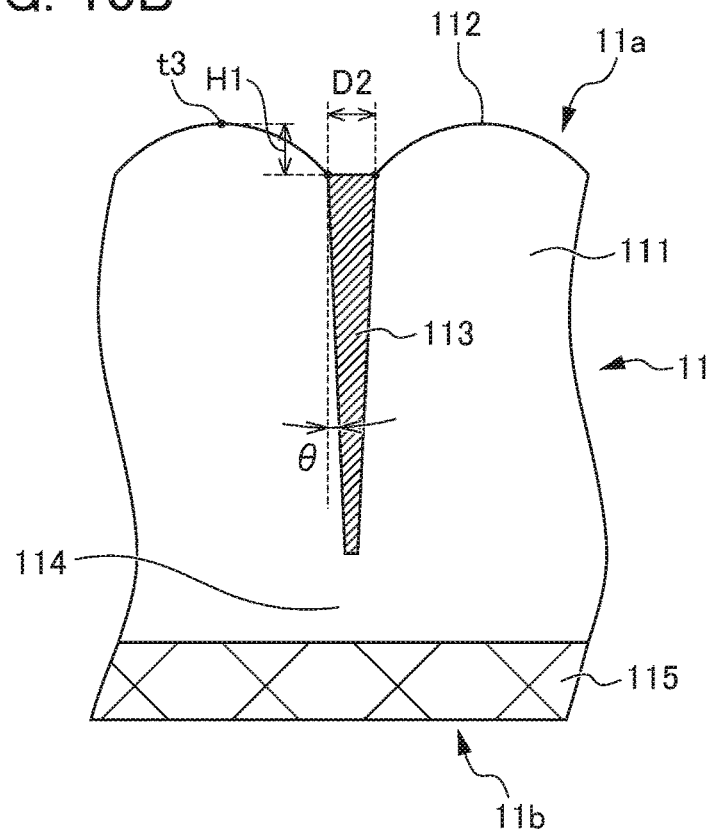
Figure 11A:
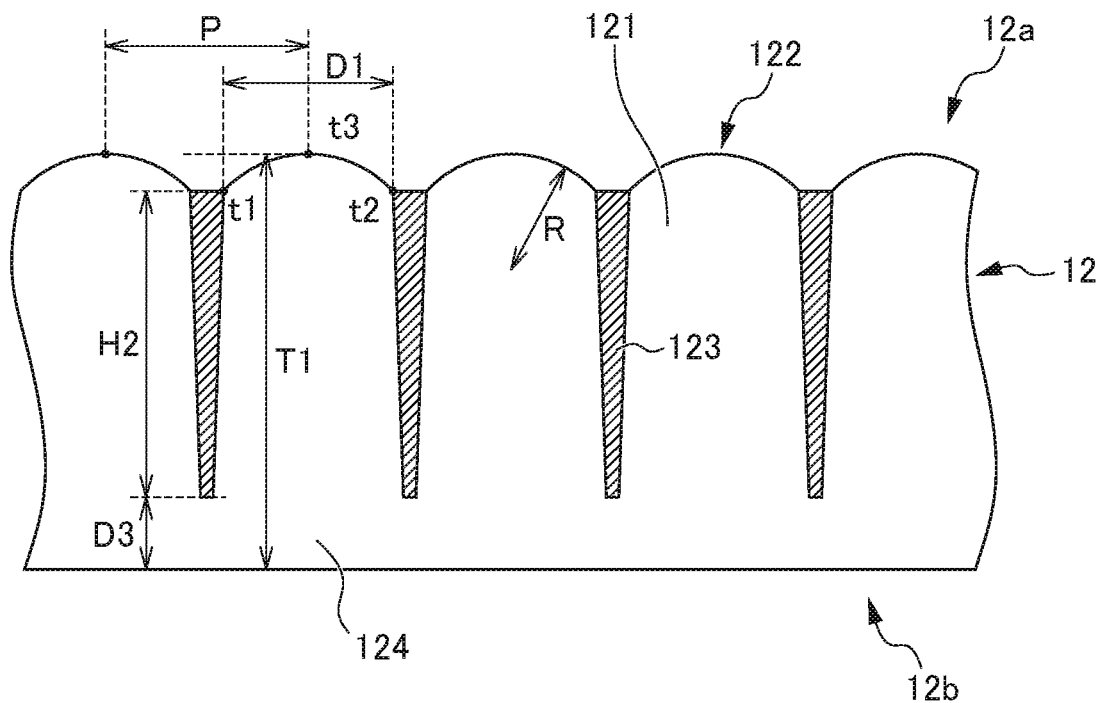
FIGS. 11A and 11B are a view illustrating a second lens sheet 12 according to the second embodiment.
Figure 11B:
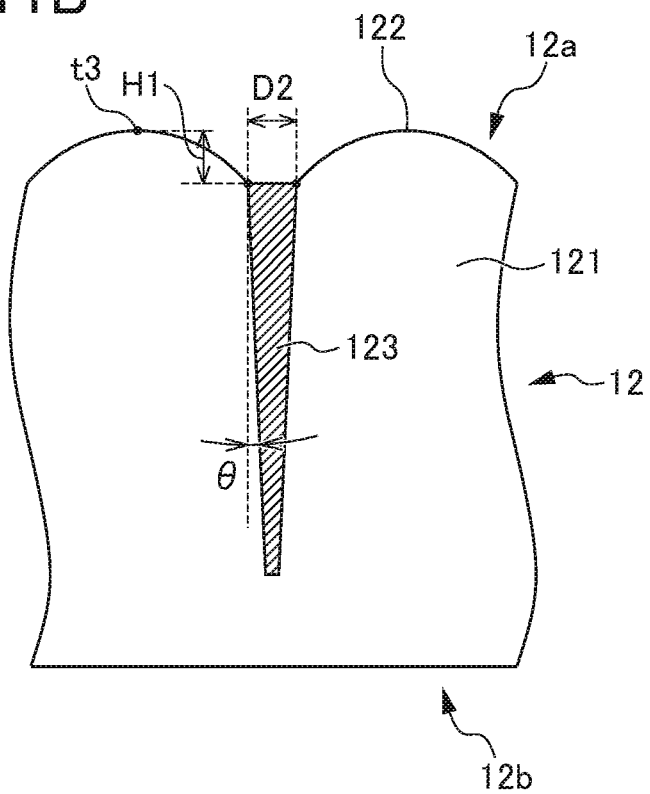

FIGS. 9A and 9B are each a view illustrating the lens sheet unit 10 of the second embodiment. FIG. 9A is a perspective view of the lens sheet unit 10, and FIG. 9B illustrates an arrangement direction of light transmission parts 111 of the first lens sheet 11 and an arrangement direction of light transmission parts 121 of a second lens sheet 12, the first lens sheet 11 and the second lens sheet 12 constituting the lens sheet unit 10. FIGS. 10A and 10B are each a view illustrating the first lens sheet 11 of the second embodiment. FIG. 10A illustrates an enlarged part of a cross-section that is parallel to the arrangement direction of the light transmission parts 111 of the first lens sheet 11 and a thickness direction of the first lens sheet 11. FIG. 10B illustrates a further enlarged part of the cross-section illustrated in FIG. 10A. FIGS. 11A and 11B are each a view illustrating the second lens sheet 12 of the second embodiment. FIG. 11A illustrates an enlarged part of a cross-section that is parallel to the arrangement direction of the light transmission parts 121 of the second lens sheet 12 and a thickness direction of the second lens sheet 12. FIG. 11B illustrates a further enlarged part of the cross-section illustrated in FIG. 11A.

The lens sheet unit 10 is located on a subject side (+Z side) of the image sensor 21 in the optical axis O direction (Z direction). The lens sheet unit 10 includes the first lens sheet 11 and the second lens sheet 12 in this order from the subject side (+Z side) along the optical axis O direction (Z direction). The infrared ray shielding layer 115 is formed on a further rear surface 11b side (+Z side) in comparison to the light transmission parts 111 of the first lens sheet 11. The infrared ray shielding layer 115 has a function of shielding infrared rays, particularly, near infrared rays of wavelength range of 700 to 1100 nm, and allowing light of a wavelength other than the wavelength range to be transmitted therethrough. The infrared ray shielding layer 115 of this embodiment is located on a further subject side (+Z side) in comparison to the light transmission parts 111 and the light absorption parts 113 in the thickness direction of the first lens sheet 11. For example, the infrared ray shielding layer 115 may be set as a layer that performs shielding by absorbing infrared rays in a predetermined wavelength region (700 to 1100 nm), or a layer that performs shielding by reflecting infrared rays in a predetermined wavelength region (700 to 1100 nm).

In a case where the infrared ray shielding layer 115 is the layer that performs shielding by absorbing infrared rays in a predetermined wavelength region, for example, the infrared ray shielding layer 115 is formed through coating of an acrylic resin that contains a material having infrared ray absorbing characteristics, and the like. Examples of the material having the infrared ray absorbing characteristics include organic dye compounds (for example, cyanine compounds, phthalocyanine compounds, naphthoquinone compounds, diimmonium compounds, and azo compounds), organic metal complex salts (for example, dithiol metal complexes, and mercaptonaphthol metal complexes), inorganic materials (for example, tin-doped indium oxide (ITO)), and antimony-doped tin oxide (ATO)). In addition, in a case where the infrared ray shielding layer 115 is the layer that performs shielding by reflecting infrared rays in a predetermined wavelength region, for example, the infrared ray shielding layer 115 is formed by a sputtered film of zinc oxide, titanium oxide, ITO, ATO, and the like, a deposited film (a multi-layer dielectric film in which a plurality of high refractive index layers and low refractive index layers are laminated), and the like.

In addition, in this embodiment, a reflection prevention layer having a reflection preventing function (not illustrated in the drawing) may be formed on an exterior of the rear surface 11b of the first lens sheet 11 (that is, on a further subject side (+Z side) in comparison to the infrared ray shielding layer 115). For example, the reflection prevention layer is formed through coating of a material (for example, magnesium fluoride ($MgF_2$), silicon dioxide ($SiO_2$), a fluorine-based optical coating agent, and the like) having the reflection preventing function in a predetermined film thickness, and the like. In this embodiment, the rear surface 11b of the first lens sheet 11 is a light incident surface into the lens sheet unit 10. Accordingly, when the reflection prevention layer is formed on the exterior of the rear surface 11b (on a further subject side in comparison to the infrared ray shielding layer 115), reflection from the rear surface 11b, which is an interface between the first lens sheet 11 and air, is suppressed to realize an increase in the amount of incident light.

Dimensions of respective parts of the first lens sheet 11 are the same as in the first embodiment except for a thickness T1 and a total thickness T2 of the light transmission parts 111. The thickness T1 of the light transmission parts 111 of this embodiment is a dimension from an interface between the light transmission parts 111 and the infrared ray shielding layer 115 to a point t3 in the thickness direction (Z direction) of the first lens sheet 11, and is approximately 30 to 480 μm. In addition, the total thickness T2 of the first lens sheet 11 of this embodiment is a dimension from the exterior of the rear surface 11b to the point t3 in the thickness direction (Z direction) of the first lens sheet 11, and it is preferable that the total thickness T2 is set to approximately 30 to 600 μm.

A thickness D4 of the infrared ray shielding layer 115 is approximately 1 to 100 μm. When the thickness D4 is thinner than the above-described range, unevenness is likely to occur in the thickness of the infrared ray shielding layer 115 when forming the infrared ray shielding layer 115, and a function of shielding infrared rays becomes also insufficient. When the thickness D4 of the infrared ray shielding layer 115 is thicker than the above-described range, chroma of reddish colors is lowered or brightness of an image is lowered as a whole. Accordingly, the above-described range is preferable as the thickness D4 of the infrared ray shielding layer 115. In addition, the second lens sheet 12 which does not include the infrared ray shielding layer has a total thickness the same as the thickness T1 of the light transmission parts 121, which is approximately 30 to 480 μm. Dimensions of other parts of the second lens sheet 12 are the same as in the first embodiment.

Figure 12A:
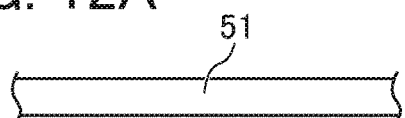
FIGS. 12A to 12G are each a view illustrating an example of a method of manufacturing the first lens sheet 11 of the second embodiment.
Figure 12B:
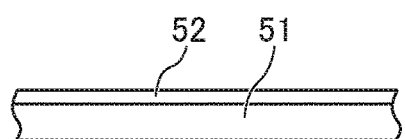
Figure 12C:
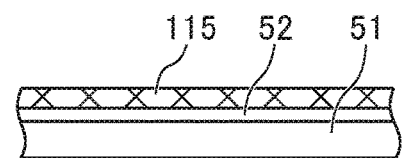

FIGS. 12A to 12G are each a view illustrating an example of a method of manufacturing the first lens sheet 11 of the second embodiment. An example of the method of manufacturing the first lens sheet 11 is as shown below. First, as illustrated in FIG. 12A, a sheet-shaped member for a base material (hereinafter, referred to as "base material layer") 51 of a PET resin and the like is prepared, and as illustrated in FIG. 12B, a melamine resin, an acrylic resin, or the like is applied to one surface of the base material layer 51 and is cured to form a peeling-off layer 52. Next, as illustrated in FIG. 12C, a material that forms the above-described infrared ray shielding layer 115 is applied or deposited on the peeling-off layer 52 of the base material layer 51 to form the infrared ray shielding layer 115.

Figure 12D:
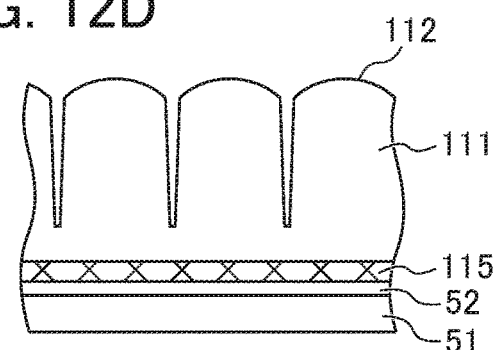
Figure 12E:
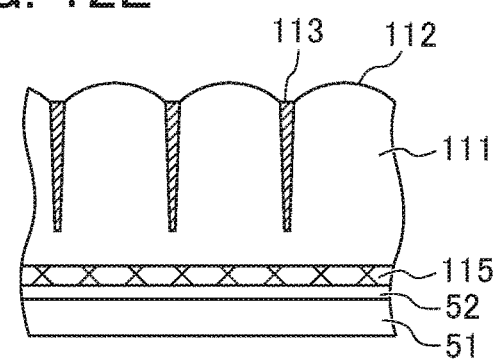
Figure 12F:
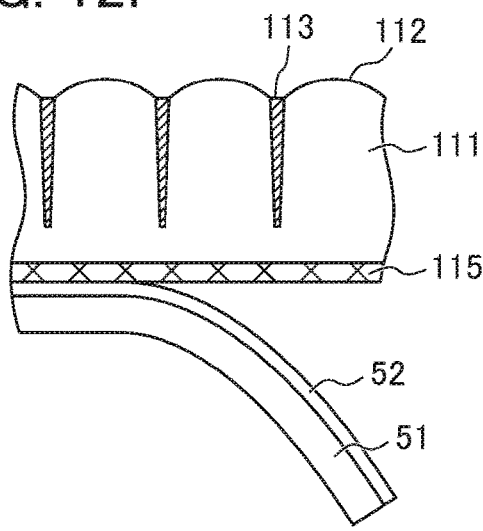
Figure 12G:
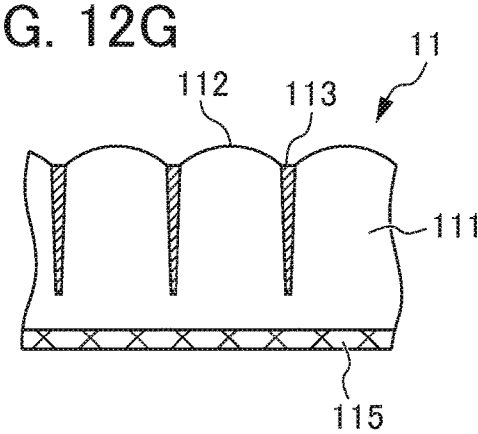

Next, as illustrated in FIG. 12D, the light transmission parts 111 are formed on the infrared ray shielding layer 115 by an ultraviolet molding method, using a molding mold that has a concave shape for molding the light transmission parts 111 and a convex shape for molding portions which become the light absorption parts 113 in a groove shape. Next, as illustrated in FIG. 12E, grooves between the light transmission parts 111 are filled with a material that forms the light absorption parts 113 by wiping (squeezing) the material, and the material is cured to form the light absorption parts 113. Then, cutting into predetermined size is performed, and the base material layer 51 is peeled off together with the peeling-off layer 52 as illustrated in FIG. 12F. In addition, a reflection prevention layer (not illustrated in the drawings) is formed on exteriors of the unit lens shapes 112 or an exterior of the rear surface 11b of to form the first lens sheet 11 as illustrated in FIG. 12G.

Furthermore, the second lens sheet 12 is formed in the same manner as the method of manufacturing the first lens sheet 11 except that the infrared ray shielding layer is not formed during the manufacturing process thereof, and the light transmission parts 121 are formed on the peeling-off layer 52 by an ultraviolet molding method and the like. The second lens sheet 12 is formed as shown below: After forming the light transmission parts 121, light absorption parts 123 are formed through wiping and the like, cutting into a predetermined size is performed, the base material layer 51 is peeled off together with peeling-off layer 52, and the reflection prevention layer is formed on exteriors of the unit lens shapes 122 and the like.

The method of manufacturing the first lens sheet 11 and the second lens sheet 12 is not limited to the above-described example, and may be appropriately selected depending on a material that is used and the like. For example, as the base material layer 51 and the peeling-off layer 52, a general purpose member in which the peeling-off layer 52 is formed on the base material layer 51 in advance may be used. In addition, the base material layer 51 may be formed by using a triacetylcellulose (TAC), polyester, polycarbonate (PC), a polyurethane-based resin, a polyacrylic resin, and the like without limiting to the above-described material, and the peeling-off layer 52 may be formed by using a silicone-based material, a fluorine compound-based material, and the like without limiting to the above-described material.

In addition, for example, the base material layer 51 may not include the peeling-off layer 52, and the first lens sheet 11 and the second lens sheet 12 may be formed by scraping a portion corresponding to the base material layer 51 after forming the light transmission parts 111 and 121, and the light absorption parts 113 and 123. In addition, for example, the light absorption parts 113 and the light absorption parts 123 may be formed by filling groove portions between the light transmission parts 111 and groove portions between the light transmission parts 121 with a material that forms the light absorption parts 113 and the light absorption parts 123, respectively, through vacuum filling and the like, or may be formed by filling the groove portions with the material by using a capillary phenomenon.

According to this embodiment, in addition to the effect that is attained by the first embodiment, it is also possible to attain the following effect. According to this embodiment, since the lens sheet unit 10 (first lens sheet 11) includes the infrared ray shielding layer 115, it is possible to shield infrared rays (particularly, near infrared rays in a wavelength region of 700 to 1100 nm) which create noise in an image, and thus it is possible to display a satisfactory image. In addition, since the infrared ray shielding layer 115 is formed in the first lens sheet 11 of the lens sheet unit 10, it is not necessary to newly provide an additional infrared cutting filter, and the like. Accordingly, a reduction in thickness of the imaging module 20 and the camera 1 is realized, and it is possible to easily perform assembly of the imaging module 20 and the camera 1.

(With Regard to Position of Infrared Ray Shielding Layer 115)

In the second embodiment illustrated in FIGS. 8A and 8B, an example in which the infrared ray shielding layer 115 is on the further rear surface 11b side in comparison to the light transmission part 111 of the first lens sheet 11 is illustrated. However, there is no limitation thereto, and a position of the infrared ray shielding layer 115 is not particularly limited as long as the infrared ray shielding layer 115 is disposed in the lens sheet unit 10 and on a further subject side in comparison to the image sensor 21. In the second embodiment illustrated in FIGS. 8A and 8B, for example, it is possible to employ a configuration in which the infrared ray shielding layer 115 is disposed on a further rear surface 12b side in comparison to the light transmission parts 121 of the second lens sheet 12. However, from the viewpoint of suppressing cross-talk to display a satisfactory image, it may not be preferable that the distance between the light-receiving surface of the image sensor 21 and an end of each light absorption part 123 of the second lens sheet on a most image sensor 21 side (−Z side) in the optical axis O direction is increased. Accordingly, in the second embodiment illustrated in FIGS. 8A and 8B, a configuration in which the infrared ray shielding part is formed on the rear surface 11b side of the first lens sheet 11 may be the most suitable from the viewpoints of reducing cross-talk and the like, and of shielding infrared rays (particularly, near infrared rays) which create noise in an image.

In addition, in the lens sheet unit 10 of the second embodiment illustrated in FIGS. 8A and 8B, or in the lens sheet unit in which the lens shape surfaces 11a and 12a are disposed as illustrated in FIG. 7A, the infrared ray shielding layer may be formed on the rear surface 12b of the second lens sheet 12. However, in this case, it may be preferable that the total thickness of the land part 124 and the infrared ray shielding layer is set to as small as possible from the viewpoint of suppressing cross-talk and the like. In addition, in the lens sheet unit 10 of the second embodiment illustrated in FIGS. 8A and 8B, or the lens sheet unit illustrated in FIG. 7A, the joining layer 15 that joins the lens sheet unit 10 and the image sensor 21 may contain infrared ray absorbing agent that absorbs light in a wavelength region of 700 to 1100 nm. That is, it may be possible that the infrared ray shielding layer functions as the joining layer.

(With Regard to Layer Configuration of First Lens Sheet 11 and Second Lens Sheet 12 of Second Embodiment)

Figure 13A:
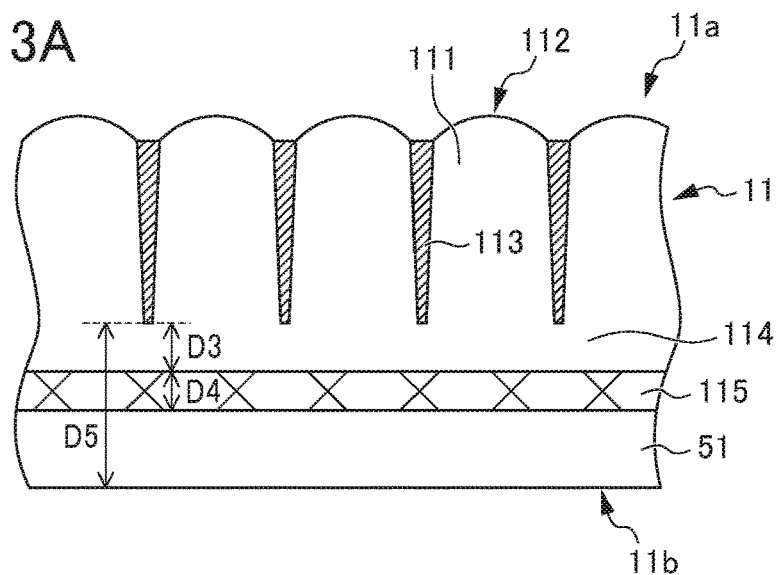
FIGS. 13A to 13C are each a view illustrating an example of another layer configuration of the first lens sheet 11 and the second lens sheet 12 of the second embodiment.
Figure 13B:
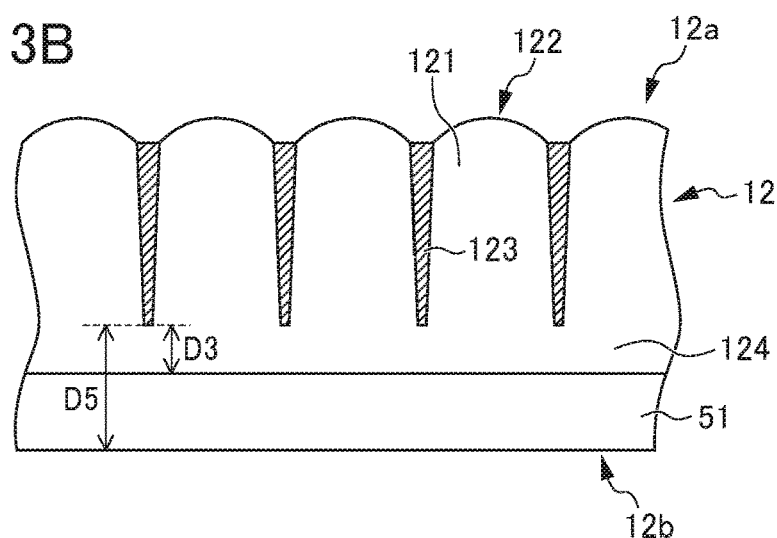
Figure 13C:
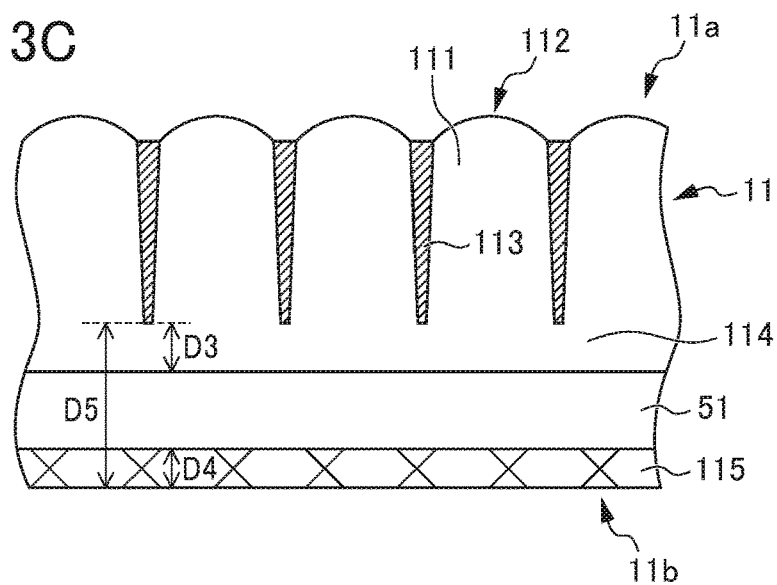

FIGS. 13A to 13C are each a view illustrating an example of another layer configuration of the first lens sheet 11 and the second lens sheet 12 of the second embodiment. FIG. 13A and FIG. 13C illustrate a cross-section corresponding to the cross-section illustrated in FIG. 10A, and FIG. 13B illustrates a cross-section corresponding to the cross-section illustrated in FIG. 11A. As illustrated in FIG. 13A, the first lens sheet 11 may be set to a configuration in which the base material layer 51 is integrally laminated on a further rear surface 12b side in comparison to the infrared ray shielding layer 115. In addition, as illustrated in FIG. 13B, the second lens sheet 12 may be set to a configuration in which the base material layer 51 may be integrally laminated on a rear surface 12b side of the light transmission parts 121. In the first lens sheet 11 and the second lens sheet 12, it may be preferable that the thickness of a continuous region (a portion in which the light absorption parts 113 and the light absorption parts 123 are not formed) such as the land part 114 that is parallel to the sheet surface is small from the viewpoint of suppressing cross-talk and the like. Accordingly, in a case where the base material layer 51 is thin enough to be capable of sufficiently suppressing the cross-talk and the like, the first lens sheet 11 and the second lens sheet 12 may be used as a lens sheet in a state in which the base material layer 51 is laminated as described above. When the base material layer 51 is provided in tis manner, handling of the first lens sheet 11 and the second lens sheet 12 becomes easy.

In addition, as illustrated in FIG. 13C, the first lens sheet 11 may be set to a configuration in which the base material layer 51 is provided at the light transmission parts 111 on the rear surface 11b side thereof, and the infrared ray shielding layer 115 is provided at the base material layer 51 on the rear surface 11b side thereof. At this time, it may be preferable that a refractive index of the base material layer 51 and a refractive index of the light transmission parts 111 are the same as each other or a difference between the refractive indexes is as small as possible from the viewpoint of reducing a refection loss of light at an interface between the base material layer 51 and the light transmission parts 111. Furthermore, for a configuration where the infrared ray shielding layer 115 is provided at the base material layer 51 on the rear surface 11b thereof it is preferable that the configuration is applied in a manner that the rear surface 11b of first lens sheet 11 is located on the subject side (+Z side) as illustrated in FIG. 7B and FIGS. 8A and 8B from the viewpoint of reducing cross-talk and the like. In addition, for a case where the infrared ray shielding layer 115 is provided on the rear surface 11b side of the base material layer 51 in a state where the rear surface 11b of the first lens sheet 11 is located on the image sensor 21 side (−Z side) as illustrated in FIGS. 7A and 7C, it is preferable that the thickness of the base material layer 51 is set to be as small as possible from the viewpoint of reducing cross-talk and the like.

In addition, from the viewpoints of suppressing cross-talk or the from the viewpoint of reducing the thickness of the lens sheet unit 10, the first lens sheet 11 may be configured: the infrared ray shielding layer 115 is not provided, the base material layer 51 is integrally laminated on the rear surface 11b side of the light transmission parts 111, and the base material layer 51 has a function as the infrared ray shielding layer. As the base material layer 51 having a function as the infrared ray shielding layer, it may be possible to use a sheet-shaped member prepared from a PET resin and the like which contain an infrared ray absorbing agent such as a cyanine compound, a phthalocyanine compound, a dithiol metal complex, a mercaptonaphthol metal complex, a naphthoquinone compound, a diimmonium compound, and an azo compound which absorb light in a wavelength region of 700 to 1100 nm. As described above, in a case where the first lens sheet 11 and the second lens sheet 12 include the base material layer 51, it may be preferable that a dimension D5 from an rear surface side end of each light absorption part 113 and each light absorption part 123 in the thickness direction (Z direction) to the rear surface 11b and the rear surface 12b is set to approximately 1 to 180 μm, respectively, from the viewpoint of suppressing stray light or cross-talk, and the like.

Third Embodiment

Figure 14A:
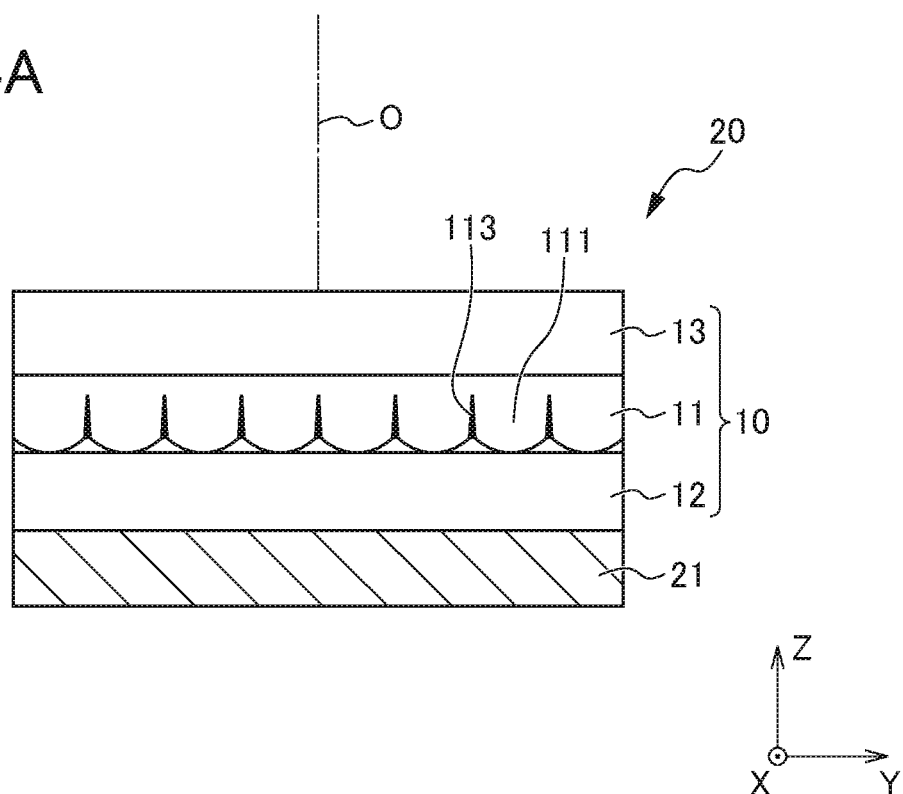
FIGS. 14A and 14B are each a view illustrating an imaging module 20 of a third embodiment.
Figure 14B:
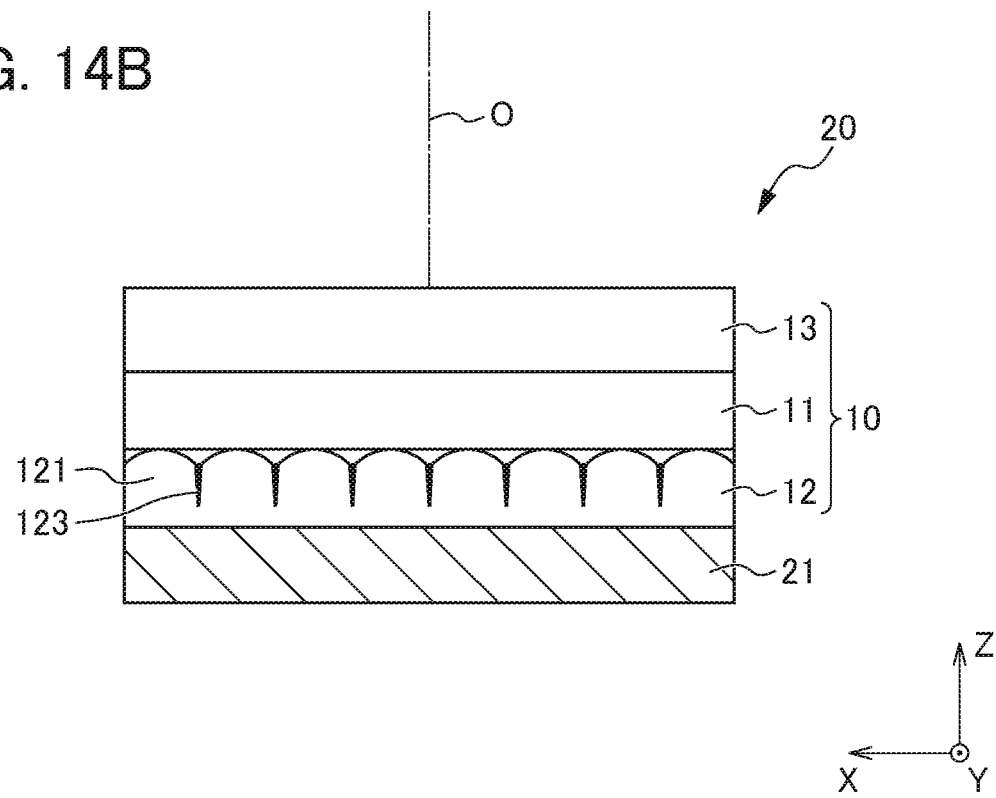

FIGS. 14A and 14B are each a view illustrating an imaging module 20 of a third embodiment. FIG. 15 is a view illustrating a lens sheet unit 10 of the third embodiment. The lens sheet unit 10 and the imaging module 20 of the third embodiment have the same configurations as those of the lens sheet unit 10 and the imaging module 20 of the first embodiment except that an infrared ray shielding sheet 13 is provided on a further subject side (+Z side) in comparison to the first lens sheet 11. The imaging module 20 of the third embodiment includes the lens sheet unit 10, an image sensor 21, and the like in this order from a light incident side (subject side, +Z side) along an optical axis O (Z direction). As in the first embodiment, the imaging module 20 is disposed in a casing 30 of a camera 1, and captures an image that is imaged on a light-receiving surface of the image sensor 21 in response to an output signal from a control unit.

The lens sheet unit 10 of the third embodiment includes the infrared ray shielding sheet 13, a first lens sheet 11, and a second lens sheet 12 in this order from the subject side (+Z side) along an optical axis O direction (Z direction).

In the lens sheet unit 10, the infrared ray shielding sheet 13, the first lens sheet 11, and the second lens sheet 12 are laminated, and are supported by a support member (not illustrated in the drawing), and thus a position with respect to the image sensor 21 in a right and left direction (X direction), an upper and lower direction (Y direction), and the optical axis O direction (Z direction), and the like are determined. In this embodiment, the infrared ray shielding sheet 13 and the first lens sheet 11 are integrally joined to each other by a joining layer (not illustrated in the drawing). In addition, the first lens sheet 11 and the second lens sheet 12 are integrally laminated without a joining layer. The first lens sheet 11 and the second lens sheet 12 have the same shapes as in the first embodiment.

The infrared ray shielding sheet 13 is a sheet-shaped member having a function of shielding infrared rays, particularly, near infrared rays of wavelengths in a region of 700 to 1100 nm, and allowing light of other wavelengths to be transmitted therethrough. The infrared ray shielding sheet 13 of this embodiment is disposed on a further subject side (+Z side) in comparison to the first lens sheet 11 and the second lens sheet 12 in the optical axis O direction. For example, the infrared ray shielding sheet 13 may be set as a sheet that performs shielding by absorbing infrared rays in a predetermined wavelength region (700 to 1100 nm), or a sheet that performs shielding by reflecting infrared rays in a predetermined wavelength region (700 to 1100 nm).

In a case where the infrared ray shielding sheet 13 is a member that performs shielding by absorbing infrared rays in a predetermined wavelength region, for example, the infrared ray shielding sheet 13 is formed by coating a sheet-shaped member having optical transparency with a resin that contains a material having infrared ray absorbing characteristics. At this time, as the sheet-shaped member, a sheet-shaped member that is formed from a polyethylene terephthalate (PET) resin or polycarbonate (PC) resin, and a sheet-shaped member that is formed from glass such as quartz glass may be suitable. As the resin that contains a material having infrared ray absorbing characteristics, an acrylic resin, a polycarbonate resin, a polyester resin, a urethane resin, a cellulose resin, an epoxy resin, and the like may be suitable. In addition, the infrared ray shielding sheet 13 that shields by absorbing infrared rays in a predetermined wavelength region can be formed as follows. A material having infrared ray absorbing characteristics is contained in a resin such as a PET resin and a PC resin or glass powders, the resin or the glass powders are melted and formed into a sheet shape, and the resultant sheet is cured.

Examples of the material having the infrared ray absorbing characteristics include organic dye compounds (for example, cyanine compounds, phthalocyanine compounds, naphthoquinone compounds, diimmonium compounds, and azo compounds), organic metal complex salts (for example, dithiol metal complexes, and mercaptonaphthol metal complexes), inorganic materials (for example, tin-doped indium oxide (ITO)), and antimony-doped tin oxide (ATO)).

In addition, in a case where the infrared ray shielding sheet 13 is a member that performing shielding by reflecting infrared rays in a predetermined wavelength region, for example, the infrared ray shielding sheet 13 is formed by forming a sputtered film of zinc oxide, titanium oxide, ITO, ATO, and the like, a deposited film (a multi-layer dielectric film in which a plurality of high refractive index layers and low refractive index layers are laminated), and the like on one surface (a surface that becomes a subject side in assembly as the imaging module 20) of a sheet-shaped member formed from a resin such as a PET resin, a polycarbonate resin, and an acrylic resin which have optical transparency, or glass such as quartz glass.

In this embodiment, a reflection prevention layer having a reflection preventing function (not illustrated in the drawing) may be formed on a surface of the infrared ray shielding sheet 13 on the subject side (+Z side). For example, the reflection prevention layer is formed through coating of a material (for example, magnesium fluoride ($MgF_2$), silicon dioxide ($SiO_2$), a fluorine-based optical coating agent, and the like) having the reflection preventing function in a predetermined film thickness, and the like. In this embodiment, the surface of the infrared ray shielding sheet 13 on the subject side is a light incident surface into the lens sheet unit 10. Accordingly, when the reflection prevention layer is formed on the surface of the infrared ray shielding sheet 13 on the subject side, it is possible to suppress reflection from an interface between the infrared ray shielding sheet 13 and air to realize increase in the amount of incident light.

The joining layer that joins the infrared ray shielding sheet 13 and the first lens sheet 11 is formed from a gluing agent or an adhesive, and has optical transparency. It may be preferable that a refractive index of the joining layer, a refractive index of the infrared ray shielding sheet 13, and the refractive index N1 of light transmission parts 111 of the first lens sheet 11 are the same as each other, or a difference between the refractive indexes is as small as possible. In addition, the image sensor 21 to be described later generates heat during operation, and a surface temperature rises to approximately 40° C. Accordingly, it may be preferable that the joining layer has heat resistance from the viewpoint of suppressing deformation of the lens sheet unit 10 such as bending due to heat generation in the image sensor 21. As the joining layer, a gluing agent and an adhesive which are formed from an epoxy resin, a urethane resin, and the like may be suitable. Furthermore, it is also possible to employ a joining layer having a refractive index smaller than the refractive index of the infrared ray shielding sheet 13 and the refractive index N1 of the light transmission parts 111. Examples of the joining layer include a silicone-based gluing agent and the like.

The second lens sheet 12 may be integrally joined with the image sensor 21 by a joining layer (not illustrated in the drawing). When the second lens sheet 12 and the image sensor 21 are joined to each other, in addition to suppression of optical close contact between the second lens sheet 12 and the image sensor 21, and damages of the image sensor 21, assembling of the imaging module 20 become easier.

According to this embodiment, in addition to the effect that is attained by the first embodiment, it is possible to attain the effect as shown below. According to this embodiment, since the lens sheet unit 10 includes the infrared ray shielding sheet 13, it is possible to shield infrared rays (particularly, near infrared rays in a wavelength region of 700 to 1100 nm) which create noise in an image, and thus it is possible to obtain a satisfactory image in which noise is reduced. In addition, according to this embodiment, since the infrared ray shielding sheet 13 is located on the most subject side (+Z side), and thus a distance between the first lens sheet 11 and the second lens sheet 12, and a distance between the second lens sheet 12 and the image sensor 21 are not enlarged, and it is possible to reduce cross-talk and stray light, accordingly.

In addition, according to this embodiment, since it is possible to easily detach the infrared ray shielding sheet 13 when the infrared ray shielding sheet 13 is not necessary depending on characteristics of the image sensor 21 and the like, an application range as the imaging module 20 can be broadened. In addition, according to this embodiment, since the infrared ray shielding sheet 13 is located on the most subject side (+Z side), even if the lens shape surface 11a of the first lens sheet 11 is located on the subject side (+Z side) as illustrated in FIGS. 7A and 7C, and the like, it is possible to apply an infrared ray shielding function capable of shielding infrared rays in a predetermined wavelength region to the most subject side (incidence side) of the lens sheet unit 10.

(Another Aspect of Lens Sheet Unit 10 of Third Embodiment)

In the third embodiment, an example in which the infrared ray shielding sheet 13 is disposed on a further subject side (+Z side) in comparison to the first lens sheet 11 and the second lens sheet 12 is illustrated. However, there is no limitation thereto, and the infrared ray shielding sheet 13 may be disposed, for example, between the first lens sheet 11 and the second lens sheet 12. In a case of this configuration, when using an infrared ray shielding sheet that performs shielding by reflecting light in a predetermined wavelength region (700 to 1100 nm), there is a possibility that reflected light becomes stray light and creates noise, and thus the infrared ray shielding sheet that performs shielding through absorption may be preferable. From the viewpoint of suppressing cross-talk to display a satisfactory image, it may not be preferable to increase the distance between the light-receiving surface of the image sensor 21 and an end of a light absorption part 123 of the second lens sheet on the most image sensor 21 side (−Z side) in the optical axis O direction. In addition, it is not preferable that the distance between the first lens sheet 11 and the second lens sheet 12 is enlarged. Accordingly, it may be preferable to employ a configuration in which the infrared ray shielding sheet 13 is located on a further subject side in comparison to the first lens sheet 11 and the second lens sheet 12 as described above.

In the third embodiment, an example in which the infrared ray shielding sheet 13 and the first lens sheet 11 are joined to each other by the joining layer (not illustrated in the drawing) has been illustrated. However, there is no limitation thereto, and it may be possible to employ a configuration in which the infrared ray shielding sheet 13 and the first lens sheet 11 are not joined to each other, and are integrally laminated and are in contact with each other. At this time, it is preferable that a refractive index of the infrared ray shielding sheet 13 and the refractive index N1 of the light transmission parts 111 of the first lens sheet 11 are the same as each other, or a difference between the refractive indexes is as small as possible from the viewpoint of suppressing a decrease in the amount of light due to reflection of light from an interface between the infrared ray shielding sheet 13 and the first lens sheet 11 (light transmission parts 111).

In addition, it is preferable that a surface of the infrared ray shielding sheet 13 on the first lens sheet 11 side or the rear surface 11b of the first lens sheet 11 is set as a matt surface on which a minute concave-convex shape is formed from the viewpoint of suppressing optical close contact. In addition, it may be also possible to employ a configuration in which an air layer (air gap) is provided by disposing a spacer between the infrared ray shielding sheet 13 and the first lens sheet 11 from the viewpoint of suppressing optical close contact. In this case, it may be preferable that a reflection prevention layer is formed on an exterior of the rear surface 11b of the first lens sheet 11 to suppress a decrease in the amount of light due to reflection of light from an interface.

In addition, it may be also possible to employ a configuration in which the first lens sheet 11 and the second lens sheet 12 are integrally joined to each other by a joining layer. At this time, it may be preferable that the joining layer is formed, for example, in a sheet region other than an effective portion (region through which light is transmitted), a region in which an optical influence is less (for example, corner portions of four corners), a region (not illustrated in the drawings) that is formed in an outwardly convex shape in a peripheral portion of the first lens sheet 11 and the second lens sheet 12, and the like from the viewpoint of obtaining a satisfactory image. The joining layer that is used in this configuration is formed by a gluing agent or an adhesive, and has optical transparency. In addition, it is preferable that a refractive index of the joining layer and the refractive index N1 of the light transmission parts 111 of the first lens sheet 11 and the light transmission parts 121 of the second lens sheet 12 are the same as each other, or a difference between the refractive indexes is as small as possible from the viewpoint of suppressing a decrease in the amount of light due to reflection of light from an interface.

In addition, it may be preferable that the joining layer has heat resistance from the viewpoint of suppressing deformation of the first lens sheet 11 and the second lens sheet 12 such as bending due to heat generation in the image sensor 21. As the joining layer, a joining layer formed by using a gluing agent and an adhesive which are formed from an epoxy resin, a urethane resin, and the like may be suitable. Furthermore, it may be also possible to employ a joining layer having a refractive index smaller than the refractive index N1 of the light transmission parts 111 and the light transmission parts 121, and examples thereof include a silicone-based gluing agent, and the like. In addition, the lens sheet unit 10 may be set to a configuration in which the infrared ray shielding sheet 13, the first lens sheet 11, and the second lens sheet 12 are integrally laminated and are joined to each other by a plurality of the joining layers.

Fourth Embodiment

Figure 16:
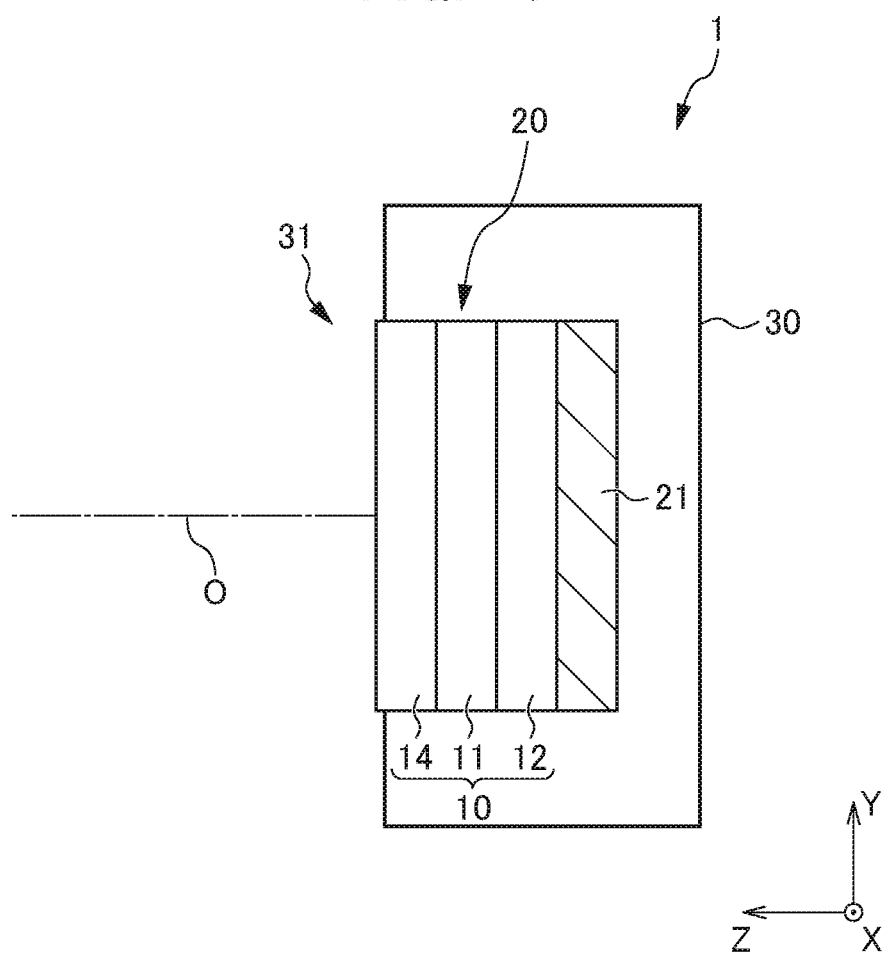
FIG. 16 is a view illustrating a camera 1 of a fourth embodiment.
Figure 17A:
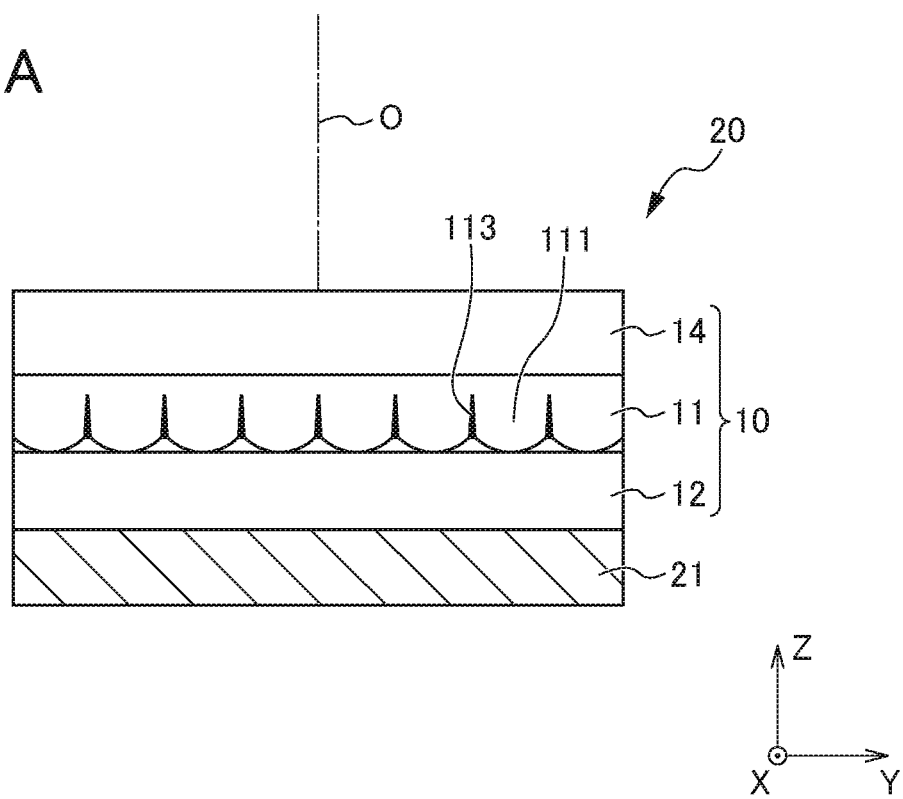
FIGS. 17A and 17B are each a view illustrating an imaging module 20 of the fourth embodiment.
Figure 17B:
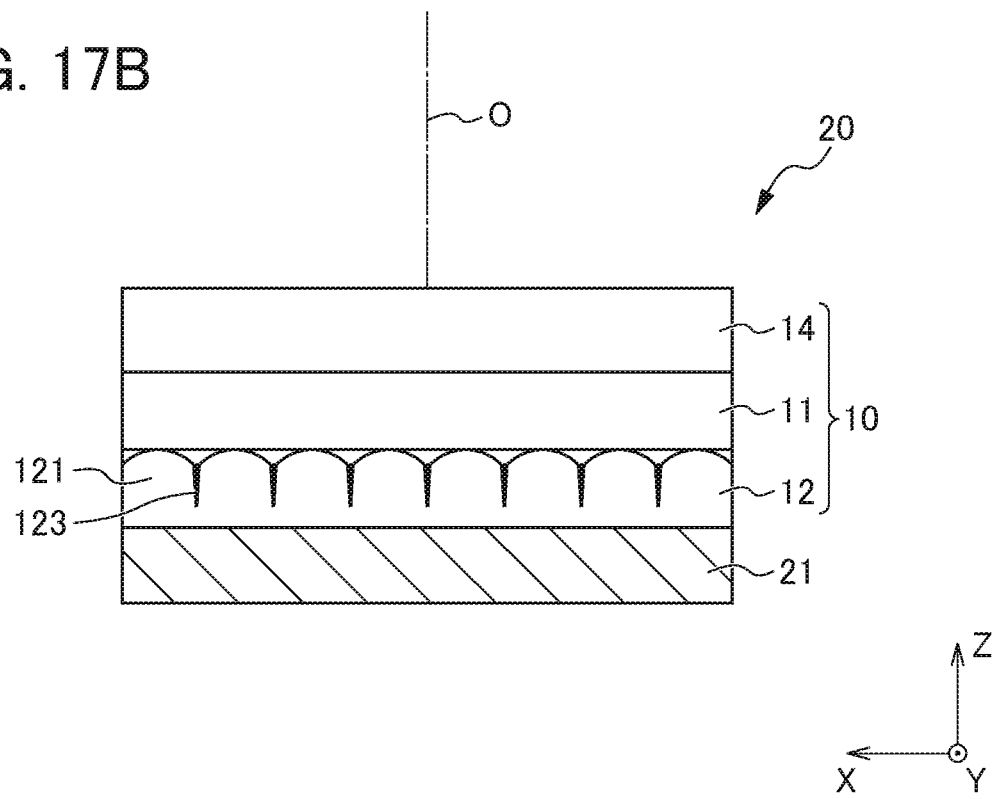

FIG. 16 is a view illustrating a camera 1 of a fourth embodiment. FIGS. 17A and 17B are each a view illustrating an imaging module 20 of the fourth embodiment. The camera 1, the imaging module 20, a lens sheet unit 10 of the fourth embodiment have the same configurations as those of the camera 1, the imaging module 20, and the lens sheet unit 10 of the first embodiment except that the imaging module 20 and the lens sheet unit 10 are provided in an opening 31 in a casing 30 of the camera 1. As illustrated in FIG. 16, the camera 1 of this embodiment is an imaging device that includes the imaging module 20 in the casing 30 including the opening 31. The opening 31 is an aperture through which light from a subject side is taken into the imaging module 20 of the camera 1. The lens sheet unit 10 that constitutes the imaging module 20 to be described later is provided in the opening 31.

The imaging module 20 of this embodiment includes the lens sheet unit 10, an image sensor 21, and the like in this order from a subject side (+Z side) that is a light incident side along an optical axis O (Z direction). The imaging module 20 captures an image in response to an output signal from the above-described control unit. The lens sheet unit 10 and the image sensor 21 are rectangular flat plate-shaped members, and the optical axis O is perpendicular to a geometrical center thereof. As described above, the lens sheet unit 10 is provided in the opening 31 of the casing 30. The image sensor 21 is provided at a position that is close to the opening 31 inside the casing 30. In this embodiment, the lens sheet unit 10 and the image sensor 21 are in contact with each other in an optical axis O direction. The lens sheet unit 10 is located on a subject side (+Z side) of the image sensor 21 in the optical axis O direction (Z direction). The lens sheet unit 10 includes a protective sheet 14, a first lens sheet 11, and a second lens sheet 12 in this order form the subject side (+Z side) along the optical axis O direction (Z direction).

In the lens sheet unit 10, the protective sheet 14, the first lens sheet 11, and the second lens sheet 12 are integrally laminated and fixed, and are supported by a support member (not illustrated in the drawing), and thus a position with respect to the image sensor 21 in a right and left direction (X direction), an upper and lower direction (Y direction), and the optical axis O direction (Z direction), and the like are determined. In this embodiment, the protective sheet 14 and the first lens sheet 11 are integrally joined to each other by a joining layer (not illustrated in the drawing). In addition, the first lens sheet 11 and the second lens sheet 12 are integrally laminated without a joining layer to be in contact with each other.

The first lens sheet 11 and the second lens sheet 12 have the same shapes as in the first embodiment. The protective sheet 14 is a sheet-shaped member having optical transparency. The protective sheet 14 has a function of preventing intrusion of foreign matters such as dust and waste into the imaging module 20, and protecting the first lens sheet 11 and the second lens sheet 12 from breakage thereof and the like.

The protective sheet 14 of this embodiment is formed from a synthetic quartz glass material. Furthermore, for example, the protective sheet 14 may be formed from a glass material such as BK7 and white glass, or may be formed from a resin such as an acrylic resin and a polycarbonate resin. It may be preferable that protective sheet 14 has a thickness larger than that of the first lens sheet 11 and the second lens sheet 12 to have high rigidity and heat resistance from the viewpoint of protecting the first lens sheet 11 and the second lens sheet 12. A refractive index N4 of the protective sheet 14 is approximately 1.43 to 1.60. It may be preferable that the refractive index N4 of the protective sheet 14 is the same as a value of a refractive index N1 of light transmission parts 111 of the first lens sheet 11 to be described later, or a difference between the refractive index N4 and the refractive index N1 is as small as possible.

In addition, an infrared ray shielding layer (not illustrated in the drawing) is formed on a surface of the protective sheet 14 on the subject side (+Z side). The infrared ray shielding layer has a function of absorbing or reflecting light (near infrared rays) in a wavelength region of 700 to 1100 nm, and allowing light of a wavelength other than the wavelength region to be transmitted therethrough. The infrared ray shielding layer is formed by depositing a general purpose material having a function of absorbing or reflecting light in the wavelength region on a surface of the protective sheet 14, or by laminating a resin layer containing the material on the surface of the protective sheet 14. In addition, a material that absorbs infrared rays and the like may be mixed in a material that forms the protective sheet 14 in order for the protective sheet 14 to have a function as the infrared ray shielding layer. It may be preferable that a reflection prevention layer (not illustrated in the drawing), which prevents incident light from being reflected from an interface, is formed on a surface of the protective sheet 14 on a further subject side (+Z side) in comparison to the infrared ray shielding layer from the viewpoint of improving the amount of light traveling into the imaging module 20. The reflection prevention layer is formed by coating a material (for example, $MgF_2$, $SiO_2$, a fluorine-based optical coating agent, and the like) having a reflection preventing function in a predetermined film thickness.

Furthermore, the layer that is formed on a surface of the protective sheet 14 on the subject side (+Z side) is not limited to the reflection prevention layer or the infrared ray shielding layer, and may be, for example, a hard coat layer, an antifouling layer having an antifouling function, and the like. It may be preferable that the thickness (a dimension in the Z direction) of the protective sheet 14 is set to 100 to 1000 μm from the viewpoint of protecting the first lens sheet 11 and the second lens sheet 12, the viewpoint of suppressing deformation and the like of the first lens sheet 11 and the second lens sheet 12, and the viewpoint of suppressing a total thickness of the imaging module 20 and a total thickness of the lens sheet unit 10 to a thickness that is not so large to obstruct a reduction in thickness.

A joining layer (not illustrated in the drawing) that joins the protective sheet 14 and the first lens sheet 11 is formed from a gluing agent or an adhesive and has optical transparency. In the joining layer, it may be preferable that a refractive index of the joining layer, the refractive index N1 of the light transmission parts 111 of the first lens sheet 11, and the refractive index N4 of the protective sheet 14 are the same as each other, or a difference between the refractive indexes is as small as possible from the viewpoint of suppressing a decrease in an amount of light due to reflection of light at an interface between the protective sheet 14 and the first lens sheet 11.

In addition, the image sensor 21 to be described later generates heat during operation, and a surface temperature rises to approximately 40° C. Accordingly, the joining layer may have heat resistance from the viewpoint of suppressing deformation of the lens sheet unit 10 (the first lens sheet 11 and the second lens sheet 12) such as bending due to heat generation in the image sensor 21. As a material that forms the joining layer, a gluing agent and an adhesive which are formed from an epoxy resin or a urethane resin may be suitable. Furthermore, it may be also possible to employ a joining layer having a refractive index smaller than the refractive index N4 of the protective sheet 14 and the refractive index N1 of the light transmission parts 111. Examples of the joining layer include a silicone-based gluing agent and the like.

According to this embodiment, in addition to the effect that is attained by the first embodiment, it is also possible to attain the effect as shown below. When using the camera 1, the image sensor 21 generates heat in operation, and a surface temperature thereof rises to approximately 40° C. Accordingly, deformation such as bending and deflection may occur due to the heat in the first lens sheet 11 and the second lens sheet 12 which are close to the image sensor 21. However, according to this embodiment, the lens sheet unit 10 includes the protective sheet 14 having rigidity higher than that of the first lens sheet 11 and the second lens sheet 12, the first lens sheet 11 is integrally jointed to the protective sheet 14 by the joining layer, and the second lens sheet 12 is laminated integrally with and supported by the first lens sheet 11 and the like. Accordingly, it is effectively suppress deformation such as bending and deflection of the respective lens sheets due to heat generation in the image sensor 21.

Fifth Embodiment

FIG. 18 is a view illustrating a camera 2 of a fifth embodiment. The camera 2 of the fifth embodiment has the same configuration as that of the camera 1 of the fourth embodiment except that a lens sheet unit 10 is disposed at a window portion 41 of a cover member 40 that covers at least a surface 30a side of a casing 30 in which a opening 31 is formed. The camera 2 of the fifth embodiment includes the casing 30 that has the opening 31 in the surface 30a that is a surface on a subject side, and includes an image sensor 21 and the like on an inner side thereof, and the cover member 40 in which the lens sheet unit 10 is disposed at a position corresponding to the opening 31 of the casing 30.

The cover member 40 covers at least the opening 31 in the surface 30a of the casing 30, and a periphery thereof, and is detachable from the casing 30. The cover member 40 of this embodiment covers the surface 30a, at least a part of four lateral surfaces 30b adjacent to the surface 30a, and corner portions of a surface 30c which are formed by the lateral surfaces 30b and opposite to the surface 30a. In addition, the cover member 40 includes a window portion 41 at a position corresponding to the opening 31 of the casing 30, and the lens sheet unit 10 is disposed at the window portion 41. A size, a shape, and a position of the window portion 41 match those of the opening 31 of the casing 30 when viewed in an optical axis O direction (Z direction) at a time of mounting of the cover member 40. The cover member 40 may be formed from a resin such as an acrylic resin, a polycarbonate resin, an ABS resin, an epoxy resin, a PET resin, and a polyamide, a rubber material such as a silicone rubber and an ethylene propylene rubber, wood, paper, leather, and the like.

In the lens sheet unit 10, a protective sheet 14, a first lens sheet 11, and a second lens sheet 12 are integrally laminated and are fixed. The lens sheet unit 10 has the same shape as that of the lens sheet unit 10 of the fourth embodiment.

The image sensor 21 is disposed to be close to the opening 31 in the optical axis O direction (Z direction). In a state in which the cover member 40 is mounted on the casing 30, the lens sheet unit 10 is located to be in contact with a light-receiving surface of the image sensor 21, or to be close to the light-receiving surface of the image sensor 21. Furthermore, it may be preferable that a distance between the light-receiving surface of the image sensor 21 and a surface (in this embodiment, a rear surface 12b of the second lens sheet 12) of the lens sheet unit 10 on an image sensor 21 side in the optical axis O direction (Z direction) is as small as possible from the viewpoint of providing an image with a high image quality by suppressing cross-talk or stray light, and it may be ideal that the surface of the lens sheet unit 10 on the image sensor 21 side and the light-receiving surface of the image sensor 21 are in contact with each other.

According to this embodiment, in addition to the effects described in the first embodiment and the fourth embodiment, it is also possible to attain the effect as shown below. According to this embodiment, for example, when a plurality of cover members 40, which include respective lens sheet units 10 different from each other in a lens opening width D1 or a radius of curvature R of light transmission parts 111 of the first lens sheet 11 and light transmission parts 121 of the second lens sheet 12, are prepared and selectively employed, it is possible to replace the lens sheet unit 10 with respect to the image sensor 21, and it is possible to capture images which are different in an angle of view or a depth of field.

In addition, according to this embodiment, since the lens sheet unit 10 is integrated with the cover member 40, it is possible to realize a further reduction in thickness of the casing 30 of the camera 2. In addition, according to this embodiment, since the lens sheet unit 10 is integrated with the cover member 40, it is possible to further enhance the effect of suppressing deformation such as bending and deflection of the first lens sheet 11 and the second lens sheet 12 due to heat generation in the image sensor 21. In addition, according to this embodiment, it is possible to change design of a surface of the cover member 40 in various manners, and it is possible to easily enhance the aesthetic design of the camera 2 as a whole.

In the fourth embodiment and the fifth embodiment, an example in which the protective sheet 14 and the first lens sheet 11 are joined to each other by the joining layer has been illustrated. However, there is no limitation thereto, and it may be possible to employ a configuration in which the protective sheet 14 and the first lens sheet 11 are not joined to each other, and are integrally laminated. At this time, it may be preferable that a refractive index N4 of the protective sheet 14 and a refractive index N1 of the light transmission parts 111 of the first lens sheet 11 are the same as each other, or a difference between the refractive indexes is as small as possible from the viewpoint of suppressing a decrease in an amount of light due to reflection of light at an interface between the protective sheet 14 and the first lens sheet 11 (light transmission parts 111).

In addition, a surface of the protective sheet 14 on a first lens sheet 11 side, or a rear surface 11b of the first lens sheet 11 is preferably set as a matt surface on which a minute concave-convex shape is formed from the viewpoint of suppressing optical close contact. In addition, it may be also possible to employ a configuration in which an air layer (air gap) is provided by disposing a spacer between the protective sheet 14 and the first lens sheet 11 from the viewpoint of suppressing optical close contact. In this case, it may be preferable that a reflection prevention layer is formed on an exterior of the rear surface 11b of the first lens sheet 11 to suppress a decrease in the amount of light due to reflection of light at the interface.

In addition, it may be also possible to employ aspect configuration in which the first lens sheet 11 and the second lens sheet 12 are integrally joined to each other by a joining layer. At this time, it may be preferable that the joining layer is formed in a sheet region other than an effective portion (region through which light is transmitted), a region in which an optical influence is less (for example, corner portions of four corners), a region (not illustrated in the drawings) that is formed in an outwardly convex shape in a peripheral portion of the first lens sheet 11 and the second lens sheet 12, and the like from the viewpoint of obtaining a satisfactory image. The joining layer that is used in this configuration is formed by a gluing agent or an adhesive, and has optical transparency. In addition, it may be preferable that a refractive index of the joining layer and the refractive index N1 of the light transmission parts 111 of the first lens sheet 11 and the refractive index N1 of the light transmission parts 121 of the second lens sheet 12 are the same as each other, or a difference between the refractive indexes is as small as possible from the viewpoint of suppressing a decrease in the amount of light due to reflection of light at the interface.

In addition, it may be preferable that the joining layer has heat resistance from the viewpoint of suppressing deformation of the first lens sheet 11 and the second lens sheet 12 such as bending due to heat generation in the image sensor 21. As the joining layer, a joining layer formed by using a gluing agent and an adhesive which are formed from an epoxy resin, a urethane resin, and the like may be suitable. Furthermore, it may be also possible to employ a joining layer having a refractive index smaller than the refractive index N1 of the light transmission parts 111 and the refractive index N1 of the light transmission parts 121. Examples of the joining layer include a silicone-based gluing agent, and the like. In addition, the lens sheet unit 10 may be set to a configuration in which the protective sheet 14, the first lens sheet 11, and the second lens sheet 12 are integrally joined to each other by a plurality of the joining layers.

Sixth Embodiment

Figure 19:
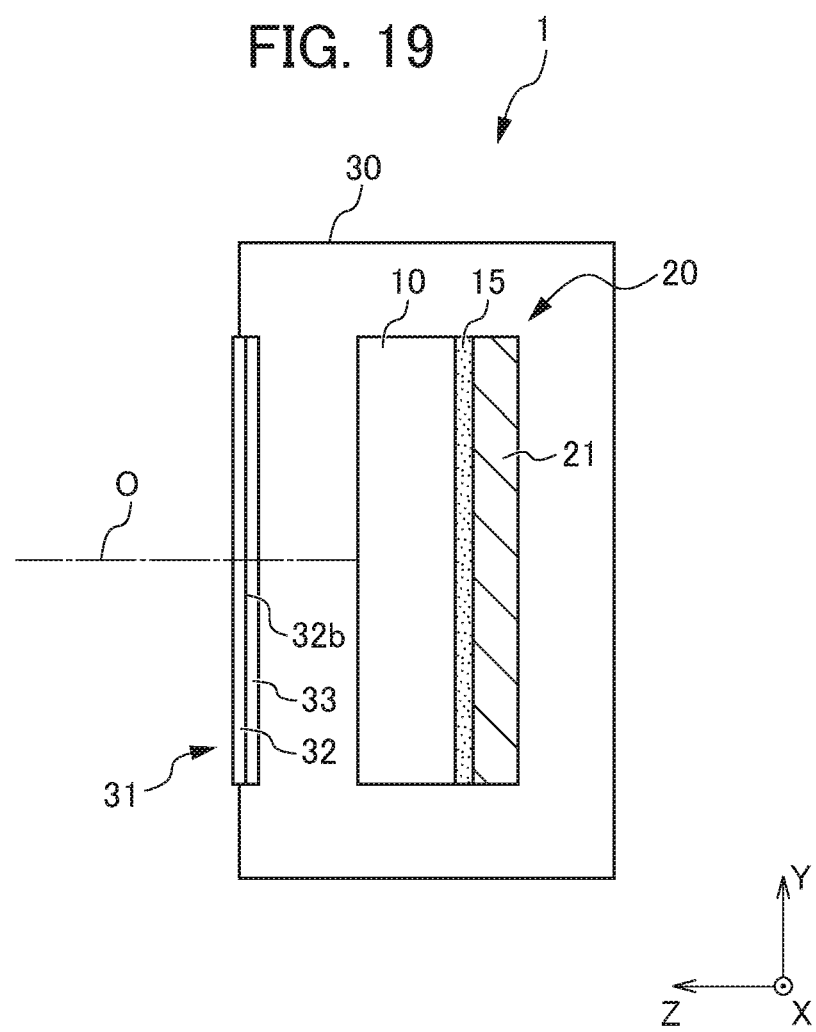
FIG. 19 is a view illustrating a camera 1 of a sixth embodiment.
Figure 20A:
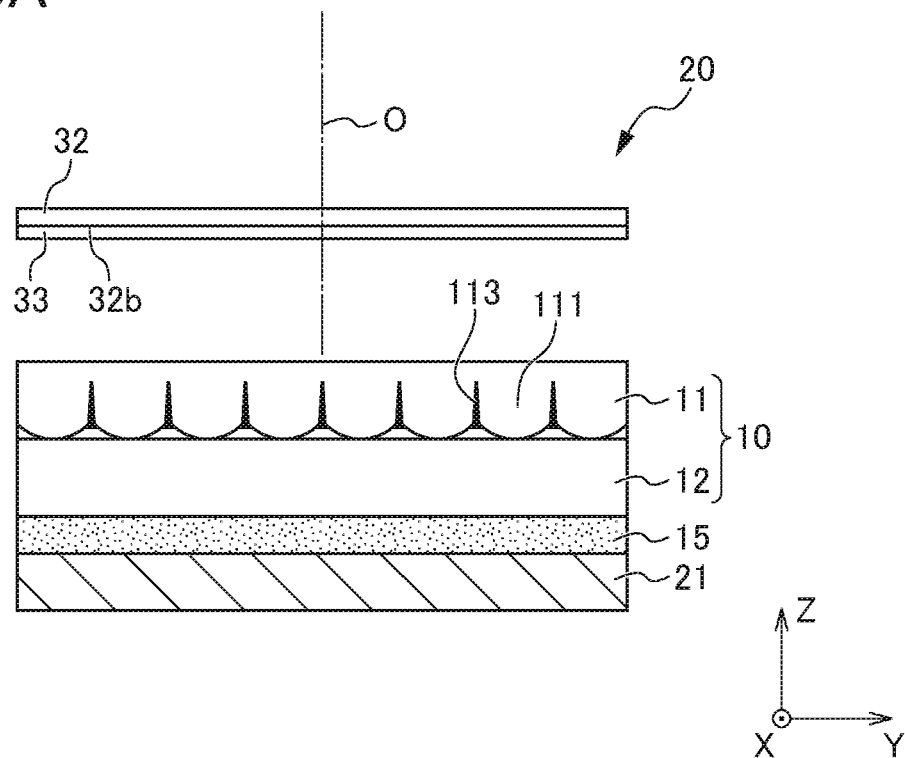
FIGS. 20A and 20B are each a view illustrating an imaging module 20 of the sixth embodiment.
Figure 20B:
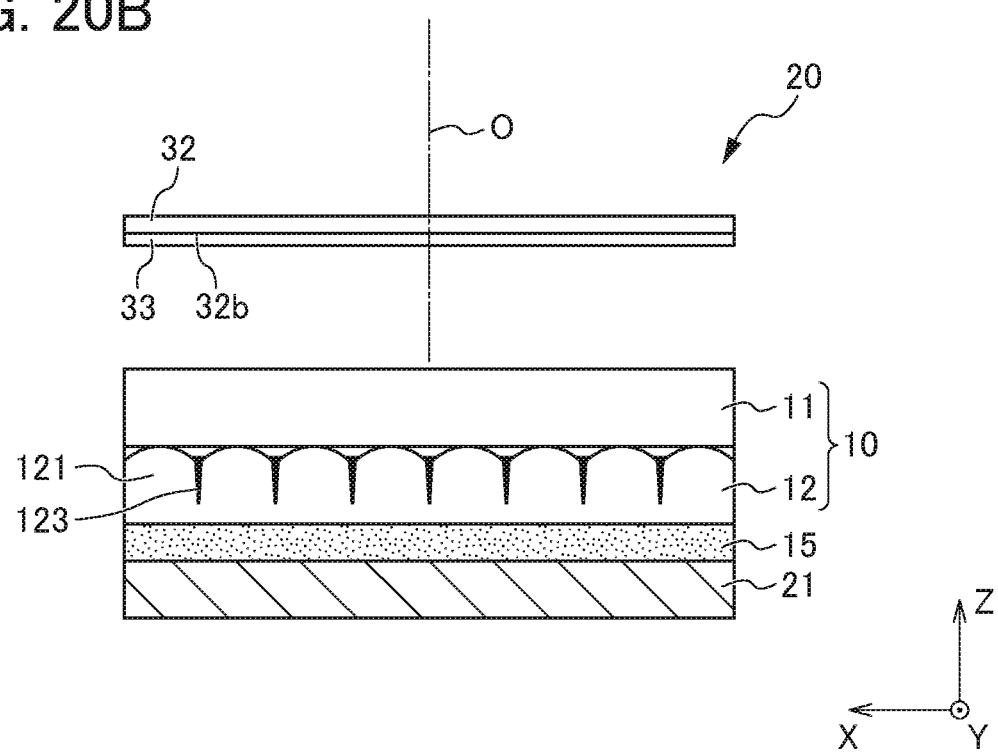

FIG. 19 is a view illustrating a camera 1 of a sixth embodiment. FIGS. 20A and 20B are each a view illustrating an imaging module 20 of the sixth embodiment. The camera 1 of the sixth embodiment has the same configuration as that of the camera 1 of the first embodiment except that cover glass 32 provided in an opening 31 of a casing 30 includes a reflection suppressing layer 33. In addition, an imaging module 20 and a lens sheet unit 10 of the sixth embodiment have the same configurations as those of the imaging module 20 and the lens sheet unit 10 of the first embodiment. The camera 1 is an imaging device that can capture an image of a subject. As illustrated in FIG. 1, the camera 1 includes the imaging module 20 in the casing 30. An opening 31 through which light from a subject side is taken into the imaging module 20 is provided in the casing 30. The cover glass 32 of the imaging module 20 is disposed in the opening 31.

The imaging module 20 of this embodiment includes the cover glass (cover sheet) 32, the lens sheet unit 10, an image sensor 21, a joining layer 15, and the like in this order from a subject side (+Z side) that is a light incident side along an optical axis O (Z direction). The imaging module 20 captures an image in response to an output signal from the above-described control unit. The first lens sheet 11 and the second lens sheet 12 have the same shapes as in the first embodiment, and a refractive index N1 of light transmission parts 111 and light transmission parts 121 is approximately 1.38 to 1.60.

Furthermore, in this embodiment, a reflection prevention layer having a reflection preventing function (not illustrated in the drawing) may be formed on an exterior of a rear surface 11b of the first lens sheet 11. For example, the reflection prevention layer is formed through coating of a material (for example, magnesium fluoride ($MgF_2$), silicon dioxide ($SiO_2$), a fluorine-based optical coating agent, and the like) having the reflection preventing function in a predetermined film thickness, and the like. In this embodiment, the rear surface 11b of the first lens sheet 11 is a light incident surface into the lens sheet unit 10. Accordingly, when the reflection prevention layer is formed on the exterior of the rear surface 11b, reflection at the rear surface 11b, which is an interface between the first lens sheet 11 and air, is suppressed to realize an increase in the amount of incident light.

An angle θ made by an interface between a light absorption part 113 and the light transmission part 111, and a normal direction of a sheet surface is preferably set to satisfy a relationship of 0°≤θ≤10°. When the angle θ is set in the above-described range, in a case of performing manufacturing by molding an ultraviolet-curable resin, it is possible to attain an effect in which release from molds becomes easy. In addition, when the lens sheet unit 10 is attached to the image sensor 21, it is preferable that a total width D2 of light absorption parts 113 and 123 each having a wedge shape is set to be small so as to reduce a portion that becomes shadows of the light absorption parts 113 and 123 and to maintain the number of effective pixels of the image sensor 21 to a large value. In addition, in a case where a height H2 of the light absorption parts 113 and 123 is set to be high, the better effect is exhibited in some cases when a difference in a width between an upper end and a lower end of the light absorption parts 113 and 123 is set to be very small. Accordingly, the above-described range is preferable.

Figure 21A:
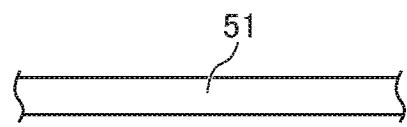
FIGS. 21A to 21F are each a view illustrating an example of a method of manufacturing a first lens sheet 11 of the sixth embodiment.
Figure 21B:
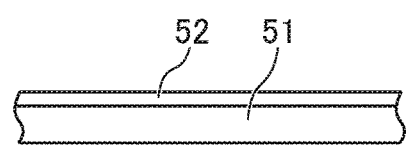

FIGS. 21A to 21F are each a view illustrating an example of a method of manufacturing the first lens sheet 11 of the sixth embodiment. An example of the method of manufacturing the first lens sheet 11 is as follows. First, as illustrated in FIG. 21A, a sheet-shaped member for a base material (hereinafter, referred to as "based material layer") 51 which is formed from a PET resin and the like is prepared, and as illustrated in FIG. 21B, a melamine resin, an acrylic resin, or the like is applied to one surface of the base material layer 51 and is cured to form a peeling-off layer 52.

Figure 21C:
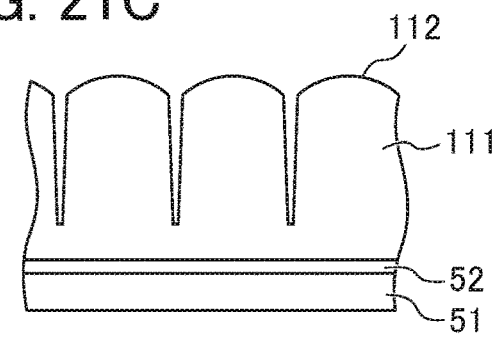
Figure 21D:
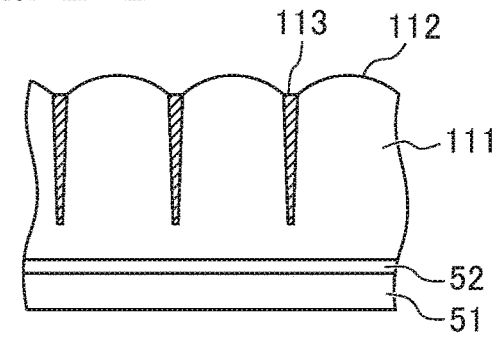

Next, as illustrated in FIG. 21C, the light transmission parts 111 are formed on the peeling-off layer 52 of the base material layer 51 by an ultraviolet molding method by using a molding mold that has a concave shape for molding the light transmission parts 111 and a convex shape for molding portions which become the light absorption parts 113 in a groove shape. Next, as illustrated in FIG. 21D, grooves between the light transmission parts 111 are filled with a material (a liquid binder that contains a light-absorbing material) that forms the light absorption parts 113 by wiping (squeezing) the material, and the material is cured to form the light absorption parts 113.

Figure 21E:
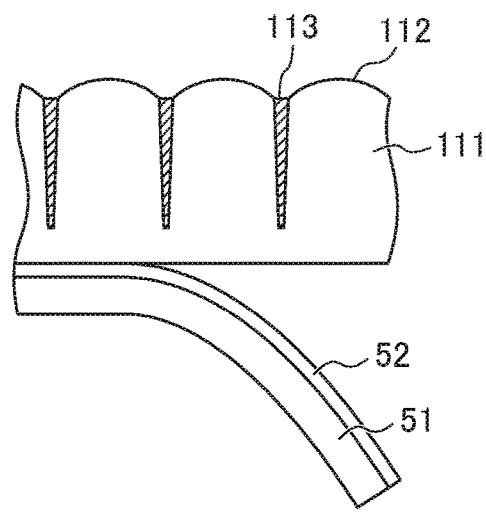
Figure 21F:
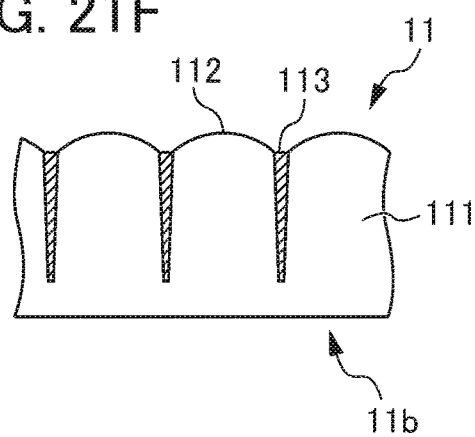

Then, cutting into a predetermined size is performed, and the base material layer 51 is peeled off in combination with the peeling-off layer 52 as illustrated in FIG. 21E. In addition, the reflection prevention layer (not illustrated in the drawings) is formed on a lens shape surface 11a (exterior) or the rear surface 11b of the unit lens shape 112 to form the first lens sheet 11 as illustrated in FIG. 21F. Furthermore, the second lens sheet 12 is formed in the same manner as in the method of manufacturing the first lens sheet 11. That is, the second lens sheet 12 is formed as follows: After forming the light transmission parts 121, the light absorption parts 123 are formed through wiping and the like, cutting into a predetermined size is performed, the base material layer 51 is peeled off together with peeling-off layer 52, and the reflection prevention layer is formed on an exterior of the unit lens shapes 122 and the like. Through the above-described processes and the like, the second lens sheet 12 is formed.

The method of manufacturing the first lens sheet 11 and the second lens sheet 12 is not limited to the above-described example, and may be appropriately selected depending on a material that is used and the like. For example, as the base material layer 51 and the peeling-off layer 52, a general purpose member in which a peeling-off layer is formed on a base material layer in advance may be used. In addition, the base material layer 51 may be formed by using a triacetylcellulose (TAC), polyester, polycarbonate (PC), a polyurethane-based resin, a polyacrylic resin, and the like without limitation to the above-described material, and the peeling-off layer 52 may be formed by using a silicone-based material, a fluorine compound-based material, and the like without limitation to the above-described material.

In addition, for example, the base material layer 51 may not include the peeling-off layer 52, and the first lens sheet 11 and the second lens sheet 12 may be formed by scraping a portion corresponding to the base material layer 51 after forming the light transmission parts 111 and 121, and the light absorption parts 113 and 123. In addition, for example, the light absorption parts 113 and 123 may be formed by filling a groove portion between the light transmission parts 111 or the light transmission parts 121 with a material that forms the light absorption parts 113 and 123 through vacuum filling and the like, or may be formed by a method using a capillary phenomenon.

The cover glass 32 is a transparent glass substrate that is provided to plug the opening 31 of the casing 30 as illustrated in FIG. 19. The cover glass 32 is provided to prevent foreign matters such as dust and waste from intruding into the casing 30, and to prevent foreign matters from adhering to the first lens sheet 11, the second lens sheet 12, the image sensor 21, and the like. The cover glass 32 is disposed at a position that is spaced away from the lens sheet unit 10 (first lens sheet 11) toward a subject side (+Z side) by a predetermined distance, and an air layer is interposed between the cover glass 32 and the first lens sheet 11. As illustrated in FIG. 19 and FIGS. 20A and 20B, the reflection suppressing layer 33 is provided on a rear surface 32b of the cover glass 32 that becomes a surface of an image sensor 21 side (−Z side).

Here, a part of light that travels through the cover glass 32 into the first lens sheet 11 may be reflected off the rear surface 11b (surface on a subject side) of the first lens sheet 11, and may be incident on the rear surface 32b of the cover glass 32. When light reflected off the rear surface 11b of the first lens sheet 11 is incident on the rear surface 32b of the cover glass 32, a part of the light incident on the rear surface 32b is reflected again to the first lens sheet 11 side, and thus a double-image, that is, so-called ghost may be generated in an image that is captured in the image sensor 21.

Accordingly, in the cover glass 32 of this embodiment, the reflection suppressing layer 33 is provided on the rear surface 32b to suppress reflection of light from the rear surface 32b as much as possible, thereby suppressing occurrence of the double-image in an image that is captured. The reflection suppressing layer 33 of this embodiment is constituted by a dielectric multi-layer film formed by sputtering or depositing a plurality of layers of transparent thin films containing a dielectric substance, and reflected light at a boundary surface between the cover glass 32 and the reflection suppressing layer 33, and reflected light at a boundary surface between the reflection suppressing layer 33 and the air layer cancel each other, and thus light reflected to the first lens sheet side is suppressed as much as possible. As the dielectric multi-layer film material that constitutes the dielectric multi-layer film of the reflection suppressing layer 33, titanium oxide ($TiO_3$), silicon oxide ($SiO_2$), and the like may be used. Furthermore, it may be preferable that the cover glass 32 is disposed so that a distance from the first lens sheet 11 becomes as small as possible from the viewpoint of suppressing occurrence of an interference fringe (moire) caused by the unit lens shapes 112 of the first lens sheet 11.

According to this embodiment, in addition to the effect that is attained by the first embodiment, it is also possible to attain the following effect. According to this embodiment, since the reflection suppressing layer 33 is provided on the rear surface 32b (surface on the image sensor 21 side) of the cover glass 32, it is possible to suppress light reflected off the rear surface 11b of the first lens sheet 11 from being reflected off the rear surface 32b of the cover glass 32 as much as possible. Accordingly, the imaging module 20 and the camera 1 can suppress occurrence of a double-image in an image that is captured, and it is possible to clearly photograph a subject image.

(With Regard to Another Embodiment of First Lens Sheet 11 and Second Lens Sheet 12)

Figure 22A:
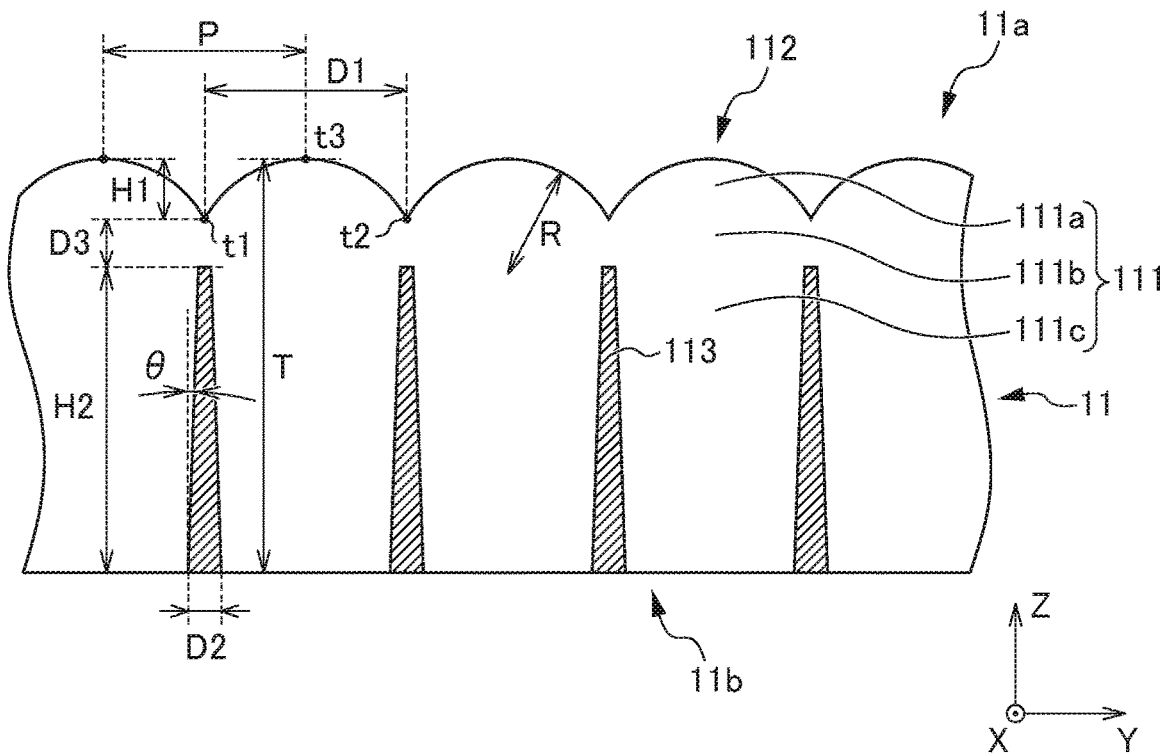
FIGS. 22A and 22B are each a view illustrating another embodiment of the first lens sheet 11 and the second lens sheet 12.
Figure 22B:
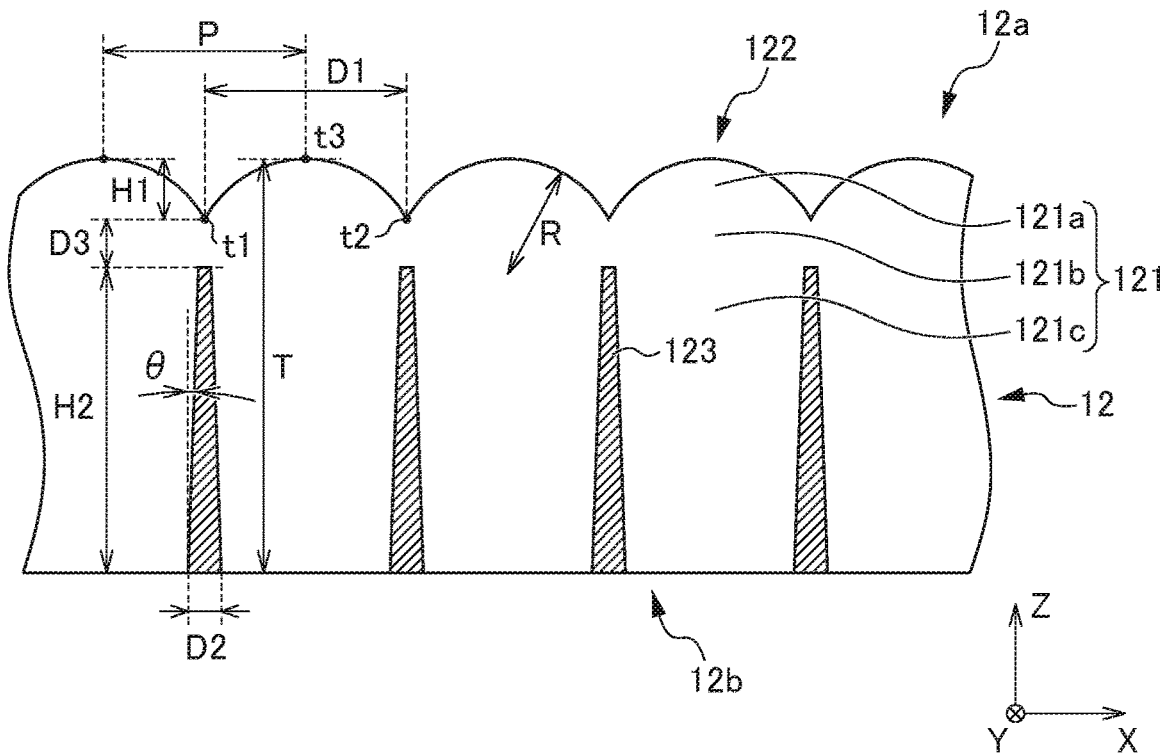

Here, description will be given of another embodiment of a first lens sheet 11 and a second lens sheet 12. FIGS. 22A and 22B are each a view illustrating another embodiment of the first lens sheet 11 and the second lens sheet 12. FIG. 22A is a view illustrating another embodiment of the first lens sheet 11, and corresponds to FIG. 4A. FIG. 22B is a view illustrating another embodiment of the second lens sheet 12, and corresponds to FIG. 5A. As illustrated in FIG. 22A, the first lens sheet 11 may be formed in such a manner that a light absorption part 113 extends from a rear surface 11b to a position in front of a lens shape surface 11a. Similarly, as illustrated in FIG. 22B, the second lens sheet 12 may be formed in a such a manner that a light absorption part 123 extend from a rear surface 12b to a position short of a lens shape surface 12a. In this case, each light transmission part 111 includes a lens shape part 111a, a land part 111b, and a main body part 111c which are laminated. The lens shape part 111a, the land part 111b, and the main body part 111c are integrally formed with each other.

The lens shape part 111a is a portion that is provided on the most lens shape surface 11a side of the lens sheet 11, and a unit lens shape 112 is formed in the lens shape part 111a. The land part 111b is a portion that is provided between the lens shape part 111a and the main body part 111c, and joins the light transmission parts 111 adjacent to each other. More specifically, the land part 111b is provided between a valley part t1 of lens shape parts 111a adjacent to each other and a surface of the light absorption part 113 on a lens shape surface 11a side in the thickness direction (Z direction). It may be preferable that the thickness of the land part 111b is as small as possible, and a configuration in which the thickness of the land part 111b is zero (that is, a configuration in which the land part 111b does not exist) may be ideal from the viewpoints of preventing stray light and providing an image with high image quality. The main body part 111c is a portion that is provided on the most rear surface 11b side of the lens sheet 11, and is adjacent to the light absorption part 113 in an arrangement direction (Y direction) of a plurality of the light transmission parts 111.

As described above, the light absorption part 113 is formed to extend from the rear surface 11b of the first lens sheet 11 to a position short of the lens shape surface 11a. A cross-sectional shape of the light absorption part 113 in a cross-section parallel to the thickness direction (Z direction) of the lens sheet 11 is a wedge shape or a rectangular shape. In FIGS. 9A and 9B, the light absorption part 113 is formed in a trapezoidal shape in which dimensions on the lens shape surface 11a side are smaller than dimensions on the rear surface 11b side. The second lens sheet 12 is formed in the same layer configuration as that of the first lens sheet 11, that is, in a configuration in which a lens shape part 121a, a land part 121b, and a main body part 121c are laminated.

According to the above-described configuration, the imaging module 20 and the camera 1 can attain the same effect as in the first embodiment. In addition, in a process of manufacturing the first lens sheet 11 and the second lens sheet 12, the light absorption part 113 and 123 can be prepared by wiping a material that forms the light absorption part 113 and 123 on the flat rear surface 11b and 12b side, respectively, and thus it is possible to manufacture the first lens sheet 11 and the second lens sheet 12 in an easier manner in comparison to the configurations illustrated in FIGS. 4A and 4B and FIGS. 5A and 5B. In addition, when the unit lens shapes 112 and the unit lens shapes 122) are viewed from a normal direction of a sheet surface, the unit lens shapes 112 adjacent to each other and the unit lens shapes 122 adjacent to each other are in contact with each other at a boundary t1 (t2), respectively. Accordingly, it is possible to further enlarge an opening diameter of each light transmission part 111 which is arranged in the sheet surface in comparison to the configuration in FIGS. 4A and 4B and FIGS. 5A and 5B (configuration in which the light absorption part is provided between unit lens shapes adjacent to each other). Accordingly, it is possible to improve use efficiency of light incident on the lens sheet 11.

Figure 23A:
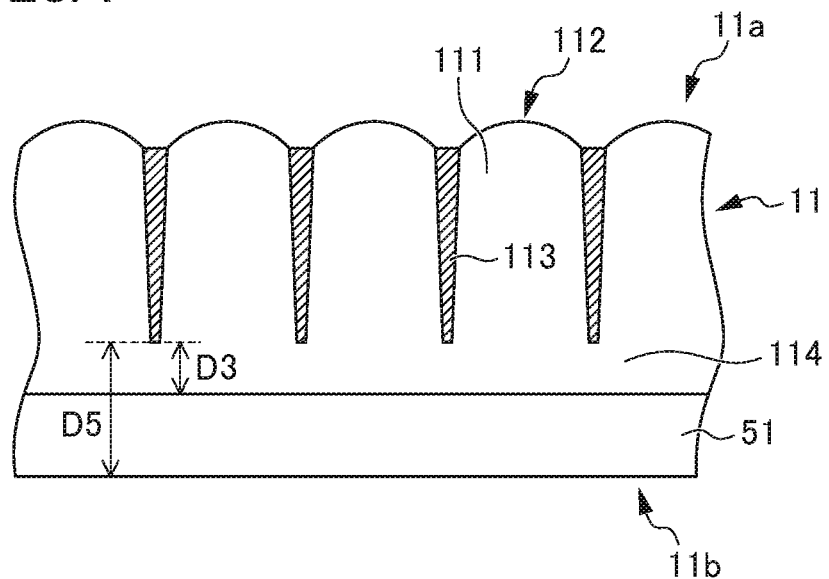
FIGS. 23A and 23B are each a view illustrating another layer configuration of the first lens sheet 11 and the second lens sheet 12.
Figure 23B:
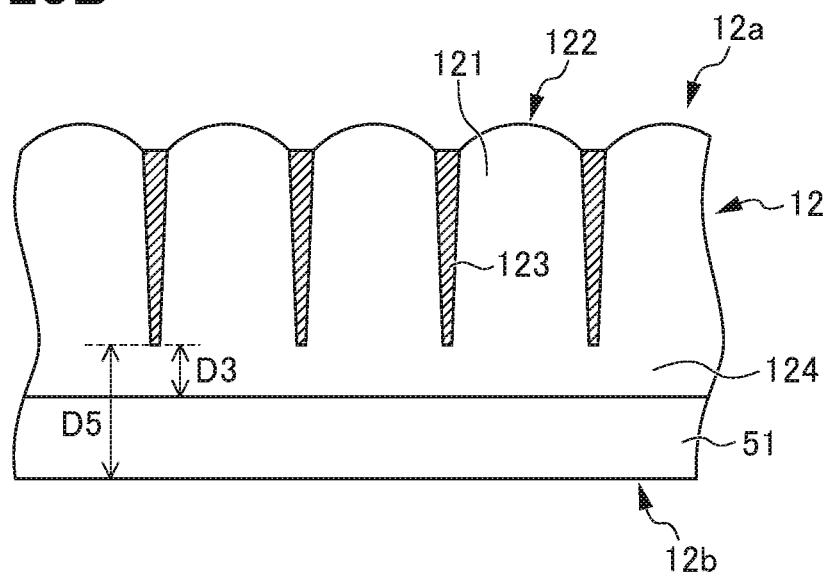

FIGS. 23a and 23B are each a view illustrating an example of another layer configuration of a first lens sheet 11 and a second lens sheet 12. FIG. 23A is a view illustrating another layer configuration of the first lens sheet 11 and corresponds to FIG. 4A. FIG. 23B is a view illustrating another layer configuration of the second lens sheet 12, and corresponds to FIG. 5A. As illustrated in FIG. 23A, the first lens sheet 11 may be set to a configuration in which a base material layer 51 is integrally laminated on a rear surface 11b side. Similarly, as illustrated in FIG. 23B, the second lens sheet 12 may be set to a configuration in which a base material layer 51 is integrally laminated on a rear surface 12b side of the light transmission parts 121. The base material layer is a member that is a sheet-shaped member that is formed form a resin having optical transparency, and is a member that becomes a base material (base) when forming the light transmission parts 111 and the light transmission parts 121 through ultraviolet molding and the like.

In the first lens sheet 11 and the second lens sheet 12, it may be preferable that a thickness D5 of a region (portion in which the light absorption parts 113 and the light absorption parts 123 are not formed) such as land parts 114 and land parts 124 which are continuous in a direction parallel to the sheet surface is as small as possible from the viewpoint of suppressing cross-talk and the like. Accordingly, in a case where the base material layer 51 is thin enough to be capable of sufficiently suppressing the cross-talk and the like, the first lens sheet 11 and the second lens sheet 12 may be used as a lens sheet in a state in which the base material layer 51 is laminated as described above. When employing the configuration in which the base material layer 51 is provided, handling of the first lens sheet 11 and the second lens sheet 12 becomes easy.

As described above, since it is preferable that the thickness D5 of the first lens sheet 11 and the second lens sheet 12 is as small as possible, it is preferable that the base material layer is a member having release properties and the base material sheet is peeled off after molding the light transmission parts 111 and the light transmission parts 121, and the light absorption parts 113 and the light absorption parts 123. In addition, in a case where the base material layer does not have detachability, the thickness D5 may be made thin by scraping a portion corresponding to the base material layer.

(Modification Example)

Various modifications and changes can be made without limitation to the above-described embodiments, and are included in the range of the invention.

(1) In the respective embodiments, for example, a cross-sectional shape of the unit lens shapes 112 and 122 in the arrangement direction of the light transmission parts 111 and 121 and the thickness direction of the lens sheets may be a partial shape of an ellipse of which the major axis is perpendicular to the sheet surface, a polygonal shape, and the like. The cross-sectional shape may be a shape in which an apex is a curved line such as a circular arc, and a valley part side of the unit lens shapes is a straight line.

Figure 24:
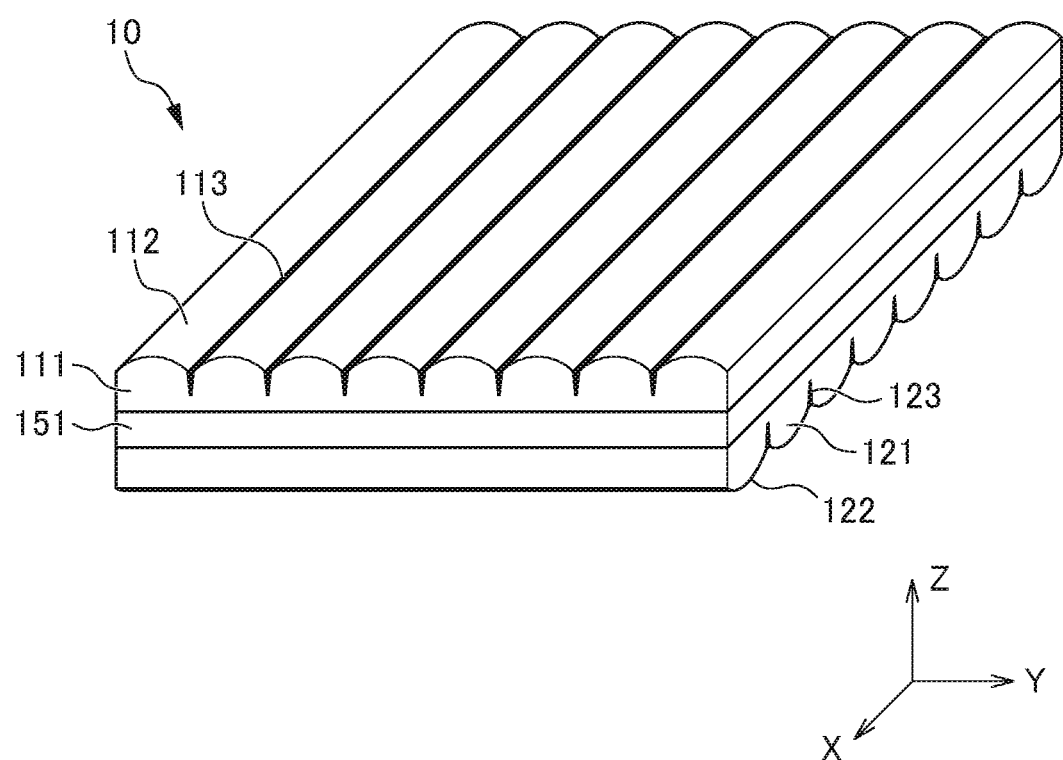
FIG. 24 is a view illustrating a modification example of the lens sheet unit 10.

(2) In the respective embodiments, the lens sheet unit 10 may be set to a configuration in which the light transmission parts 111 having the unit lens shapes 112 and the light transmission parts 121 having the unit lens shapes 122, and the light absorption parts 113 and the light absorption parts 123 are provided on both surfaces of one sheet-shaped base material layer. FIG. 24 is a view illustrating a modification example of a lens sheet unit 10. As illustrated in FIG. 24, the lens sheet unit 10 may be set to a configuration in which the light transmission parts 111 including the unit lens shapes 112 and the light transmission parts 121 including the unit lens shapes 122, and the light absorption parts 113 and the light absorption parts 123 are formed on both surfaces of one sheet of a base material layer 151 having a sheet shape. The base material layer 151 is a sheet-shaped member that is formed from a resin having optical transparency. It may be preferable that the thickness of the base material layer 151 is as small as possible from the viewpoints of suppressing stray light, reducing cross-talk, and improving intensity of light that is incident to respective pixels and accuracy of an incident direction.

In addition, the lens sheet unit 10 may be set to a configuration in which three or more lens sheets are arranged along an optical axis O direction (Z direction). At this time, it is preferable that a lens sheet of a third sheet (hereinafter, referred to as "third lens sheet") is a lens sheet having the same shape as that of a first lens sheet 11 and a second lens sheet 12, and an arrangement direction of light transmission parts of the third lens sheet makes an angle of 45°±10° with respect to the arrangement direction of the light transmission parts 111 of the first lens sheet 11 and the light transmission parts 121 of the second lens sheet 12. In addition, the lens shape surface of the third lens sheet may be on a subject side (+Z side) or on an image sensor 21 side (−Z side). A position of the third lens sheet in the lens sheet unit 10 in an optical axis O direction (Z direction) may be appropriately selected.

In addition, in a case of disposing a lens sheet of a fourth sheet (fourth lens sheet) that has the same shape as that of the first lens sheet 11 and the second lens sheet 12, it is preferable that an arrangement direction of light transmission parts of the fourth lens sheet make 45°±10° with respect to the arrangement direction of the light transmission parts 111 of the first lens sheet 11 and the light transmission parts 121 of the second lens sheet 12, and makes 90°±10° with respect to the arrangement direction of the light transmission parts of the third lens sheet. In addition, the lens shape surface of the fourth lens sheet may be on the subject side (+Z side) or on the image sensor 21 side (−Z side). A position of the fourth lens sheet in the lens sheet unit 10 in the optical axis O direction (Z direction) may be appropriately selected.

Figure 25A:
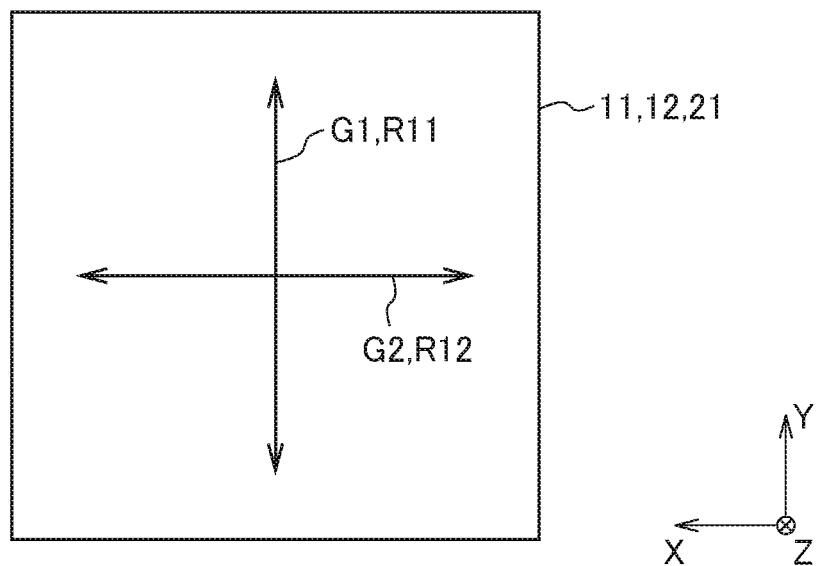
FIGS. 25A and 25B are each a view illustrating a relationship between an arrangement direction of light transmission parts 111 and 121 of the lens sheet unit 10 and an arrangement direction of pixels of the image sensor 21.
Figure 25B:
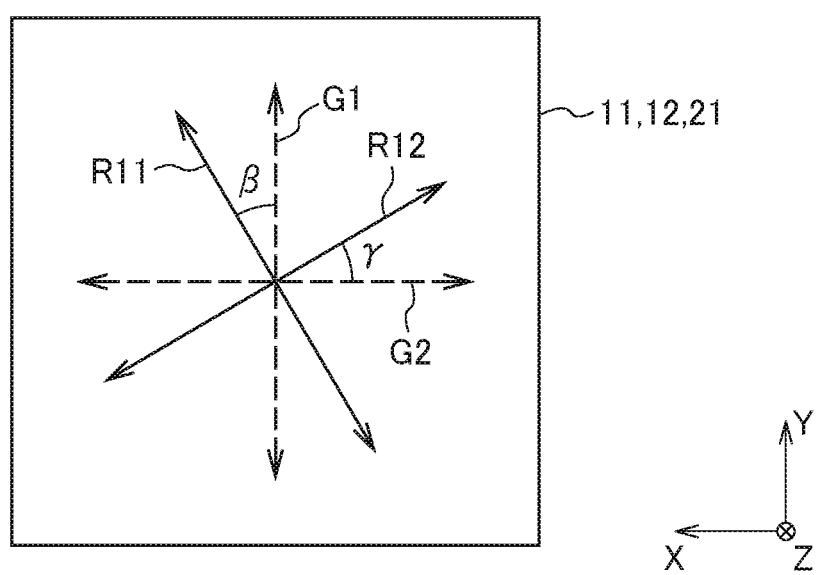

(3) In the respective embodiments, the arrangement direction of the light transmission parts 111 and the light transmission parts 121, and an arrangement direction of pixels of an image sensor 21 may be appropriately set as follows. FIGS. 25A and 25B are each a view illustrating a relationship between an arrangement direction of light transmission parts 111 and light transmission parts 121 of a lens sheet unit 10 and an arrangement direction of the pixels of an image sensor 21. As illustrated in FIG. 25A, the above-described embodiments illustrate an example in which the pixels of the image sensor 21 are arranged in two directions G1 and G2 (the Y direction and the X direction) which are perpendicular to the optical axis O direction (Z direction), and the arrangement direction R11 of the light transmission parts 111 of the first lens sheet 11 is parallel to one direction G1 (the Y direction) of the arrangement directions of pixels, and the arrangement direction R12 of the light transmission parts 121 of the second lens sheet 12 is parallel to the other direction G2 (the X direction) of the arrangement directions of the pixels. At this time, when viewed from the optical axis O direction (Z direction), an angle β made by the arrangement direction R11 of the light transmission parts 111 of the first lens sheet 11 and the one direction G1 between the arrangement directions of the pixels, and an angle γ made by the arrangement direction R12 of the light transmission parts 121 of the second lens sheet 12 and the other direction G2 between the arrangement directions of the pixels are 0°.

However, there is no limitation thereto. As illustrated in FIG. 25B, for example, when viewed in the optical axis O direction (Z direction), since an optical function is maintained when the angle β and the angle γ are in a range of 0° to 10°, the angle β and the angle γ may be appropriately selected and set in this range. When employing this configuration, alignment between the image sensor 21 and the lens sheet unit 10 (the first lens sheet 11 and the second lens sheet 12) becomes easy, and it is possible to realize simplification of manufacturing work, shortening of working hours, an improvement of a yield ratio, and the like. Furthermore, FIG. 25B illustrates an example in which the arrangement directions G1 and G2 of pixels are respectively parallel to the Y direction and the X direction, but there is no limitation thereto. It may be also possible to employ a configuration in which the arrangement directions R11 and R12 of the light transmission parts 111 and the light transmission parts 121 are respectively parallel to the Y direction and the X direction, and make an angle β and an angle γ with respect to the arrangement directions G1 and G2 of the pixels, or a configuration in which the arrangement directions G1 and G2 of the pixels and the arrangement directions R11 and R12 of the light transmission parts 111 and the light transmission parts 121 make an angle β and an angle γ, and are not parallel to the Y direction and the X direction.

(4) In the respective embodiments, interfaces between the light transmission parts 111 and the light absorption parts 113 and interfaces between the light transmission parts 121 and the light absorption parts 123 may be set to a folded surface shape including a plurality of flat surfaces, or a configuration in which a plurality of flat surfaces and a plurality of curved surfaces are combined.

(5) The respective embodiments illustrate an example in which the arrangement pitch P of the unit lens shapes 112 and the unit lens shapes 122, the lens opening width D1, the radius of curvature R, and the refractive index N1 of the light transmission parts 111 and the light transmission parts 121 are the same between the first lens sheet 11 and the second lens sheet 12, but there is no limitation thereto. The above-described values may be different from each other between the first lens sheet 11 and the second lens sheet 12.

(6) The sixth embodiment illustrates an example in which the reflection suppressing layer 33 is formed on the rear surface 32b of the cover glass 32 through sputtering or deposition of the dielectric multi-layer film, but there is no limitation thereto. For example, the reflection suppressing layer 33 may be formed by attaching a sheet in which the dielectric multi-layer film is formed on a base material to the rear surface 32b of the cover glass 32 by a gluing agent, and the like. In this manner, in a case of the configuration in which the reflection suppressing layer 33 is attached to the cover glass 32, a material (for example, a resin) other than glass can be used as the cover glass 32, and it is possible to improve the degree of freedom of design of the imaging module 20. In addition, an example in which the reflection suppressing layer 33 is constituted by the dielectric multi-layer film is illustrated, but there is no limitation thereto. For example, the reflection suppressing layer 33 may employ a configuration in which a refractive index with respect to incident light is allowed to continuously vary in the thickness direction of a substrate to eliminate a noncontinuous interface of a refractive index due to the variation so as to realize suppression of reflection by using a structural technique in which a plurality of minute protrusions are disposed closely to each other on a surface of a transparent base material (transparent film), that is, a so-called moth eye structure. For example, the minute protrusion structure can be formed through molding of a urethane acrylate resin, and a polyester resin, and the like.

(7) In the sixth embodiment, in the imaging module 20 and the camera 1, an infrared ray shielding layer that shields infrared rays may be provided in the lens sheet unit 10. Accordingly, it may be possible to shield infrared rays (particularly, near infrared rays in a wavelength region of 700 to 1100 nm) that creates noise in an image, and it is possible to capture a satisfactory image. Furthermore, in this case, the camera 1 may be provided with a retreat mechanism that retreats the infrared ray shielding layer on the optical axis O to prevent infrared light incident on the imaging module 20 from being shielded during photographing at night time. In addition, for example, the infrared ray shielding layer is disposed on the rear surface 11b side of the first lens sheet 11, but there is no limitation thereto. A position of the infrared ray shielding layer is not particularly limited as long as the position exists in the lens sheet unit 10 on a further subject side in comparison to the image sensor 21. Furthermore, the infrared ray shielding layer may be set as a layer that performs shielding by absorbing infrared rays, or may be set as a layer that performs shielding by reflecting infrared rays.

(8) In the respective embodiments, a notch for front and rear discrimination may be formed in the first lens sheet 11 and the second lens sheet 12 for easy discrimination of front and rear surfaces (the lens shape surfaces 11a and 12a, and the rear surfaces 11b and 12b). In addition, an alignment mark may be formed on the first lens sheet 11 and the second lens sheet 12 for easiness of arrangement and assembly of the lens sheet unit 10.

(9) In the respective embodiments, in the first lens sheet 11 and the second lens sheet 12, for example, a joining layer formed from a gluing agent, an adhesive, and the like may be integrally formed on a region other than an effective portion (region through which light is transmitted) of a sheet, a region in which an optical influence is less (for example, corner portions of four corners), and the like. In addition, an outwardly convex region and the like may be provided in a peripheral portion and the like of the first lens sheet 11 and the second lens sheet 12, and the joining layer may be provided in the region to be joined thereto.

(10) In the respective embodiments, the size of the light-receiving surface of the image sensor 21 may be appropriately employed in correspondence with the size of portable terminals, cameras, and the like in which the imaging module 20 is used, a desired image quality, a desired camera performance, and the like. For example, with regard to the size of the light-receiving surface of the image sensor 21, for example, when being used in a portable terminal such as a smart phone, the size of (horizontal)×(vertical) may be set to 4.8×3.6 mm, 4.4×3.3 mm, and the like. When being used in a camera (mainly, a compact digital camera) and the like, the size may be set to 6.2×4.7 mm, 7.5×5.6 mm, and the like. In addition, for example, a reduction in noise, accuracy of information such as a focal length and a depth of field which are acquired, and an improvement in the amount of the information may be accomplished by using the image sensor 21 having a large light-receiving surface of 23.6×15.8 mm, 36×24 mm, 43.8×32.8 mm, and the like, and a further improvement in an image quality and an improvement in performance of the camera may be accomplished by using the image sensor 21.

Furthermore, the embodiments, the modification examples, and the like can be used in an appropriate combination, but detailed description thereof will be omitted. In addition, the invention is not limited to the above-described embodiments and the like.

EXPLANATION OF REFERENCE NUMERALS 1, 2: Camera
10: Lens sheet unit
11: First lens sheet
12: Second lens sheet
111, 121: Light transmission part
112, 122: Unit lens shape
113, 123: Light absorption part
115: Infrared ray shielding layer
13: Infrared ray shielding sheet
14: Protective sheet
15: Joining layer
20: Imaging module
21: Image sensor
211: Pixel
30: Casing
31: Opening
32: Cover glass
33: Reflection suppressing layer
40: Cover member

The invention claimed is:

1. An imaging module comprising:
an imaging element unit in which a plurality of pixels, which convert incident light into an electric signal, are two-dimensionally arranged; and
a lens sheet unit that is provided on a light incident side of the imaging element unit, wherein the lens sheet unit includes a first lens sheet in which first light transmission parts, each of which has a columnar shape and includes a first unit lens shape having a convex shape on one surface, are arranged, and a second lens sheet which is disposed on a further imaging element unit side in comparison to the first lens sheet and in which second light transmission parts, each of which has a columnar shape and includes a second unit lens shape having a convex shape on one surface, are arranged,
wherein:
when viewed in an optical axis direction, an arrangement direction of the first light transmission parts and an arrangement direction of the second light transmission parts intersect each other at an angle α,
the first lens sheet includes first light absorption parts which are disposed alternately with the first light transmission parts in the arrangement direction of the first light transmission parts, and extend in a longitudinal direction of the first light transmission parts, the first light absorption parts extend from a first unit lens shape side toward an opposite surface side along a thickness direction of the first lens sheet, the first lens sheet further includes a first land part in which the first light transmission part is continuous in a direction parallel to the first lens sheet, on an opposite surface side to the first unit lens shape side, the first land part being integrally formed with the first unit lens shape from a same material so as to define a portion that becomes the first light absorption part in a groove shape between the first unit lens shapes adjacent to each other, the second lens sheet includes second light absorption parts which are disposed alternately with the second light transmission parts in the arrangement direction of the second light transmission parts, and extend in a longitudinal direction of the second light transmission parts, the second light absorption parts extend from a second unit lens shape side toward an opposite surface side along a thickness direction of the second lens sheet, the second lens sheet further includes a second land part in which the second light transmission part is continuous in a direction parallel to the second lens sheet, on an opposite surface side to the second unit lens shape side, the second land part being integrally formed with the second unit lens shape from a same material so as to define a portion that becomes the second light absorption part in a groove shape between the second unit lens shapes adjacent to each other, the first unit lens shape is formed on a surface of the first lens sheet on an imaging element unit side, and the second unit lens shape is formed on a surface of the second lens sheet on a subject side, and the first unit lens shape faces the second unit lens shape, and each of the first and second land parts has a land thickness being a dimension from a tip end of the first light absorption parts closest to a rear surface side extending to a rear surface of the first lens sheet in the thickness direction of the first lens sheet, and wherein the land thickness is between 1-50 μm.

2. The imaging module according to claim 1, wherein the angle α satisfies a relationship of $80° \leq \alpha \leq 100°$.

3. The imaging module according to claim 1, wherein each unit lens shape has a cross section of a partial circle, the cross section being parallel to the arrangement direction of the light transmission parts and, and being parallel to a thickness direction of each lens sheet.

4. The imaging module according to claim 1, wherein a refractive index N1 of each light transmission part and a refractive index N2 of each light absorption part satisfy a relationship of $N1 \leq N2$.

5. The imaging module according to claim 1, wherein an angle θ, which is made by an interface between each light absorption part and each light transmission part and the thickness direction of the lens sheet, satisfies a relationship of $0° \leq \theta \leq 10°$.

6. The imaging module according to claim 1, wherein the second lens sheet is integrally joined to the imaging element unit.

7. An imaging module, comprising:

an imaging element unit in which a plurality of pixels, which convert incident light into an electric signal, are two-dimensionally arranged; and a lens sheet unit that is disposed on the further light incident side in comparison to an imaging element unit, comprising:

light transmission parts which have a columnar shape and are arranged in one direction along a sheet surface, and each of which includes a unit lens shape having a convex shape on one surface side;

first light absorption parts which are arranged alternately with the light transmission parts, extend in a longitudinal direction of the light transmission parts, and extend from a unit lens shape side toward a rear surface side of the first lens sheet which is opposite to the unit lens shape side along a thickness direction of the first lens sheet;

a land part in which the light transmission part is continuous in a direction parallel to the first lens sheet, on the rear surface side of the first lens sheet, the land part being integrally formed with the unit lens shape from a same material so as to mold a portion that becomes the first light absorption parts in a groove shape between the unit lens shapes adjacent to each other; and an infrared ray shielding layer that is provided on a further rear surface side in comparison to the light transmission parts in the thickness direction of the first lens sheet, and shields light in a wavelength region of 700 to 1100 nm, wherein the lens sheet unit includes a second lens sheet on a subject side of the first lens sheet or an imaging element unit side along an optical axis direction, the second lens sheet including:

second light transmission parts which have a columnar shape and are arranged in one direction along a sheet surface, and each of which includes a second unit lens shape having a convex shape on one surface side, second light absorption parts which are disposed alternately with the second light transmission parts in an arrangement direction of the second light transmission parts, extend in a longitudinal direction of the second light transmission parts, and extend from a second unit lens shape side toward a rear surface side of the second lens sheet which is opposite to the second unit lens shape side along a thickness direction of the second lens sheet, and a second land part in which the second light transmission part is continuous in a direction parallel to the second lens sheet, on the rear surface side to the second unit lens shape side, the second land part being integrally formed with the second unit lens shape from a same material so as to define a portion that becomes the second light absorption part in a groove shape between the second unit lens shapes adjacent to each other, wherein when viewed in the optical axis direction, an arrangement direction of the light transmission parts and an arrangement direction of the second light transmission parts intersect each other at an angle α, wherein the first lens sheet and the second lens sheet are disposed so that the unit lens shape faces the second unit lens shape, and wherein each of the first and second land parts has a land thickness being a dimension from a tip end of the first light absorption parts closest to a rear surface side extending to a rear surface of the first lens sheet in the thickness direction of the first lens sheet, and wherein the land thickness is between 1-50 μm.

8. An imaging module, comprising:
an imaging element unit in which a plurality of pixels, which convert incident light into an electric signal, are two-dimensionally arranged;
a first lens sheet and a second lens sheet that is disposed on a further light incident side in comparison to the imaging element unit; and
a cover sheet that is disposed on a further light incident side in comparison to the first lens sheet and the second lens sheet,
wherein:
the lens sheet includes: light transmission parts which are arranged along a sheet surface and each of which includes a unit lens shape having a convex shape on one surface side, and first light absorption parts which are arranged alternately with the light transmission parts and extend from the unit lens shape side toward an opposite surface side along a thickness direction of the first lens sheet, a land part in which the light transmission part is continuous in a direction parallel to the first lens sheet, on an opposite surface side to the unit lens shape side, the land part being integrally formed with the unit lens shape from a same material so as to define a portion that becomes the first light absorption parts in a groove shape between the unit lens shapes adjacent to each other,
the second lens sheet includes: second light transmission parts which are arranged along a sheet surface and each of which includes a second unit lens shape having a convex shape on one surface side, and second light absorption parts which are arranged alternately with the second light transmission parts and extend from the second unit lens shape side toward an opposite surface side along a thickness direction of the second lens sheet, and a second land part in which the second light transmission part is continuous in a direction parallel to the second lens sheet, on an opposite surface side to the second unit lens shape side, the second land part being integrally formed with the second unit lens shape from a same material so as to define a portion that becomes the second light absorption part in a groove shape between the second unit lens shapes adjacent to each other,
the first lens sheet and the second lens sheet are disposed so that the unit lens shape faces the second unit lens shape,
the cover sheet is provided with a reflection suppressing layer, which suppresses reflection of incident light, on a surface on a lens sheet side, and
each of the first and second land parts has a land thickness being a dimension from a tip end of the first light absorption parts closest to a rear surface side extending to a rear surface of the first lens sheet in the thickness direction of the first lens sheet, and wherein the land thickness is between 1-50 μm.

9. A lens sheet unit comprising:
a first lens sheet that includes a first optical shape surface, on one side of which an optical shape is formed;
a second lens sheet that is disposed on a further light emission side in comparison to the first lens sheet and includes a second optical shape surface, on one side of which an optical shape is formed; and
an infrared ray shielding sheet that is disposed on a further light incident side in comparison to the second lens sheet and shields light in a wavelength region of 700 to 1100 nm,
wherein the first lens sheet includes:
first light transmission parts which have a columnar shape and are arranged in one direction along a sheet surface, and each of which includes a first unit lens shape having a convex shape on a first optical shape surface side,
first light absorption parts which are arranged alternately with the first light transmission parts, extend in a longitudinal direction of the first light transmission parts, and extend from a first unit lens shape side toward a rear surface side of the first lens sheet which is opposite to the first unit lens shape side along a thickness direction of the first lens sheet, and
a first land part in which the first light transmission part is continuous in a direction parallel to the first lens sheet, on the rear surface side to the first lens sheet, the first land part being integrally formed with the first unit lens shape from a same material so as to define a portion that becomes the first light absorption part in a groove shape between the first unit lens shapes adjacent to each other,
wherein the second lens sheet includes,
second light transmission parts which have a columnar shape and are arranged in one direction along a sheet surface, and each of which includes a second unit lens shape having a convex shape on a second optical shape surface side,
second light absorption parts which are arranged alternately with the second light transmission parts, extend in a longitudinal direction of the second light transmission parts, and extend from a second unit lens shape side toward a rear surface side of the second lens sheet which is opposite to the second unit lens shape side along a thickness direction of the second lens sheet, and
a second land part in which the second light transmission part is continuous in a direction parallel to the second lens sheet, on the rear surface side to the second lens sheet, the second land part being integrally formed with the second unit lens shape from a same material so as to define a portion that becomes the second light absorption part in a groove shape between the second unit lens shapes adjacent to each other,
wherein:
the first lens sheet and the second lens sheet are disposed so that the first unit lens shape faces the second unit lens shape,
when viewed in a normal direction of the sheet surface, an arrangement direction of the first light transmission parts and an arrangement direction of the second light transmission parts intersect each other at an angle α, and
the first lens sheet, the second lens sheet, and the infrared ray shielding sheet are laminated, and
each of the first and second land parts has a land thickness being a dimension from a tip end of the first light absorption parts closest to a rear surface side extending to a rear surface of the first lens sheet in the thickness direction of the first lens sheet, and wherein the land thickness is between 1-50 μm.

10. The lens sheet unit according to claim 9,
wherein the infrared ray shielding sheet is disposed on a further light incident side in comparison to the first lens sheet.

11. An imaging module, comprising:
an imaging element unit in which a plurality of pixels, which convert incident light into an electric signal, are two-dimensionally arranged; and
the lens sheet unit according to claim 9 which is disposed on a further subject side in comparison to the imaging element unit.

12. A lens sheet unit comprising:
a first lens sheet that includes a first optical shape surface, on one side of which an optical shape is formed;
a second lens sheet that is disposed on a further light emission side in comparison to the first lens sheet and includes a second optical shape surface, on one side of which an optical shape is formed; and
a protective sheet that is disposed on a further light incident side in comparison to the first lens sheet, and protects the first lens sheet and the second lens sheet, wherein the first lens sheet includes:
  first light transmission parts which have a columnar shape and are arranged in one direction along a sheet surface, and each of which includes a first unit lens shape having a convex shape on a first optical shape surface side,
  first light absorption parts which are arranged alternately with the first light transmission parts, extend in a longitudinal direction of the first light transmission parts, and extend from a first unit lens shape side toward a rear surface side of the first lens sheet which is opposite to the first unit lens shape side along a thickness direction of the first lens sheet, and
  a first land part in which the first light transmission part is continuous in a direction parallel to the first lens sheet, on the rear surface side to the first lens sheet, the first land part being integrally formed with the first unit lens shape from a same material so as to define a portion that becomes the first light absorption part in a groove shape between the first unit lens shapes adjacent to each other,
wherein the second lens sheet includes:
  second light transmission parts which have a columnar shape and are arranged in one direction along a sheet surface, and each of which includes a second unit lens shape having a convex shape on a second optical shape surface side,
  second light absorption parts which are arranged alternately with the second light transmission parts, extend in a longitudinal direction of the second light transmission parts, and extend from a second unit lens shape side to a rear surface side of the second lens sheet which is opposite to the second unit lens shape side along a thickness direction of the second lens sheet, and
  a second land part in which the second light transmission part is continuous in a direction parallel to the second lens sheet, on the rear surface side to the second lens sheet, the second land part being integrally formed with the second unit lens shape from a same material so as to define a portion that becomes the second light absorption part in a groove shape between the second unit lens shapes adjacent to each other,
wherein:
the first lens sheet and the second lens sheet are disposed so that the first unit lens shape faces the second unit lens shape,
when viewed in a normal direction of the sheet surface, an arrangement direction of the first light transmission parts and an arrangement direction of the second light transmission parts intersect each other at an angle $\alpha$, and
the first lens sheet, the second lens sheet, and the protective sheet are integrally laminated, and
each of the first and second land parts has a land thickness being a dimension from a tip end of the first light absorption parts closest to a rear surface side extending to a rear surface of the first lens sheet in the thickness direction of the first lens sheet, and wherein the land thickness is between 1-50 µm.

13. The lens sheet unit according to claim 12, wherein the lens sheet unit includes a layer that shields light in a wavelength region of 700 to 1100 nm.

14. An imaging module, comprising:
an imaging element unit in which a plurality of pixels, which convert incident light into an electric signal, are two-dimensionally arranged; and
the lens sheet unit according to claim 12 which is disposed on a further subject side in comparison to the imaging element unit.

* * * * *